United States Patent [19]
Ogasawara et al.

[11] Patent Number: 6,022,797
[45] Date of Patent: Feb. 8, 2000

[54] METHOD OF MANUFACTURING THROUGH HOLES IN A SEMICONDUCTOR DEVICE

[75] Inventors: Shigeo Ogasawara, Higashiyamato; Shigeru Takahashi, Tachikawa; Noriaki Oka, Kodaira; Tadayasu Miki, Yamanashi; Masahito Hiroshima, Ome, all of Japan

[73] Assignee: Hitachi, Ltd., Tokyo, Japan

[21] Appl. No.: 08/977,347

[22] Filed: Nov. 24, 1997

[30] Foreign Application Priority Data

Nov. 29, 1996 [JP] Japan ................................ 8-320005

[51] Int. Cl.⁷ ...................... H01L 21/4763; H01L 23/48
[52] U.S. Cl. .................. 438/622; 438/638; 438/666; 438/672
[58] Field of Search .................. 438/622, 626, 438/633, 662, 638; 257/775, 756

[56] References Cited

U.S. PATENT DOCUMENTS

| | | | |
|---|---|---|---|
| 4,753,709 | 6/1988 | Welch et al. | 438/626 |
| 5,187,119 | 2/1993 | Cech et al. | 438/626 |
| 5,231,751 | 8/1993 | Sachdev | 29/852 |
| 5,736,679 | 4/1998 | Kresge et al. | 29/830 |
| 5,801,094 | 9/1998 | Yew et al. | 438/633 |
| 5,818,110 | 10/1998 | Cronin | 257/775 |
| 5,847,466 | 12/1998 | Ito et al. | 257/775 |

FOREIGN PATENT DOCUMENTS 3-173433   7/1991   Japan.

OTHER PUBLICATIONS

U.S. Application No. 08/838,260, Apr. 17, 1997, U.S. Patent Application Now US Patent 5,892,276.

*Primary Examiner*—Wael Fahmy
*Assistant Examiner*—William David Coleman
*Attorney, Agent, or Firm*—Beall Law Offices

[57] ABSTRACT

First through holes of a relatively small diameter and second through holes of a relatively great diameter are formed in proper shapes by separate processes, respectively, in a first layer insulating film. The second through holes are tapered toward a layer underlying the first layer insulating film. First, the first through holes are formed in the first layer insulating film, the first through holes are filled up with plug electrodes, and the second through holes are formed in the first layer insulating film. When filling up the first and the second through holes formed in the first layer insulating film with plug electrodes, a first conductive film deposited over the first layer insulating film is etched back to fill up the first through holes with the plug electrodes, and then etch back residues remaining on the side walls of the second through holes are removed.

49 Claims, 44 Drawing Sheets

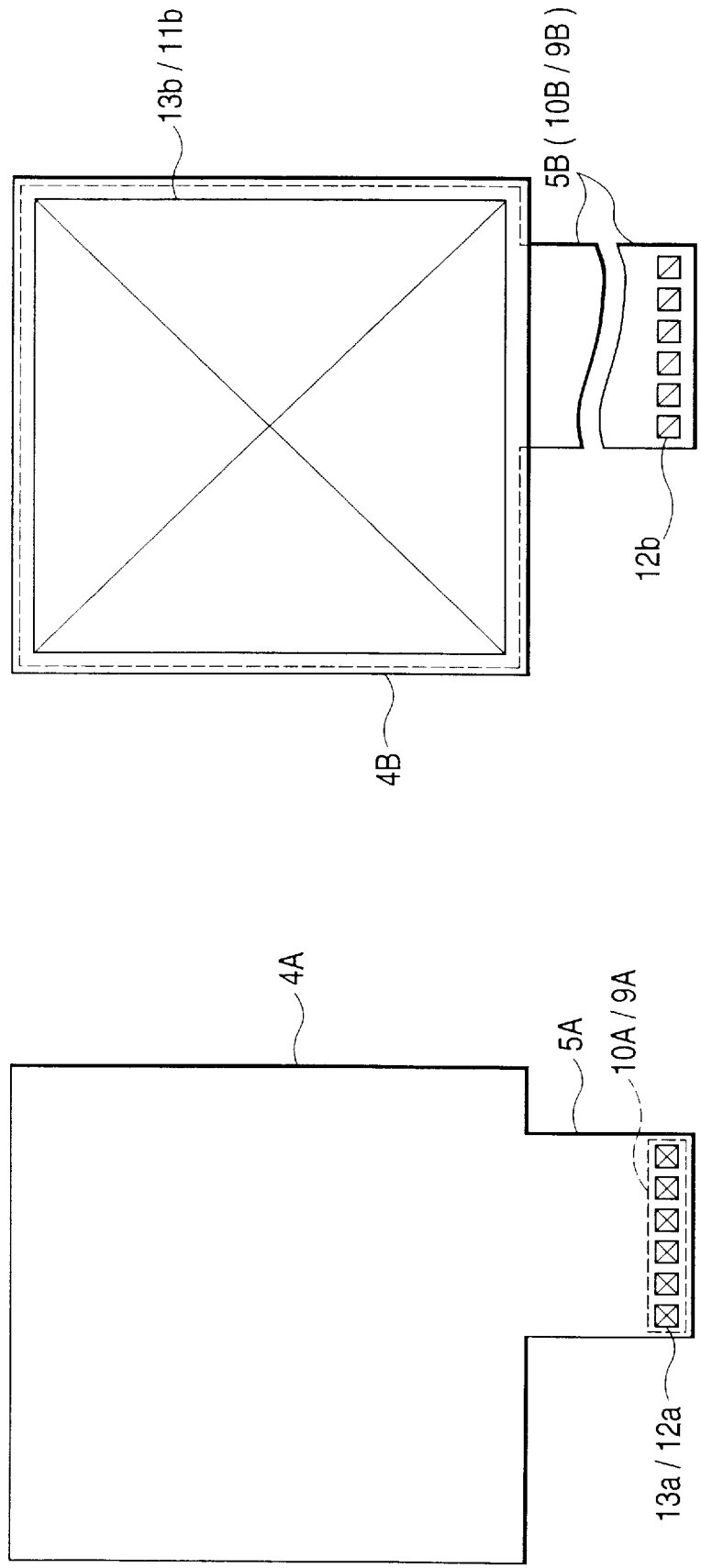

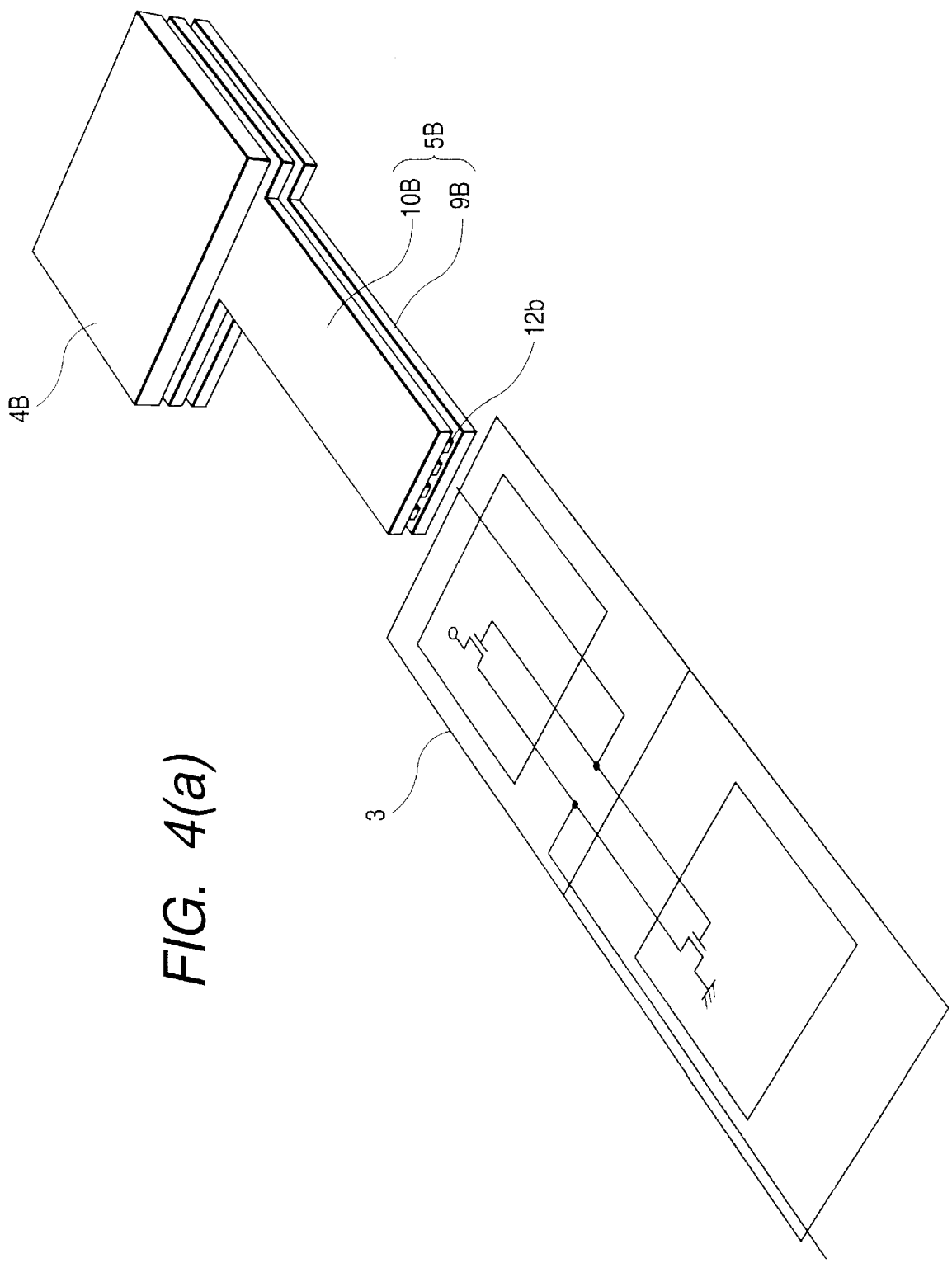

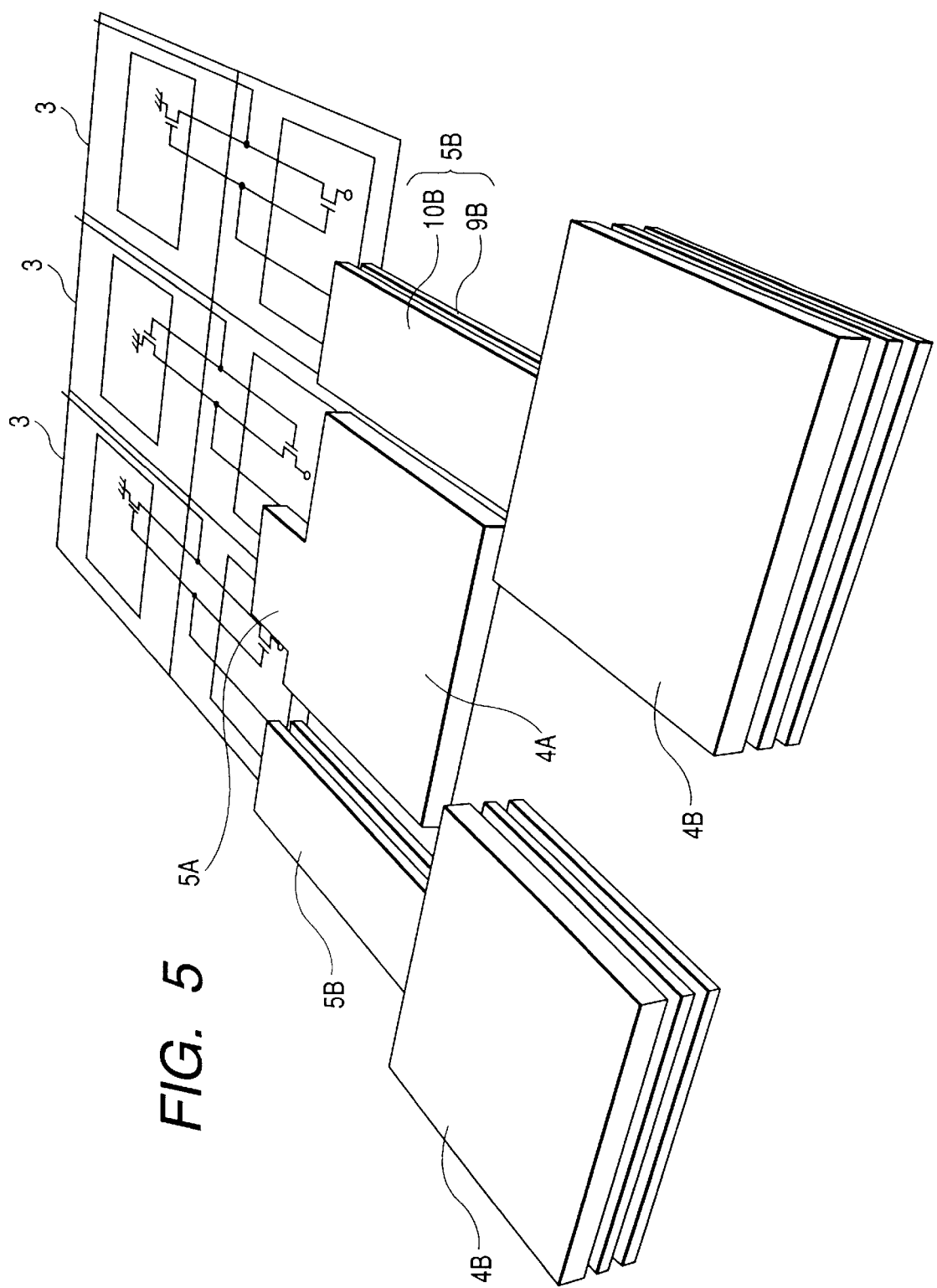

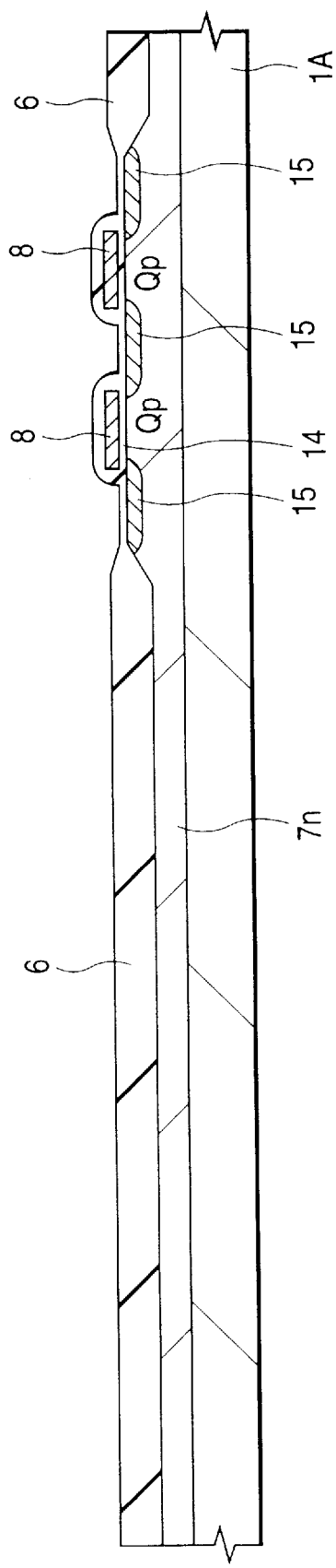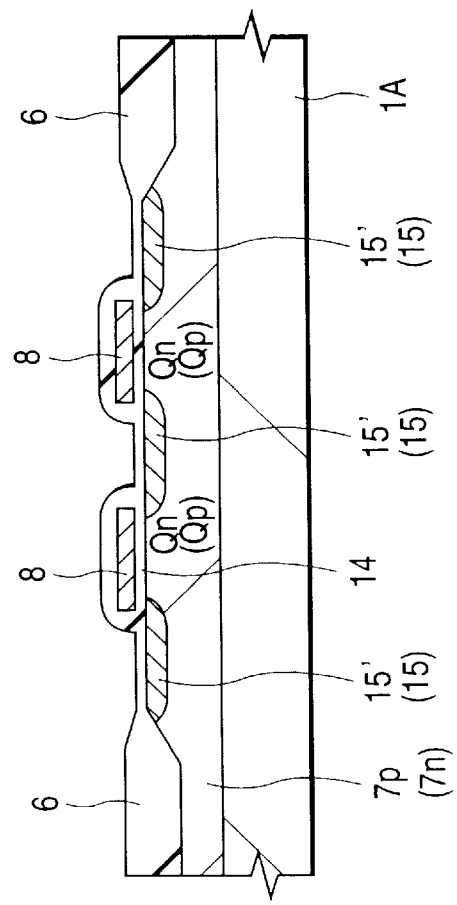

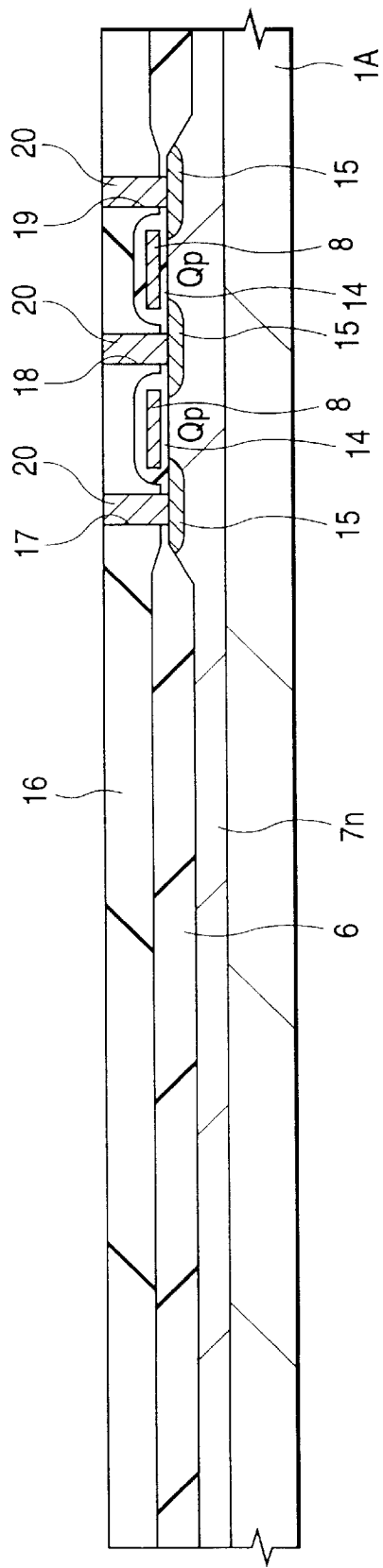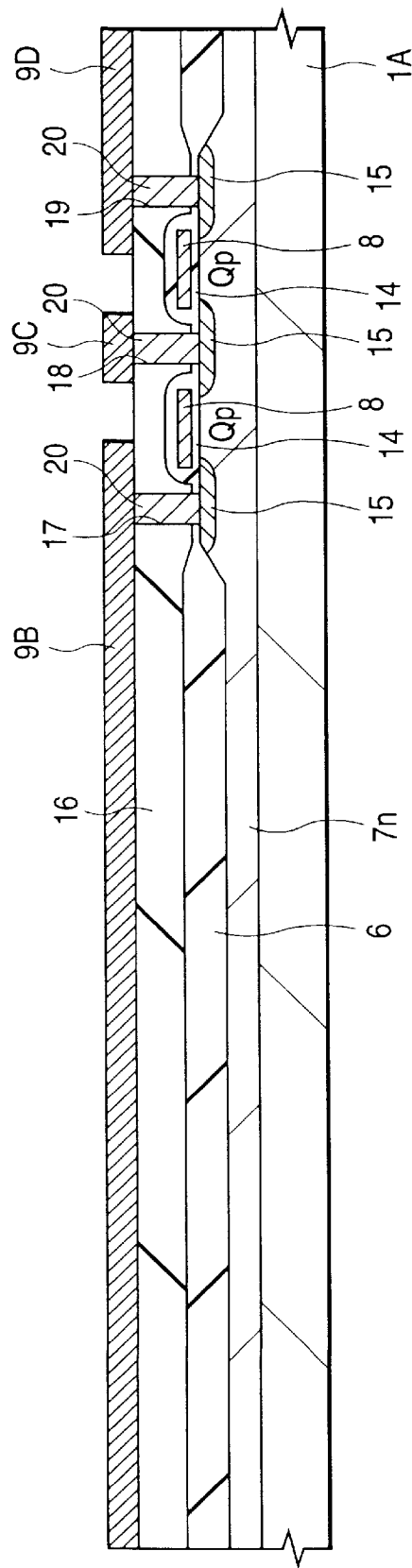

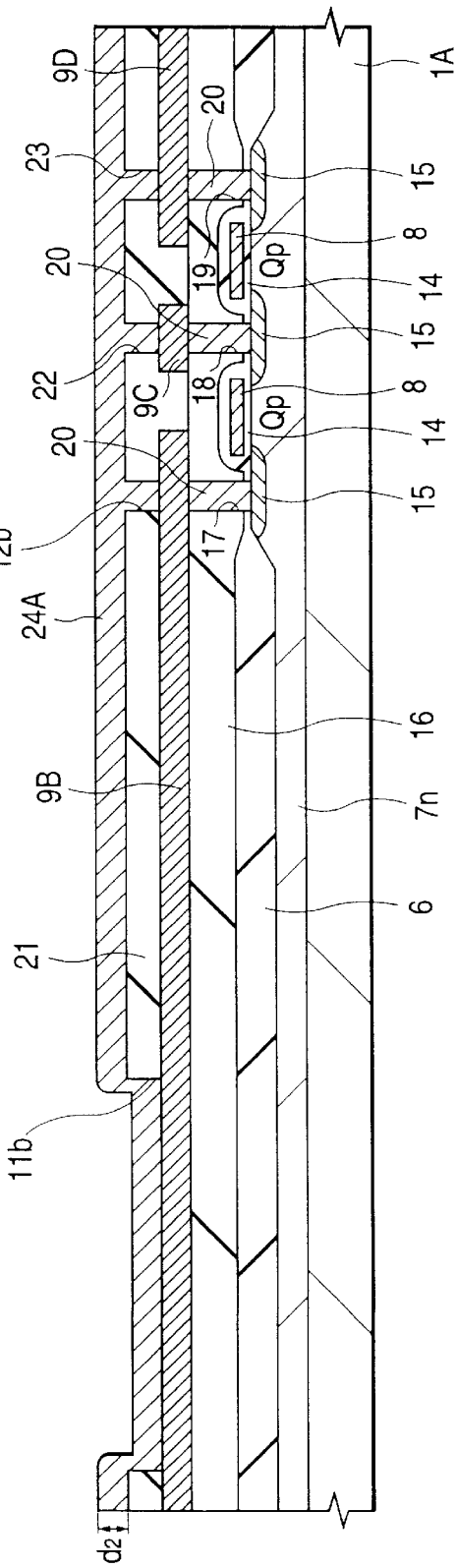
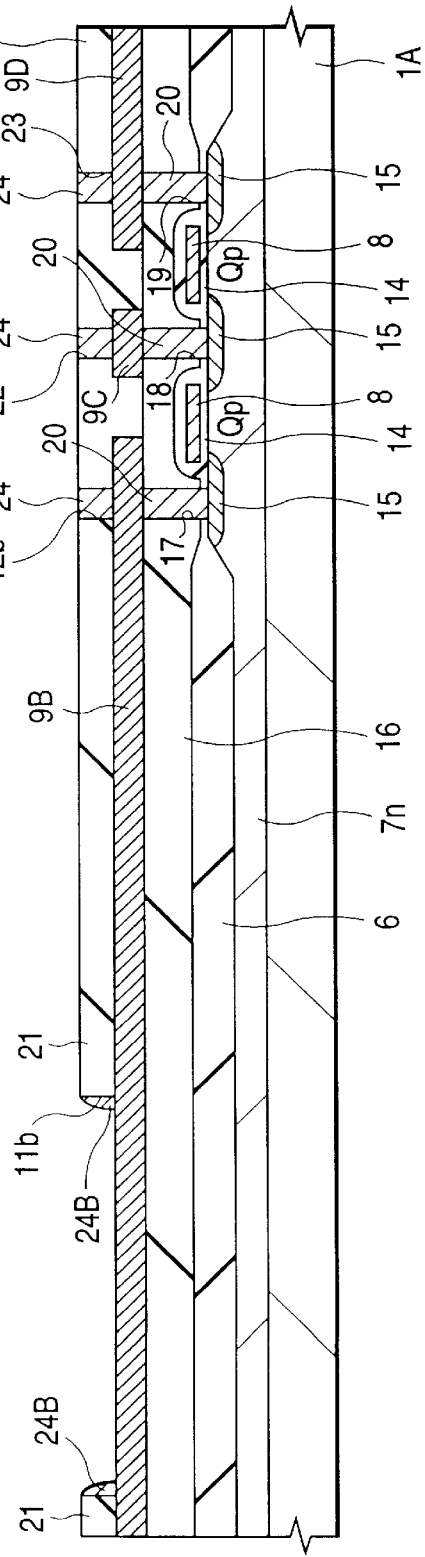

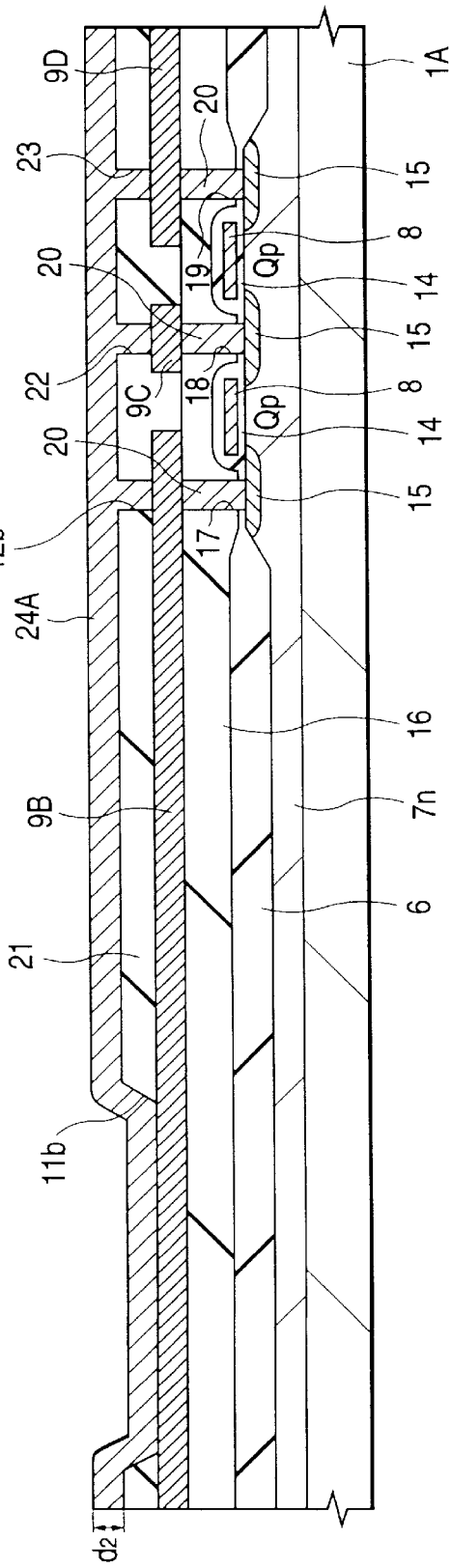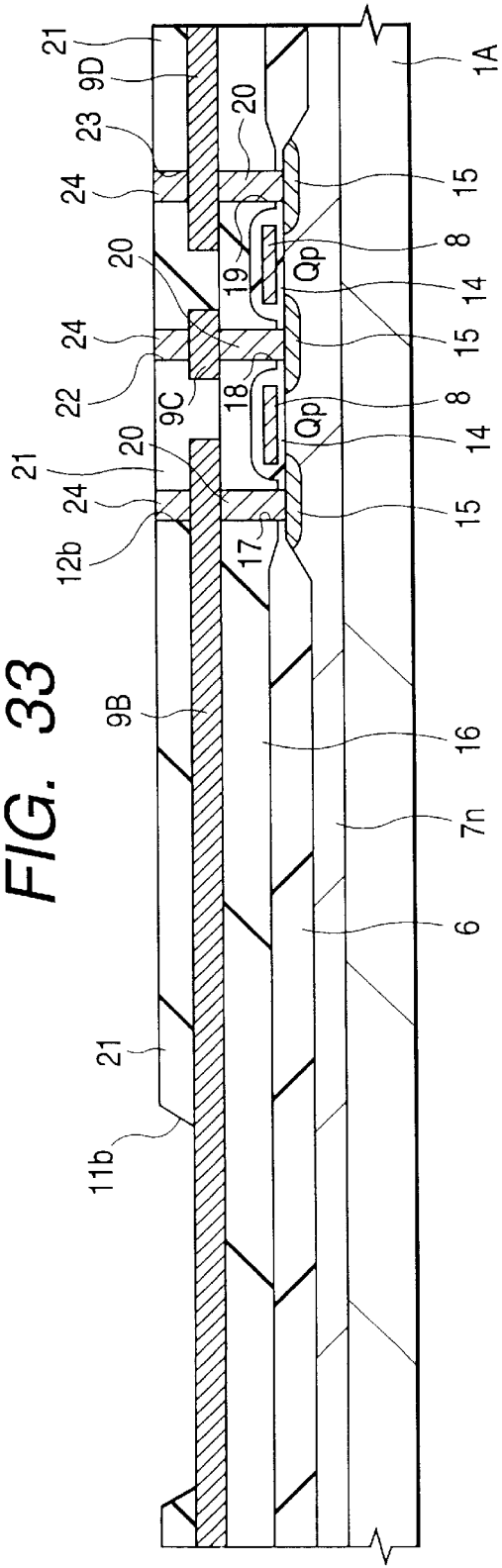

METHOD OF MANUFACTURING THROUGH HOLES IN A SEMICONDUCTOR DEVICE

BACKGROUND OF THE INVENTION

The present invention relates to techniques of fabricating a semiconductor integrated circuit (hereinafter abbreviated to IC') device and, more particularly, to techniques effectively applicable to a process of forming through holes in a layer insulating film formed on a semiconductor substrate, for connecting wiring lines formed in an upper wiring layer overlying the layer insulating film and those formed in a lower wiring layer underlying the layer insulating film.

A gate array large-scale logic integrated circuit (gate array logic LSIC chip) is one of IC devices. The gate array logic LSIC chip is provided with a logic circuit comprising a plurality of elemental cells arranged in a matrix in a central area of a plurality of a major surface of a semiconductor chip. A plurality of I/O buffers are arranged so as to surround the logic circuit. A plurality of bonding pads to be electrically connected to external devices are arranged in a peripheral region of the semiconductor chip so as to surround the arrangement of the I/O buffers and so as to correspond to the I/O buffers.

In the recent gate array logic LSIC chip of this kind, the bonding pads are arranged in two or three rows along the edges of the semiconductor chip to cope with increase in the number of the bonding pads required by increase in the size of integration of the basic cells of the logic circuit. The bonding pads on each row are displaced by half the pitch thereof relative to the bonding pads on the adjacent rows so that the bonding pads are arranged in a zigzag arrangement, whereby the effective pitch of the bonding pads is reduced and an increased number of bonding pads can be arranged on a semiconductor chip of the same size. A logic LSIC chip provided with bonding pads in a zigzag arrangement is disclosed in Japanese Patent Laid-Open No. Hei 3-173433.

If the bonding pads are arranged in a zigzag arrangement to reduce the effective pitch of the bonding pads, the pitch of wiring lines connecting the internal circuits to the bonding pads (hereinafter referred to as "connecting leads") must be reduced. Consequently, the coupling capacitance between the adjacent connecting leads increases to increase delay attributable to the connecting leads.

When the thickness of wiring lines is reduced with the miniaturization of semiconductor elements, current density in the connecting leads increases to deteriorate resistance against EMD (electromigration destruction) and to cause voltage drop due to increase in the resistance of the wiring lines. Accordingly, it is difficult to connect power lines (Vcc, GND) and signal lines which carries high currents by the connecting leads to the bonding pads.

SUMMARY OF THE INVENTION

The inventors of the present invention invented the following means to solve the foregoing problems.

The logic LSIC chip has three or more wiring layers, and the bonding pads are arranged in a plurality of rows along the edges of the semiconductor chip so that the bonding pads are arranged in a zigzag arrangement. Wiring lines formed in one or a plurality of the wiring layers including at least the uppermost wiring layer are used as first connecting leads for electrically connecting the bonding pads on the inner row and the internal circuits. Wiring lines formed in the wiring layers other than those in which the wiring lines serving as the first connecting leads are formed are used as second connecting leads for electrically connecting the bonding pads on the outer row and the internal circuits. The respective sectional areas of the first connecting leads and the second connecting leads are substantially the same.

Suppose that the logic LSIC chip is provided with three wiring layers, the bonding pads and the first connecting leads are formed in the third wiring layer, i.e., the top wiring layer, and the second connecting leads are formed in the second and the first wiring layer. The sectional area of the first connecting leads formed in the third wiring layer is substantially equal to that of the second connecting leads formed in the second and the first wiring layer. If the logic LSIC chip is provided with five wiring layers, the bonding pads and the first connecting leads are formed in the fifth wiring layer, i.e., the uppermost wiring layer, and the fourth wiring layer, and the second connecting leads are formed in the third, the second and the first wiring layer. The sectional area of the first connecting leads formed in the fifth and the fourth wiring layer is substantially equal to that of the second connecting leads formed in the third, the second and the first wiring layer.

This wiring structure for the logic LSIC chip is mentioned in U.S. patent application Ser. No. 08/838,260 filed Apr. 17, 1997 now U.S. Pat. No. 5,892,276 by the applicant of the present patent application.

In this wiring structure, the second connecting leads connected to the bonding pads on the outer row, and the first connecting leads connected to the bonding pads on the inner row are formed in different wiring layers, respectively. Therefore, the coupling capacitance between the adjacent connecting leads is not increased even if the pitch of the bonding pads is reduced. Since the first connecting leads connected to the bonding pads on the inner row are formed in the third wiring layer, i.e., the uppermost wiring layer, when the logic LSIC chip is provided with the three wiring layers, the deterioration of the EMD resistance of the first connecting leads and the increase of wiring resistance can be prevented by increasing the thickness of the first connecting leads when the width of the same is reduced. Since the second connecting leads connected to the bonding pads on the outer row are formed in the two wiring layers, i.e., the second and the first wiring layer, the effective width of each wiring line is equivalent to the sum of the widths of two wiring lines, and therefore the deterioration of resistance against EMD and the increase of the wiring resistance can be prevented.

Since the current density in the connecting leads connected to the bonding pads on the outer row and that in the connecting leads connected to the bonding pads on the inner row are approximately equal to each other, optional ones of the bonding pads arranged along the edges of the semiconductor chip can be connected to power lines (Vcc, GND) and signal lines carrying high currents, which increases the degree of freedom of logic design using an autoplacing and autorouting system. The optional selection of the bonding pads to be connected to the power lines and the signal lines does not affect the performance of the gate array logic LSIC chip.

The foregoing connecting lead structure examined by the inventors of the present invention needs a means for electrically connecting the bonding pads on the outer row and the second connecting leads, because the bonding pads on the outer row and the second connecting leads are formed in different wiring layers, respectively. For example, when connecting the second connecting leads formed in the second and the first wiring layer and the bonding pads on the outer row formed in the third wiring layer in the gate array logic LSIC chip having the three wiring layers, one end of each second connecting lead must be extended to a position directly below the bonding pad, and the second connecting lead must be connected through a through hole formed in the layer insulating film underlying the third wiring layer to the bonding pad.

FIGS. 41(a) and 41(b) are a plan view and a sectional view, respectively, of a bonding pad in a first through hole structure examined by the inventors of the present invention.

As shown in FIGS. 41(a) and 41(b), a plurality of through holes 41 and 42 are arranged in a matrix under a bonding pad 40. Wiring lines 44 in a second wiring layer and wiring lines 43 in a first wiring layer are electrically connected through through holes 41 formed in a first layer insulating film 45. The bonding pad 40 is connected electrically through the through hole 42 formed in a second layer insulating film 46 to a wiring line 44 formed in the second wiring layer. The size of the through holes 41 is substantially equal to that of through holes through which wiring lines in the second wiring layer and those in the first wiring line of the internal circuit are connected. The size of the through holes 42 is substantially equal to that of through holes through which wiring lines in the third wiring layer and those in the second wiring line of the internal circuit are connected. The through holes of the internal circuit and the through holes 41 and 42 are minute ones of sub-1 μm in diameter. Such minute through holes reduces the step coverage of conductive films formed therein, plugs 47 of W (tungsten) or the like are buried in the minute through holes to connect the wiring lines in the upper wiring layer and those in the lower wiring layer with satisfactory reliability.

This structure in which the plurality of minute through holes 41 and 42 are formed in a matrix under the bonding pad 40 is liable to reduce the strength of the bonding pad 40 necessary to withstand force that acts on the bonding pad 40 during a wire bonding process, and to deteriorate the adhesion between the wire and the bonding pad 40.

FIGS. 42(a) and 42(b) are a plan view and a sectional view, respectively, of a bonding pad in a second through hole structure. Minute through holes 41 and 42, as shown in FIG. 42(b) are arranged only along the edges of a bonding pad 40 to avoid reducing the strength of the bonding pad 40.

It was found through the examination of the second through hole structure made by the inventors of the present invention that a first layer insulating film 45 and a second layer insulating film 46 under the bonding pad 40 are liable to be cracked by an impact applied by a probe when the probe is applied to the bonding pad 40 in a semiconductor chip testing process. It is inferred that such cracking of the layer insulating films 45 and 46 is caused by the differences in hardness between plugs 47, the layer insulating films 45 and 46, and wiring lines 43 and 44.

FIG. 43 shows a third through hole structure. As shown in FIG. 43, the size of a through hole 49 through which a connecting lead 48 is connected to a bonding pad 40 is substantially equal to that of the bonding pad 40. The sizes of the bonding pad 40 and the through hole 49 are several tens micrometers. Since the area of contact between the bonding pad 40 and the connecting lead 48 is large, the strength of the bonding pad 40 is far greater than those of the bonding pads 40 shown in FIGS. 41 and 42.

As shown in FIG. 44, whereas l' of the through hole 49 under the bonding pad 40 is as great as several tens micrometers, the diameter l of a through hole 50 of the internal circuit is as small as on the order of sub-1 μm.

Therefore, an etch residue 46a, i.e., a portion of a layer insulating film 46 remains in the large through hole 49 if the large through hole 49 and the minute through hole 50 are formed simultaneously by etching the layer insulating film 46, and the etch residue 46a makes the connection of the boding pad 40 and the connecting lead 48 unsatisfactory.

The following facts are possible causes of forming the etch residue 46a in part of the large through hole 49 when the layer insulating film 46 is etched. A through hole is formed in a layer insulating film by an anisotropic etching process which performs both film deposition and film etching in parallel. A through hole of a normal shape can be formed by adjusting the etching/deposition ratio according to the diameter of the through hole. Therefore, if the etching/deposition ratio is determined properly on the basis of the large through hole 49 when simultaneously forming the large through hole 49 and the minute through hole 50 in the layer insulating film 46, the minute through hole 50 cannot be properly formed. If the etching/deposition ratio is determined on the basis of the diameter of the minute through hole 50, a portion of the layer insulating film 46 corresponding to the through hole 29 cannot be sufficiently etched and the etch residue 46a remains in the through hole 49.

If an etch back depth for etching back a W film is determined properly on the basis of the minute through holes when simultaneously filling up the large through holes and the minute through holes formed in the layer insulating film with W plugs, etch back residues remain on the side walls of the large through holes, and the etch back residues sometimes come off the side walls of the large through holes to cause short circuit between the adjacent wiring lines.

As shown in FIG. 45, when filling up the large through hole 49 and the minute through hole 50 formed in the layer insulating film 46 with W plugs, a W film 51 of a thickness d(d<l/2 is deposited by a CVD process (chemical vapor deposition process) on the layer insulating film 46. The W film 51 is deposited uniformly longitudinally and laterally in the through holes 49 and 50. Therefore, the minute through hole 50 of l(l/2<d) in diameter is completely filled up with the W film 51 and the surface of a portion of the W film 51 corresponding to the minute through hole 50 is flat. However, the large through hole 49 of l'(l/2>d) in diameter, such as a through hole corresponding to the bonding pad, is not filled completely with the W film 51 and hence the surface of a portion of the W film 51 corresponding to the large through hole 49 sinks. Accordingly, as shown in FIG. 46, an etch back residue 51b remains on the side wall of the large through hole 49 if etch back conditions are determined so that a plug 51a is formed properly in the minute through hole 50, because the portion of the W film 51 formed in the large through hole 49 cannot be fully etched by the etch back process of such etch back conditions.

Accordingly, it is an object of the present invention to provide techniques effective in improving processing accuracy when forming through holes of different diameters in a layer insulating film.

According to a first aspect of the present invention, a method of fabricating a semiconductor integrated circuit device comprises the steps of forming first through holes of a relatively small diameter by etching a first region of a layer insulating film, and forming second through holes of a relatively great diameter by etching a second region of the layer insulating film.

Thus, the through holes of a relatively small diameter and those of a relatively great diameter are formed in separate steps, respectively.

The method of fabricating the semiconductor integrated circuit device according to the first aspect of the present invention may taper the second through holes.

The method of fabricating the semiconductor integrated circuit device according to the first invention may form the invention may form the first through holes by anisotropic etching and may form the second through holes by isotropic etching.

According to a second aspect of the present invention, a method of fabricating a semiconductor integrated circuit device comprises the steps of forming first through holes of a relatively small diameter by etching a first region of a layer insulating film, filling up the first through holes with plug electrodes by etching back a first conductive film deposited on the layer insulating film, forming second through holes of a relatively great diameter by etching a second region of the layer insulating film after filling up the first through holes with the plug electrodes, and forming a second wiring lines by patterning a second conductive film deposited on the layer insulating film.

In the method of fabricating the semiconductor integrated circuit device according to the second aspect of the present invention, the diameter of the first through holes is twice the thickness of the first conductive film or below, and the diameter of the second through hole is twice the thickness of the first conductive film or above.

Thus, the through holes of a relatively great diameter are formed after filling up the through holes of a relatively small diameter with the plug electrodes.

According to a third aspect of the present invention, a method of fabricating the semiconductor integrated circuit device comprises the steps of forming first through holes of a relatively small diameter in a first region of a layer insulating film and forming second through holes of a relatively great diameter in a second region of the layer insulating film by etching, filling up the first through holes with plug electrodes by etching back a first conductive film deposited on the layer insulating film, and removing etch back residues of the first conductive film remaining on the side walls of the second through holes.

Thus, the step of filling up the through holes of a relatively small diameter with the plug electrodes by etching back the first conductive film and the step of removing etch back residues remaining on the side walls of the through holes of a relatively great diameter are carried out separately.

BRIEF DESCRIPTION OF THE DRAWINGS

The above and other objects features and advantages of the present invention will become more apparent from the following description taken in connection with the accompanying drawings.

FIG. 3($b$) is a plan view of an essential portion of the arrangement shown in FIG. 3($a$).

FIG. 4($a$) is a perspective view of an arrangement of a bonding pad on an outer row, an I/O buffer, and a connecting lead connecting the bonding pad and the I/O buffer, included in the CMOS gate array chip of FIG. 1.

FIG. 4($b$) is a plan view of an essential portion of the arrangement shown in FIG. 4($a$).

FIG. 5 is a perspective view of three bonding pads in a zigzag arrangement included in the CMOS gate array chip of FIG. 1.

FIGS. 7($a$) and 7($b$) are sectional views of essential portions of the CMOS gate array chip of FIG. 1 of assistance in explaining a method of fabricating the CMOS gate array chip of FIG. 1.

FIG. 10 is a sectional view of an essential portion of the CMOS gate array chip of FIG. 1 of assistance in explaining the method of fabricating the CMOS gate array chip of FIG. 1.

FIG. 11 is a sectional view of an essential portion of the CMOS gate array chip of FIG. 1 of assistance in explaining the method of fabricating the CMOS gate array chip of FIG. 1.

FIG. 23 is a sectional view of an essential portion of the CMOS gate array chip in the second embodiment of assistance in explaining the method of fabricating the CMOS gate array chip in the second embodiment.

FIG. 24 is a sectional view of an essential portion of the CMOS gate array chip in the second embodiment of assistance in explaining the method of fabricating the CMOS gate array chip in the second embodiment.

FIG. 32 is a sectional view of an essential portion of the CMOS gate array chip in the third embodiment of assistance in explaining the method of fabricating the CMOS gate array chip in the third embodiment.

FIG. 33 is a sectional view of an essential portion of the CMOS gate array chip in the third embodiment of assistance in explaining the method of fabricating the CMOS gate array chip in the third embodiment.

DESCRIPTION OF THE PREFERRED EMBODIMENTS

Figure 1:
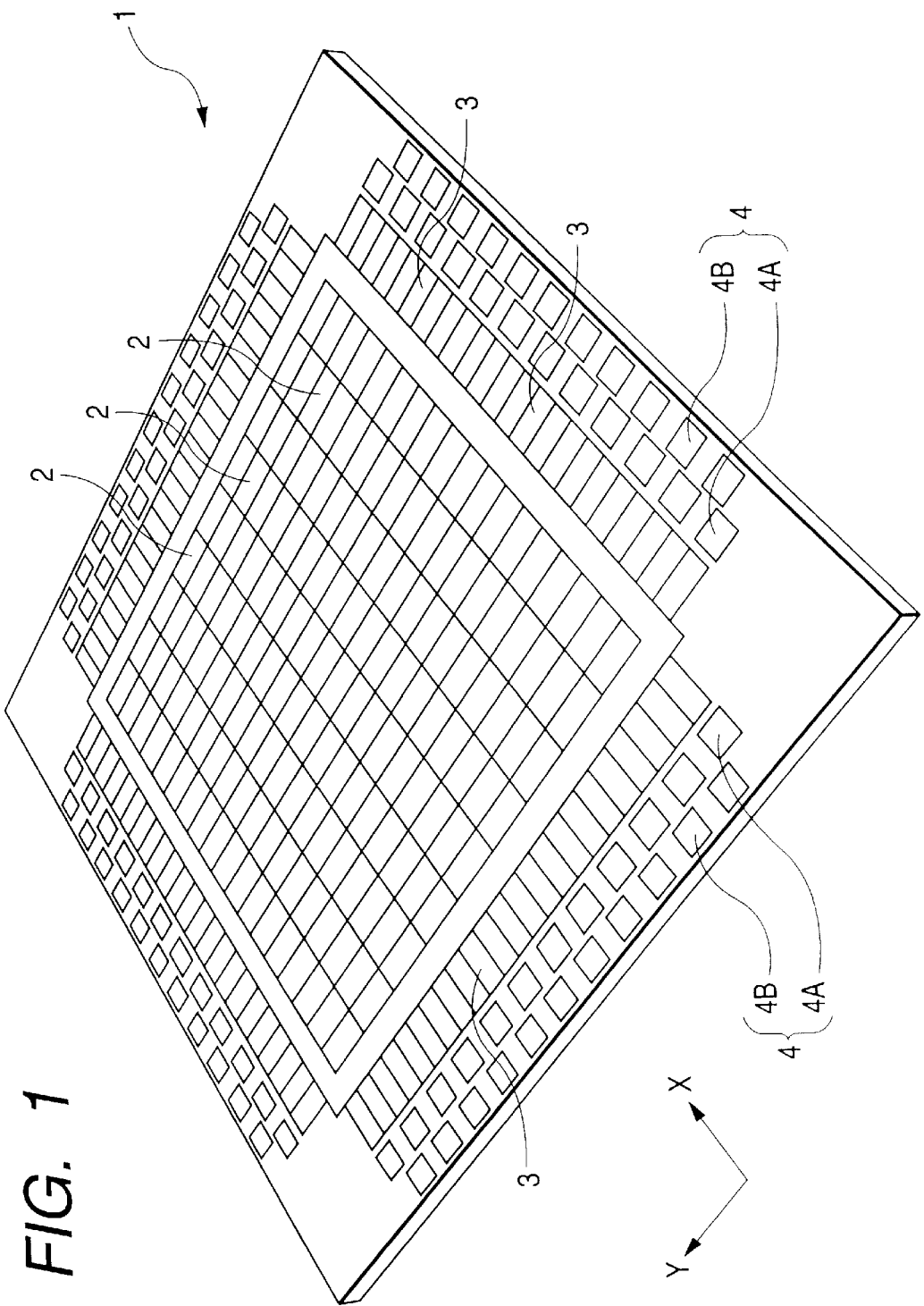
FIG. 1 is a perspective view of a CMOS gate array chip, in a first embodiment according to the present invention.

Preferred embodiments of the present invention will be described hereinafter with reference to the accompanying drawings, in which parts of like functions are designated by the same reference characters throughout and the duplicate description thereof will be omitted.

First Embodiment

A semiconductor IC chip (device) 1 in a first embodiment according to the present invention is a three-layer CMOS (complementary metal oxide semiconductor) gate array chip (device) as shown in FIG. 1.

Figure 2:
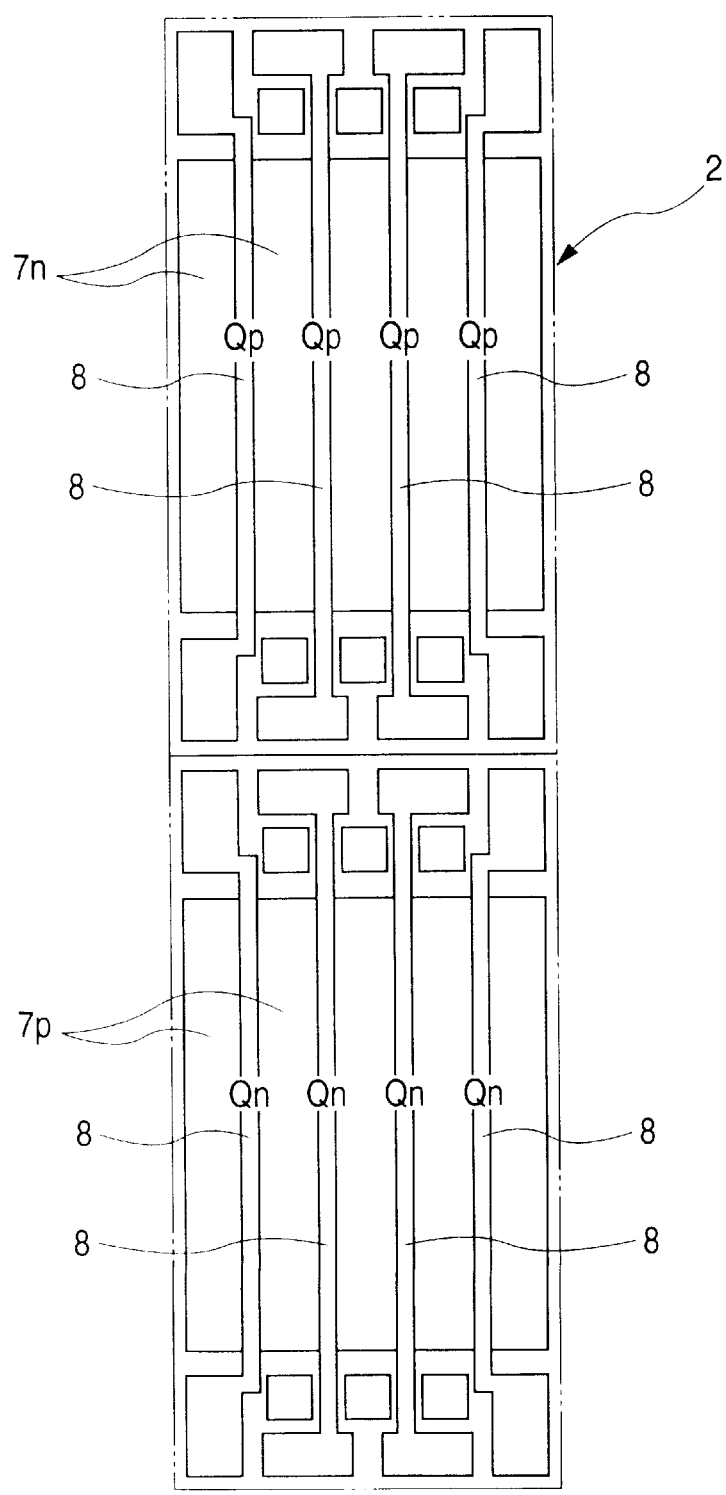
FIG. 2 is a plan view of an elemental cell of the CMOS gate array chip of FIG. 1.

Referring to FIG. 1, a plurality of elemental cells 2 forming a gate array, i.e., a logic circuit, are arranged in an X-direction and a Y-direction in a matrix. As shown in FIG. 2, each elemental cell 2 is constructed by combining a predetermined number of n-channel MISFETs (metal insulator semiconductor field effect transistors) Qn and a predetermined number of p-channel MISFETs Qp. The MISFETs in each elemental cell 2, and the elemental cells 2 are connected on the basis of logic design to realize desired logic functions. Each of the n-channel MISFETs Qn of the elemental cell 2 is formed on a major surface of a p-type well 7p and has a gate electrode 8 of polysilicon. Each of the p-channel MISFETs of the elemental cell 2 is formed on a major surface of an n-channel well 7n, and has a gate electrode 8 of polysilicon.

In the CMOS gate array chip in the first embodiment, signal lines are formed, for example, in a first wiring layer and a second wiring layer, and power lines (lines to which a supply voltage Vcc of, for example, 1.8 to 5 V is applied, and lines to which a reference voltage GND of, for example, 0 V is applied) and a conductive layer for forming bonding pads (external terminals) are formed in a third wiring layer. The supply voltage Vcc is higher than the reference voltage GND. The wiring lines of the first and the third wiring layer are arranged mainly at X-lattice coordinates, and the wiring lines of the second wiring layer are arranged mainly at Y-lattice coordinates. The wiring lines of the first to the third wiring layer are, for example, aluminum alloy lines.

A plurality of I/O buffers 3 are arranged around the gate array so as to surround the gate array. Each of the I/O buffers 3, similarly to the elemental cell 2, is formed by combining a predetermined n-channel MISFETs and a predetermined number of p-channel MISFETs. A wiring pattern for connecting those MISFETs is determined selectively to realize a desired circuit function, such as that of an output buffer or a bilateral buffer.

A plurality of bonding pads 4 (external terminal) for electrically connecting the CMOS gate array chip to external devices are arranged around the arrangement of the I/O buffers 3, i.e., in a peripheral area of the semiconductor IC chip 1. The bonding pads 4 are arranged so as to correspond to and connected by connecting leads to the I/O buffers 3, respectively.

In the semiconductor IC chip 1 in the first embodiment, the bonding pads 4 are arranged in two rows along each edge of the semiconductor IC chip 1 to cope with increase in the number of the external terminals resulting from increase in the scale of the logic circuit. The inner bonding pads 4A on an inner row is displaced by half a pitch relative to the outer bonding pads 4B on an outer row so that the inner bonding pads 4A and the outer bonding pads 4B are arranged in a zigzag arrangement. The inner bonding pads 4A on the inner rows and the outer bonding pads 4B on the outer rows are formed in the third wiring layer, the connecting leads for connecting the inner bonding pads 4A to the I/O buffers 3 are formed in the third wiring layer, and the connecting leads for connecting the outer bonding pads 4B to the I/O buffer 3 are formed in the first and the second wiring layer. Thus, the connecting leads connected to the inner bonding pads 4A and the connecting leads connected to the outer bonding pads 4B are formed in the separate wiring layers, respectively.

Figure 3A:
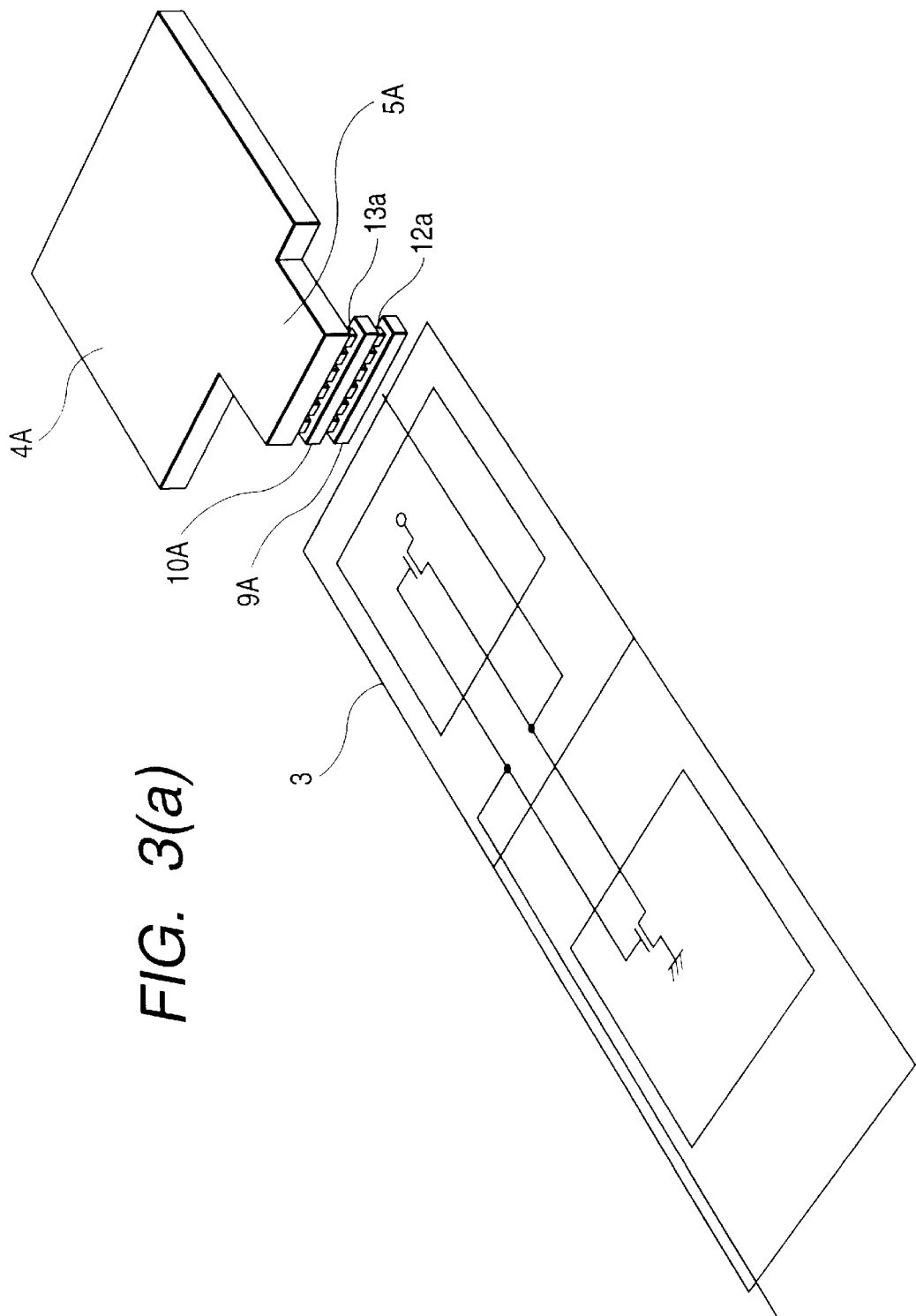
FIG. 3($a$) is a perspective view of an arrangement of a bonding pad on an inner row, an I/O buffer, and a connecting lead connecting the bonding pad and the I/O buffer, included in the CMOS gate array chip of FIG. 1.

FIG. 3(a) is a perspective view of an arrangement of the inner bonding pad 4A, the I/O buffer 3, and the connecting lead 5A connecting the inner bonding pad 4A and the I/O buffer 3, FIG. 3(b) is a plan view of the inner bonding pad 4A and the connecting lead 5A, FIG. 4(a) is a perspective view of an arrangement of the outer bonding pad 4B, the I/O buffer 3, and a connecting lead 5B connecting the outer bonding pad 4B and the I/O buffer 3, FIG. 4(b) is a plan view of the outer bonding pad 4B and the connecting lead 5B of FIG. 4(a), and FIG. 5 is a perspective view of the one inner bonding pad 4A and the two outer bonding pads 4B arranged in a zigzag arrangement. In FIGS. 3(a), 3(b), 4(a), 4(b) and 5, only the bonding pads 4A and 4B, the connecting leads 5A and 5B and through holes for electrically connecting those components are shown and the wiring lines and insulating films of the I/O buffer 3 are omitted.

Referring to FIGS. 3(a) and 3(b), the connecting lead 5A connecting the inner bonding pad 4A and the I/O buffer 3 is formed integrally with the inner bonding pad 4A in the third wiring layer. The connecting lead 5A and a wiring line 9A formed in a first layer of the I/O buffer 3 are connected by a wiring line 10A of the second wiring layer at one end of the I/O buffer 3.

The wiring line 10A of the second layer and the wiring line 9A of the first layer are connected electrically through a plurality of through holes 12a formed in a first layer insulating film electrically isolating the first and the second wiring layer from each other. The connecting lead 5A formed in the third wiring layer and the wiring line 10A formed in the second wiring layer are connected electrically at one end of the I/O buffer 3 through a plurality of through holes 13a formed in a second layer insulating film electrically isolating the second and the third wiring layer from each other. The through holes 12a and 13a have very small diameters on the order of sub-1 $\mu$m, and are filled up with W (tungsten) plugs, respectively.

Referring to FIGS. 4(a) and 4(b), a connecting lead 5B connecting the outer bonding pad 4B and the I/O buffer 3 consists of a wiring line 9B of the first wiring layer extending from one end of the I/O buffer 3 so as to underlie the outer bonding pad 4B and a wiring line 10B of the second wiring layer extending from one end of the I/O buffer 3 so as to underlie the outer bonding pad 4B. The wiring line 10B of the second wiring layer and the wiring line 9B of the first wiring layer are substantially the same in pattern. The wiring line 10B is disposed so as to overlap the wiring line 9B.

The wiring line 10B of the second wiring layer and the wiring line 9B of the first wiring layer constituting the connecting lead 5B are connected electrically through a plurality of through holes 12b formed in the first layer insulating film electrically isolating the second wiring layer and the first wiring layer from each other. The through holes 12b have very small diameters on the order of sub-1 $\mu$m, and are filled up with W plugs, respectively. The wiring line 10B of the second wiring layer and the wiring line 9B of the first wiring layer are electrically connected at a position under the outer bonding pad 4B through a single through hole 11b (FIG. 4(b)) formed in the first layer insulating film electrically isolating the second wiring layer and the first wiring layer from each other. The through hole 11b has a diameter of several tens micrometers approximately equal to that of the outer bonding pad 4B. The wiring line 10B of the second wiring layer and the wiring line 9B of the first wiring layer are connected directly in the through hole 11b.

The outer bonding pad 4B and the wiring line 10B of the second wiring layer serving as part of the connecting lead 5B are connected electrically under the outer bonding pad 4B through a single through hole 13b (FIG. 4(b)) formed in the second layer insulating film electrically isolating the outer bonding pad 4B and the wiring line 10B from each other. The through hole 13b has a diameter of several tens micrometers approximately equal to that of the outer bonding pad 4B. The outer bonding pad 4B and the connecting lead 5B are connected directly in the through hole 13b.

The wiring line of the third wiring layer serving as the connecting lead 5A is about 20 $\mu$m in width and about 1 $\mu$m in thickness. The wiring line 10B of the second layer and the wiring line 9B of the first wiring layer constituting the connecting lead 5B are about 20 $\mu$m in width and about 0.5 $\mu$m in thickness. Accordingly, the respective sectional areas of the connecting leads 5A and 5B are approximately equal to each other, and hence current densities in the connecting leads 5A and 5B are approximately equal to each other. The single wiring line of the third wiring layer serving as the connecting lead 5A and having a relatively great thickness prevents the deterioration of EMD resistance and the increase wiring resistance and is capable of carrying a high current. Although the two wiring lines constituting the connecting lead 5B, i.e., the wiring line 9B of the first wiring layer and the wiring line 10B of the second wiring layer, have each a relatively small sectional area, the effective sectional area of the connecting lead 5B is the sum of the respective sectional areas of the two wiring lines 9B and 10B, so that the deterioration of EMD resistance and the increase of wiring resistance can be prevented, and the connecting lead 5B can carry a high current.

The zigzag arrangement of the inner bonding pads 4A and the outer bonding pads 4B and the connection of the connecting leads of the separate wiring layers to the adjacent bonding pads, respectively, are mentioned in U.S. patent application Ser. No. 08/838,260.

Figure 6A:
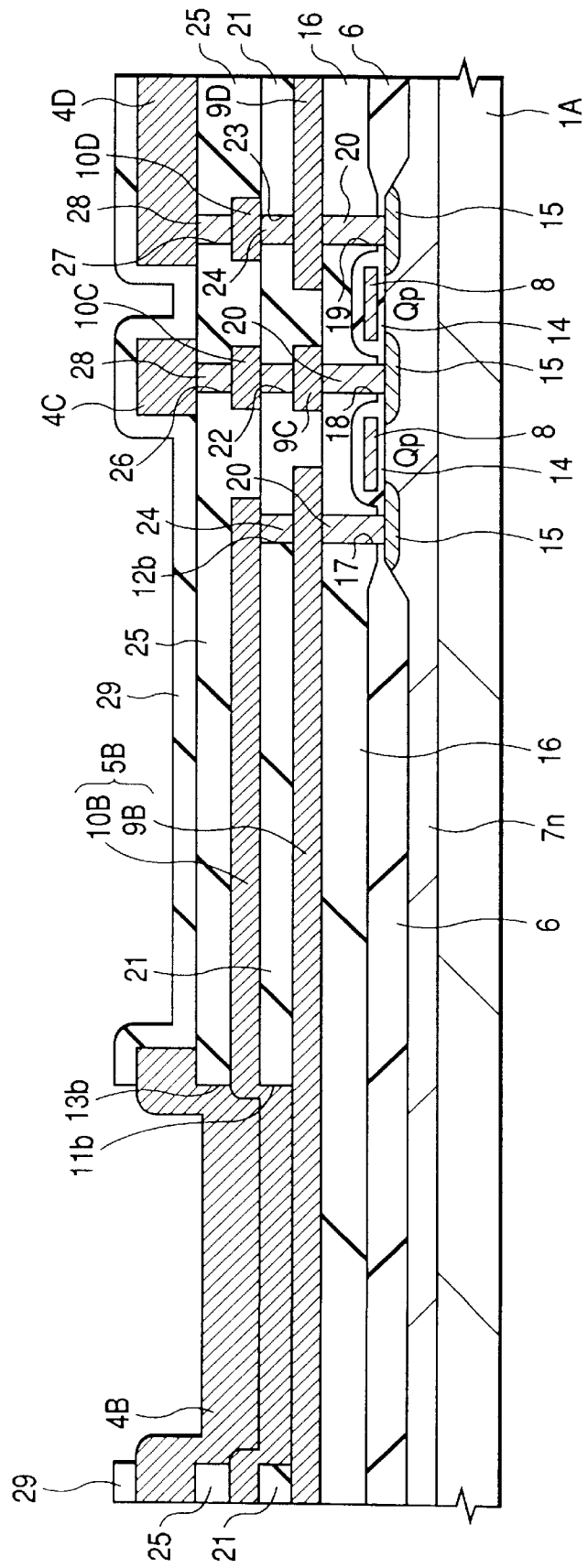
FIGS. 6($a$) and 6($b$) are sectional views of essential portions of the CMOS gate array chip of FIG. 1.
Figure 6B:
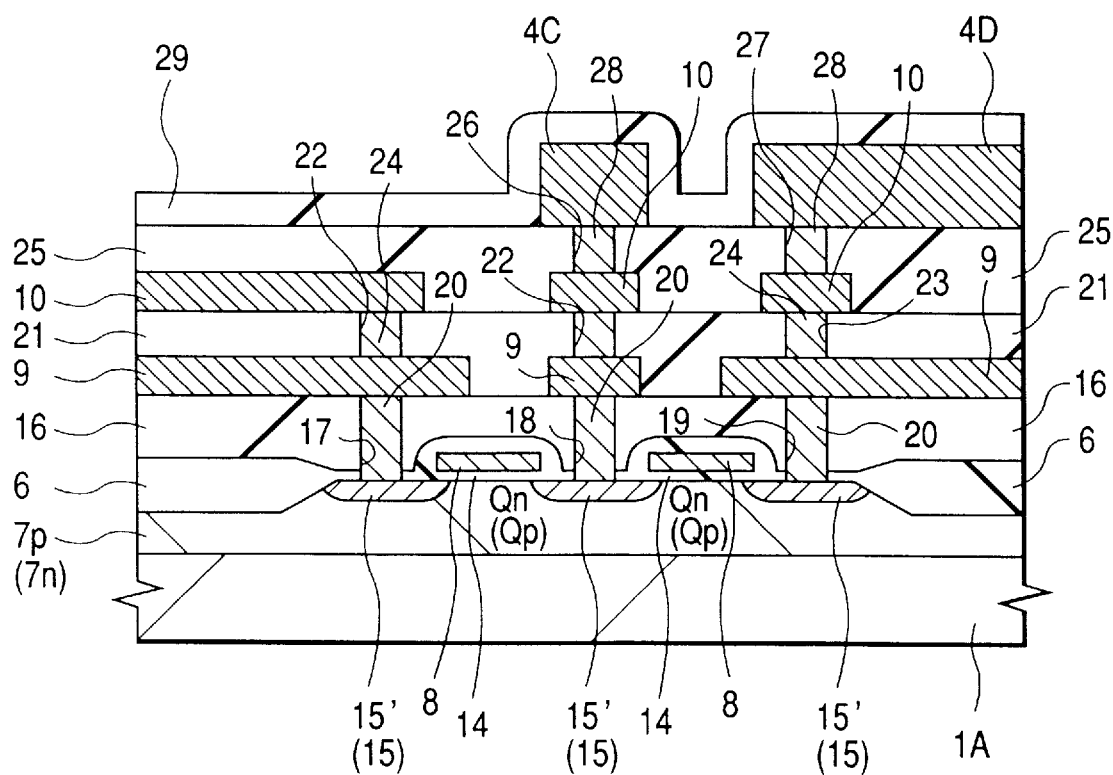
Figure 48:
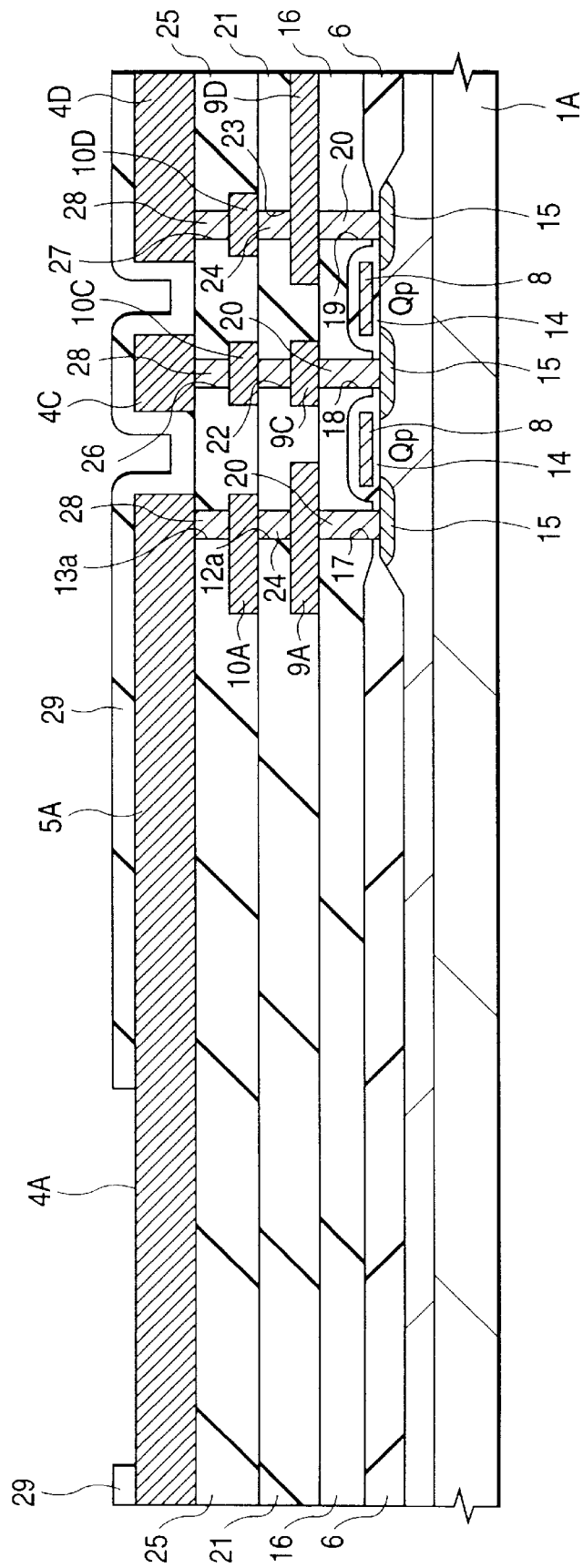
FIG. 48 is a sectional view of an essential portion of a CMOS gate array chip in a sixth embodiment according to the present invention.

FIG. 6(a) is a sectional view of a portion of the semiconductor IC chip 1 including the outer bonding pad 4B and the connecting lead 5B, i.e., the wiring line 10B of the second wiring layer and the wiring line 9B of the first wiring layer, and FIG. 6(b) is a sectional view of a portion of the semiconductor IC chip 1 including the MISFET Qn (Qp) of the elemental cell. FIG. 48 is a sectional view of a portion of the semiconductor IC chip 1 including the inner bonding pad 4A and the connecting lead 5A, i.e., the wiring line of the third wiring layer.

For example, an n-type well region 7n and a p-type well region 7p are formed in a major surface of a semiconductor substrate 1A of a single crystal silicon. In an element isolating region, a field oxide film 6 (element isolating insulating film) is formed on the surfaces of the n-type well region 7n and the p-type well region 7p. In an active region, the p-channel MISFET Qp, i.e., a component of the I/O buffer 3, is formed on the n-type well region 7n. The p-channel MISFET Qp comprises, as principal parts, a gate oxide film 14, a gate electrode 8, a source region (p-type semiconductor region 15), a drain region (p-type semiconductor region 15), and the n-type well region 7 serving as a channel forming region.

A silicon dioxide film 16, i.e., a layer insulating film, is formed over the p-channel MISFET Qp and the n-channel MISFET Qn, and wiring lines 9, 9B, 9C and 9D of the first wiring layer are formed on the silicon dioxide film 16. One end of the wiring line 9B of the first wiring layer serving as part of the connecting lead 5B is connected electrically through a contact hole 17 formed in the silicon dioxide film 16 to the p-type semiconductor region 15 of the p-channel MISFET Qp. The other end of the wiring line 9B underlies the outer bonding pad 4B. The wiring lines 9C and 9D of the first wiring layer connecting the elements of the I/O buffer 3 are connected electrically through contact holes 18 and 19 formed in the silicon dioxide film 16 to the p-type semiconductor regions 15 of the p-channel MISFET Qp. The contact holes 17, 18 and 19 through which the wiring lines 9B, 9C and 9D of the first wiring layer are connected electrically to the p-type semiconductor regions 15 of the p-channel MISFET Qp are filled up with tungsten (W) plug electrodes (which may be called "plugs" in some cases) 20, respectively. The wiring lines 9 of the first wiring layer are connected electrically through the W plurality electrodes 20 filling up the contact holes 17, 18 and 19 formed in the silicon dioxide film 16 to the n-type semiconductor regions 15' of the n-channel MISFET Qn (or the p-type semiconductor regions 15 of the p-channel MISFET Qp).

A second wiring layer having wiring lines 10, 10B, 10C and 10D are formed on the first layer insulating film 21 overlying the first wiring layer having the wiring lines 9, 9B, 9C and 9D. One end of the wiring line 10B of the second wiring layer forming a portion of the connecting lead 5B is connected electrically through a through hole 12b formed in the first layer insulating film at a position above the p-channel MISFET Qp to the wiring line 9B of the first wiring layer. The other end of the wiring line 10B of the second wiring layer is connected electrically through a through hole 11b formed in the first layer insulating film 21 at a position under the outer bonding pad 4B to the wiring line 9B of the first wiring layer. The wiring lines 10, 10C and 10D of the second wiring layer of the I/O buffer 3 are connected electrically through through holes 22 and 23 formed in the first layer insulating film to the wiring lines 9, 9C and 9D of the first wiring layer. The through hole 12b through which the wiring line 10B of the second wiring layer is connected electrically to the wiring line 9B of the first wiring layer, and the through holes 22 and 23 through which the wiring lines 10, 10C and 10D of the second wiring layer are connected to the wiring lines 9, 9C and 9D of the first wiring layer are filled up with W plugs 24, respectively. The through hole 11b through which the wiring line 10B of the second wiring layer and the wiring line 9B of the first wiring layer are connected is not filled up with any plug.

A third wiring layer having the outer bonding pad 4B, and wiring lines 4C and 4D is formed on a second layer insulating film 25 overlying the second wiring layer having the wiring lines 10, 10B, 10C and 10D. The outer bonding pad 4B is connected electrically through a through hole 13b formed in the second layer insulating film 25 to the wiring line 10B of the second wiring layer forming part of the connecting lead 5B. The wiring lines 4C and 4D of the third wiring layer serving as power lines (Vcc or GND) are connected electrically through through holes 26 and 27 formed in the second layer insulating film 25 to the wiring lines 10, 10C and 10D of the second wiring layer. The through holes 26 and 27 through which the wiring lines 4C and 4D of the third wiring layer are connected to the wiring lines 10, 10C and 10D of the second wiring layer are filled up with W plugs 28. The through hole 13b through which the outer bonding pad 4B and the connecting lead 5B are connected is not filled up with any plug. A passivation film 29 is formed over the entire surface of the semiconductor substrate 1 excluding the surfaces of the outer bonding pad 4B and the inner bonding pad 4A, not shown in FIG. 6(a). In the region in which the outer bonding pads 4B are formed, the layer insulating films 21 and 25 are not formed in the through holes 11b and 13b, and the wiring lines 9B and 10B, and the outer bonding pads 4B are formed in separate layers.

A method of fabricating the semiconductor IC chip 1, i.e., the CMOS gate array chip, thus constructed will be described hereinafter mainly with reference to FIGS. 7 to 20 (sectional views of a portion of the semiconductor IC chip 1 in which the outer bonding pad 4B and the connecting lead 5B are formed).

A portion shown in FIG. 7(b) corresponds to that shown in FIG. 6(b). Referring to FIGS. 7(a) and 7(b), a region of the semiconductor substrate 1A of, for example, a p-type single crystal silicon in which the n-type well region 7n is to be formed is doped with an n-type impurity, such as phosphorus (P), by ion implantation to form the n-type well region 7n, and a region of the semiconductor substrate 1A in which the p-type well region 7p is to be formed is doped with a p-type impurity, such as boron (B), by ion implantation to form the p-type well region 7p surrounding the n-type well region 7n. Then, the field oxide film 6 is formed on the surfaces of the n-type well region 7n and the p-type well region 7p in the element isolating region by, for example, a LOCOS process. Subsequently, the gate oxide film 14 is formed on the surface of the n-type well region 7n in an active region, and then the gate electrodes 8 of the p-channel MISFET Qp and the n-channel MISFET Qn by patterning a polysilicon film deposited by, for example, a CVD process on the semiconductor substrate 1A. The source region (p-type semiconductor region 15) and the drain region (p-type semiconductor region 15) of the p-channel MISFET Qp are formed by doping the n-type well region 7n extending on the opposite sides of the gate electrode 8 in a region for the p-channel MISFET Qp with a p-type impurity, such as boron (B) by ion implantation. The source region (n-type semiconductor region 15') and the drain region (n-type semiconductor region 15') of the n-channel MISFET Qn are formed by doping the p-type well region 7p in a region for the n-channel MISFET Qn with an n-type impurity, such as phosphorus (P) or arsenic (As) by ion implantation. A portion of the semiconductor IC chip 1 corresponding to the portion of the same shown in FIGS. 6(a) and 7(a) are shown in FIGS. 8 to 20.

Figure 8:
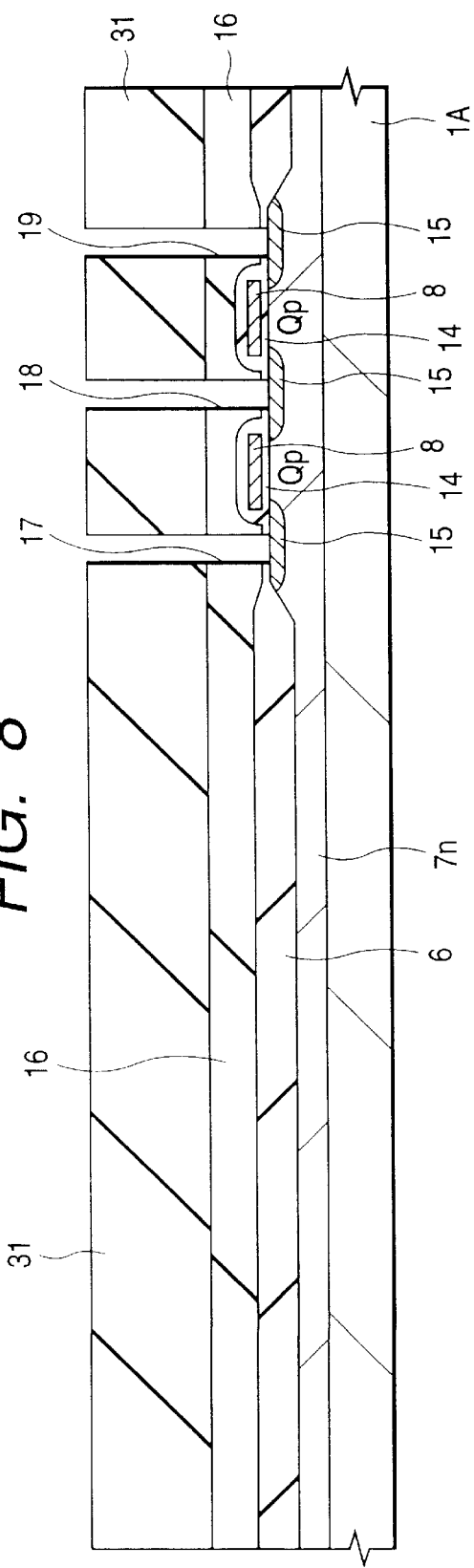
FIG. 8 is a sectional view of an essential portion of the CMOS gate array chip of FIG. 1 of assistance in explaining the method of fabricating the CMOS gate array chip of FIG. 1.

Then, as shown in FIG. 8, the surface of the silicon dioxide film 16 deposited on the semiconductor substrate 1A by, for example, a CVD process is smoothed by, for example, a CMP (chemical-mechanical polishing) process, portions of the silicon dioxide film 16 overlying the source region (p-type semiconductor region 15) and the drain region (p-type semiconductor region 15) of the p-channel MISFET Qp are etched by using a photoresist film 31 as a mask to form the contact holes 17, 18 and 19. The contact holes 17, 18 and 19 have a square cross section with sides of $l_1$ of about 0.4 μm in length.

Figure 9:
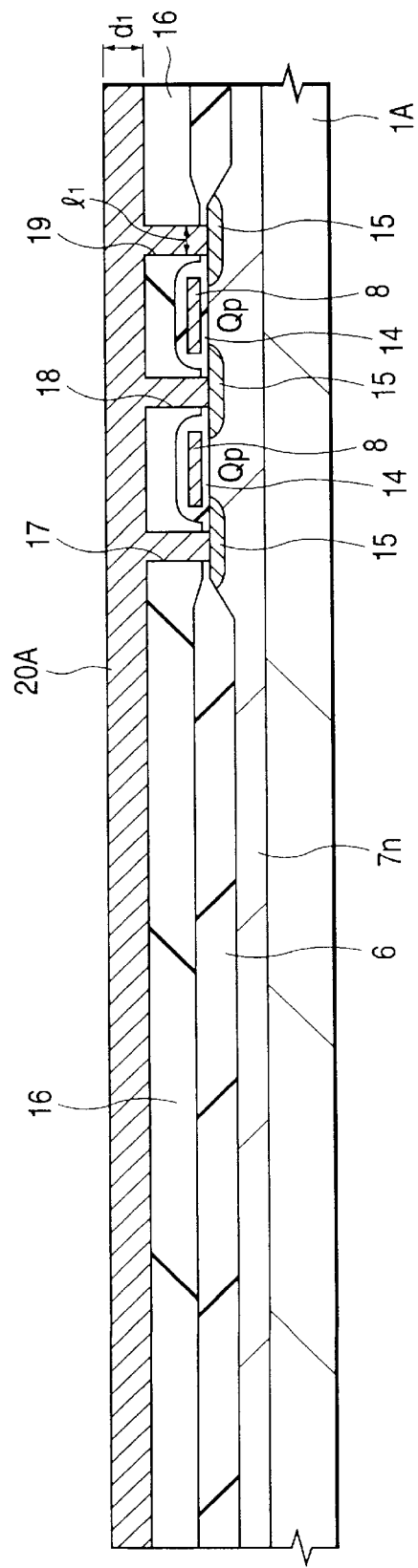
FIG. 9 is a sectional view of an essential portion of the CMOS gate array chip of FIG. 1 of assistance in explaining the method of fabricating the CMOS gate array chip of FIG. 1.

After removing the photoresist film 31, a tungsten (W) film 20A is deposited by a CVD process on the silicon dioxide film 16 as shown in FIG. 9. The W film 20 A is formed in a thickness $d_1$ greater than half the length $l_1(d1>l_1/2)$ of the sides of the contact holes 17, 18 and 19 to fill up the contact holes 17, 18 and 19 completely with the W film 20A.

Then, as shown in FIG. 10, the W film 20A is etched back to fill up the contact holes 17, 18 and 19 with W plugs 20, and then an Al alloy film formed on the silicon dioxide film by a sputtering process is patterned to form the wiring lines 9, 9B, 9C and 9D of the first wiring layer as shown in FIG. 11. The wiring lines 9, 9B, 9C and 9D of the first wiring layer are about 20 μm in width and about 0.5 μm in thickness.

Figure 12:
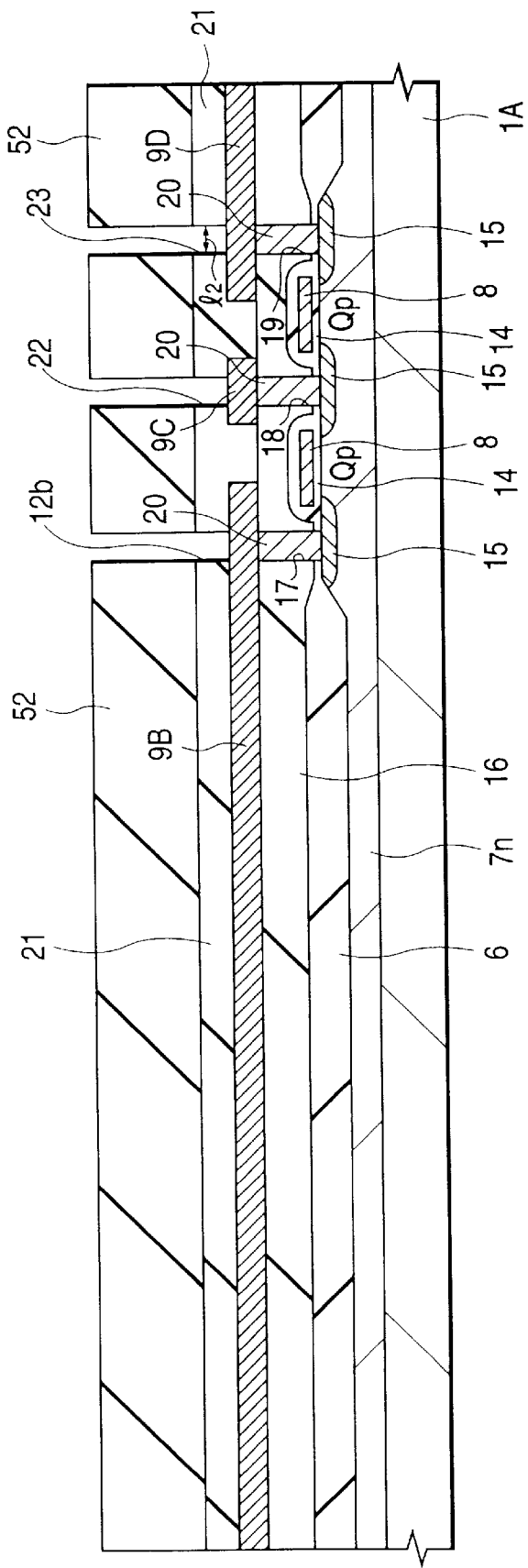
FIG. 12 is a sectional view of an essential portion of the CMOS gate array chip of FIG. 1 of assistance in explaining the method of fabricating the CMOS gate array chip of FIG. 1.

Then, as shown in FIG. 12, a silicon dioxide film is deposited by a CVD process and the surface of the silicon dioxide film is flattened by a CMP process to form the first layer insulating film 21 over the wiring lines 9, 9B, 9C and 9D of the first wiring layer. A photoresist mask 52 is formed over the first layer insulating film 21, portions of the first layer insulating film 21 over the p-channel MISFET Qp are etched to form the through holes 12b, 22 and 23 of a substantially square cross section. The first layer insulating film 21 is about 1 μm in thickness, and the length $l_2$ of the sides of the cross sections of the through holes 12b, 22 and 23 is about 0.4 μm.

Figure 13:
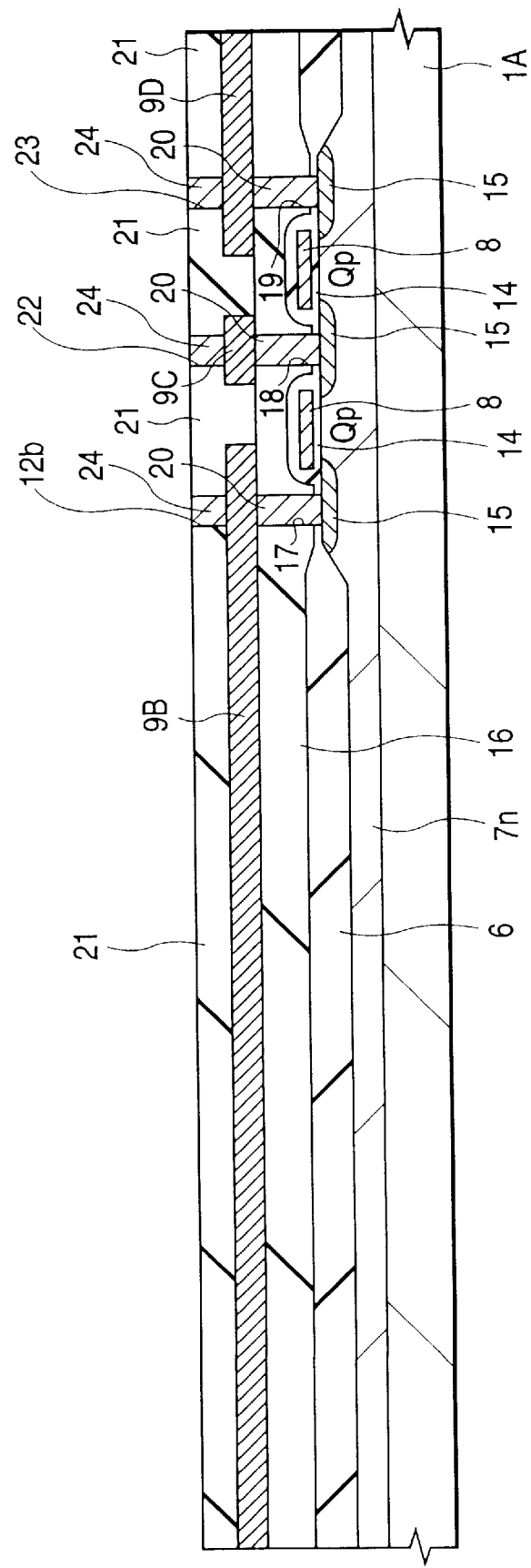
FIG. 13 is a sectional view of an essential portion of the CMOS gate array chip of FIG. 1 of assistance in explaining the method of fabricating the CMOS gate array chip of FIG. 1.
Figure 14:
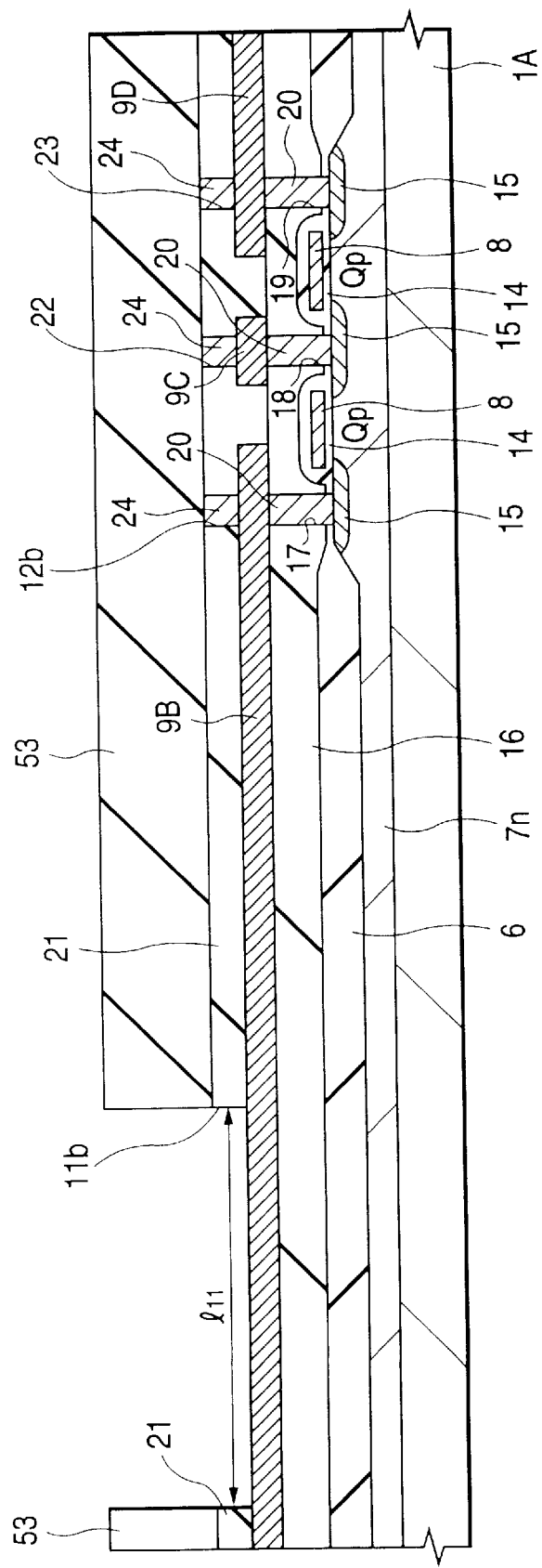
FIG. 14 is a sectional view of an essential portion of the CMOS gate array chip of FIG. 1 of assistance in explaining the method of fabricating the CMOS gate array chip of FIG. 1.

Then, after removing the photoresist mask 52, a W film of a thickness $d_2(>l_2/2)$ is deposited over the first layer insulating film by a CVD process, and the W film is etched back to fill up the through holes 12b, 22 and 23 with W plugs 24, respectively, as shown in FIG. 13. Subsequently, as shown in FIG. 14, a portion of the first layer insulating film 21 corresponding to the outer bonding pad 4B is etched by using a photoresist mask 53 to form the through hole 11b. The diameter $l_{11}$ of through hole 11b is about 90 μm. The diameter $l_{11}$ of the through hole 11b is greater than those of the through holes 12b, 22 and 23, and is greater than twice the thickness $d_2$ of the W film, i.e., $l_{11}/2>d_2$.

Thus the through holes 12b, 22 and 23 of a relatively small diameter and the through hole 11b of a relatively great diameter are formed in the first layer insulating film 21 by the separate processes, respectively. Therefore, the optimum etching conditions can be determined in view of the diameter of the through holes and hence the first layer insulating film 21 can be properly etched to form the through holes 12b, 22 and 23 of a relatively small diameter and the through hole 11b of a relatively great diameter. Thus, any etch residue of the first layer insulating film 21 will not remain in a portion of the through hole 11b of a relatively great diameter.

The through hole 11b of a relatively great diameter is formed after filling up the through holes 12b, 22 and 23 of a relatively small diameter with the W plugs 24; that is, the through hole 11b of a relatively great diameter is not formed before the through holes 12b, 22 and 23 of a relatively small diameter are filled up with the W plugs 24. Therefore, any etch back residue will not remain on the side wall of the through hole 11b of a relatively great diameter even if etch back depth for etching the W film is determined on the basis of the through holes 12b, 22 and 23 of a relatively small diameter.

Figure 15:
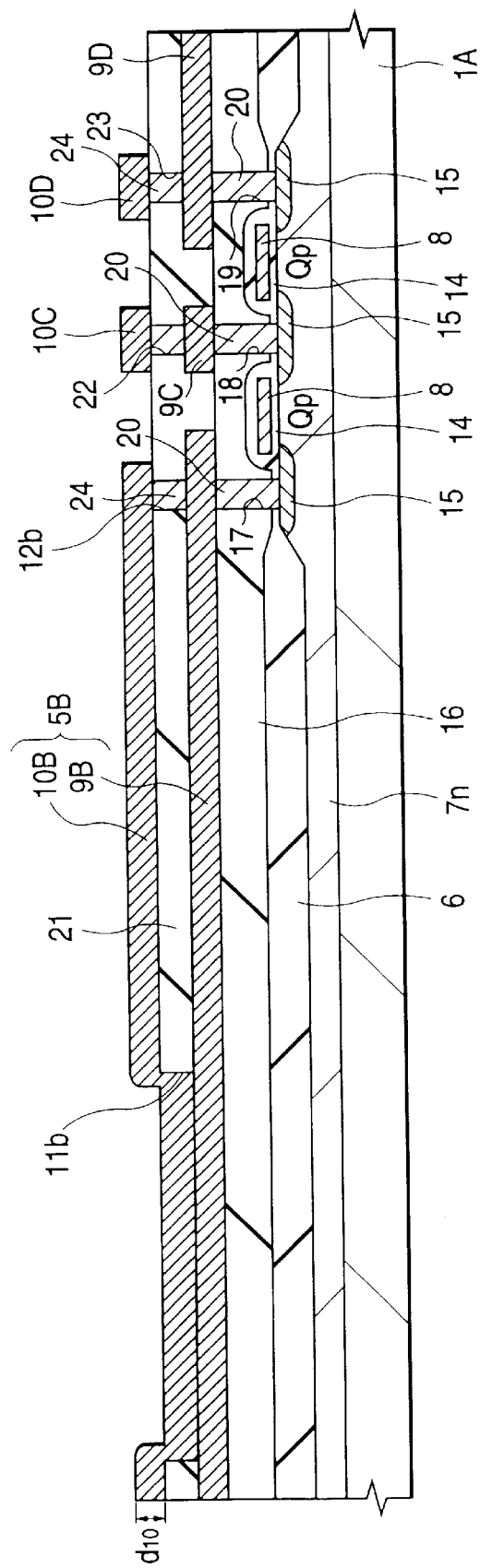
FIG. 15 is a sectional view of an essential portion of the CMOS gate array chip of FIG. 1 of assistance in explaining the method of fabricating the CMOS gate array chip of FIG. 1.

Then, as shown in FIG. 15, the photoresist mask 53 is removed, an Al alloy film is deposited on the first layer insulating film by a sputtering process, and the Al alloy film is patterned to form the wiring lines 10, 10B, 10C and 10D of the second wiring layer. The wiring lines 10, 10B, 10C and 10D of the second wiring layer are about 20 μm in width and have a thickness $d_{10}$ of about 0.5 μm. The wiring line 10B of the second wiring layer and the wiring line 9B of the first wiring layer constitute the connecting lead 5B. The thickness $d_{10}$ of the wiring lines 10, 10B, 10C and 10D of the second wiring layer is smaller than half the diameter of the through hole 11b of a relatively great diameter, i.e., $l_{11}/2>d_{10}$.

The wiring line 10B of the second wiring layer and the wiring line 9B of the first wiring layer constituting the connecting lead 5B are connected electrically through the through hole 12b of a relatively small diameter formed in a portion of the first layer insulating film 21 over the p-channel MISFET Qp, and the through hole 11b of a relatively great diameter formed in a portion of the first layer insulating film 21 corresponding to a region in which the outer bonding pad 4B is formed later. The wiring layers 10 and 10C of the second wiring layer are connected electrically through the through hole 22 of a relatively small diameter formed in the first layer insulating film 21 to the wiring lines 9 and 9C of the first wiring layer, and the wiring lines 10 and 10D of the second wiring layer are connected electrically through the through hole 23 of a relatively small diameter formed in the first layer insulating film 21 to the wiring lines 9 and 9D of the first wiring layer.

Figure 16:
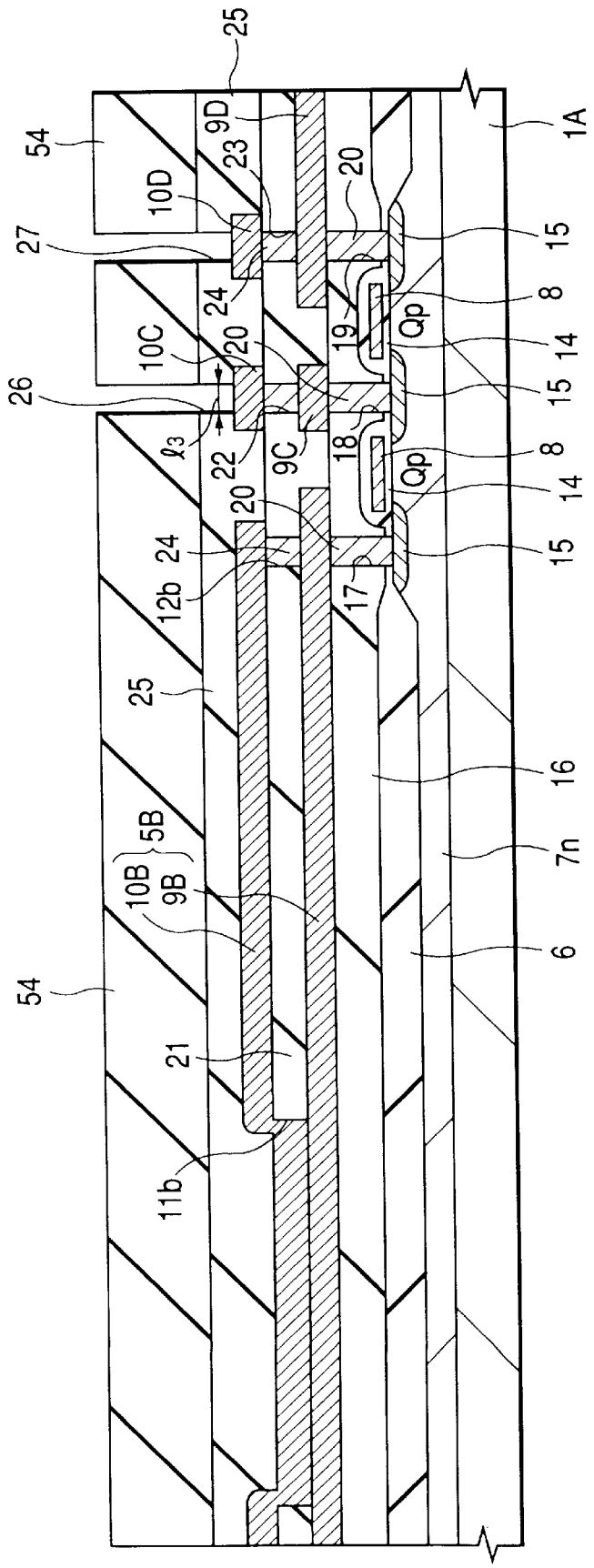
FIG. 16 is a sectional view of an essential portion of the CMOS gate array chip of FIG. 1 of assistance in explaining the method of fabricating the CMOS gate array chip of FIG. 1.

Then, as shown in FIG. 16, a silicon dioxide film is deposited over the wiring lines 10, 10B, 10C and 10D of the second wiring layer by a CVD process to form the second layer insulating film 25, the surface of the second layer insulating film 25 is flattened by a CMP process, and the through holes 26 and 27 are formed in portions of the second layer insulating film 25 corresponding to the wiring lines 10C and 10D, respectively, of the second wiring layer by etching using a photoresist mask 54. The second layer insulating film 25 is about 1 μm in thickness. The through holes 26 and 27 have a substantially square cross section having sides having a length $l_3$ of about 0.4 μm.

Figure 17:
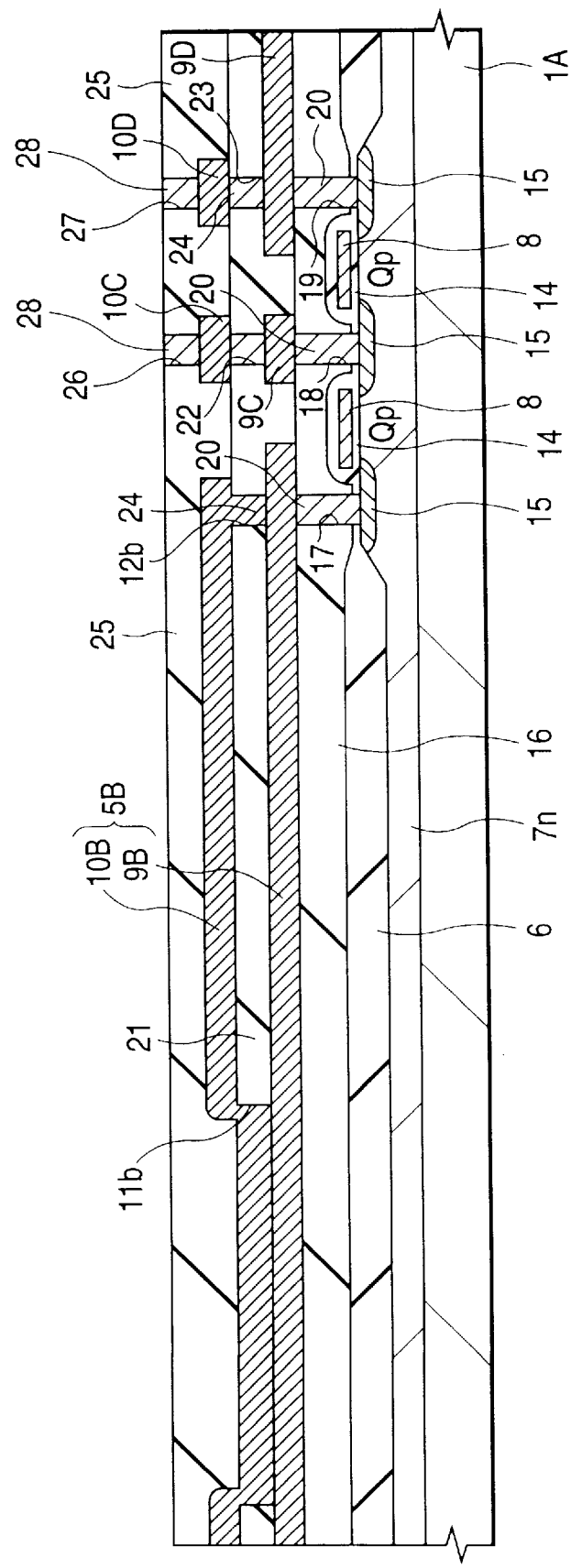
FIG. 17 is a sectional view of an essential portion of the CMOS gate array chip of FIG. 1 of assistance in explaining the method of fabricating the CMOS gate array chip of FIG. 1.
Figure 18:
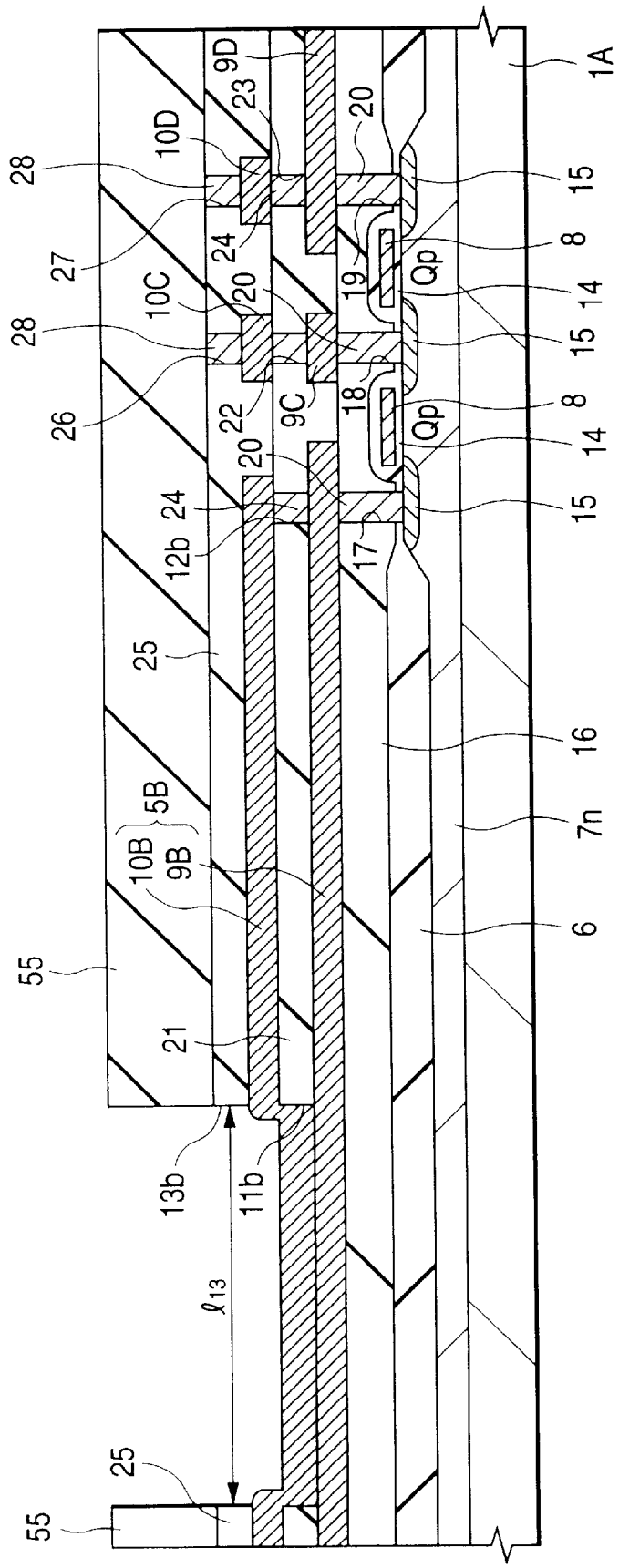
FIG. 18 is a sectional view of an essential portion of the CMOS gate array chip of FIG. 1 of assistance in explaining the method of fabricating the CMOS gate array chip of FIG. 1.
Figure 19:
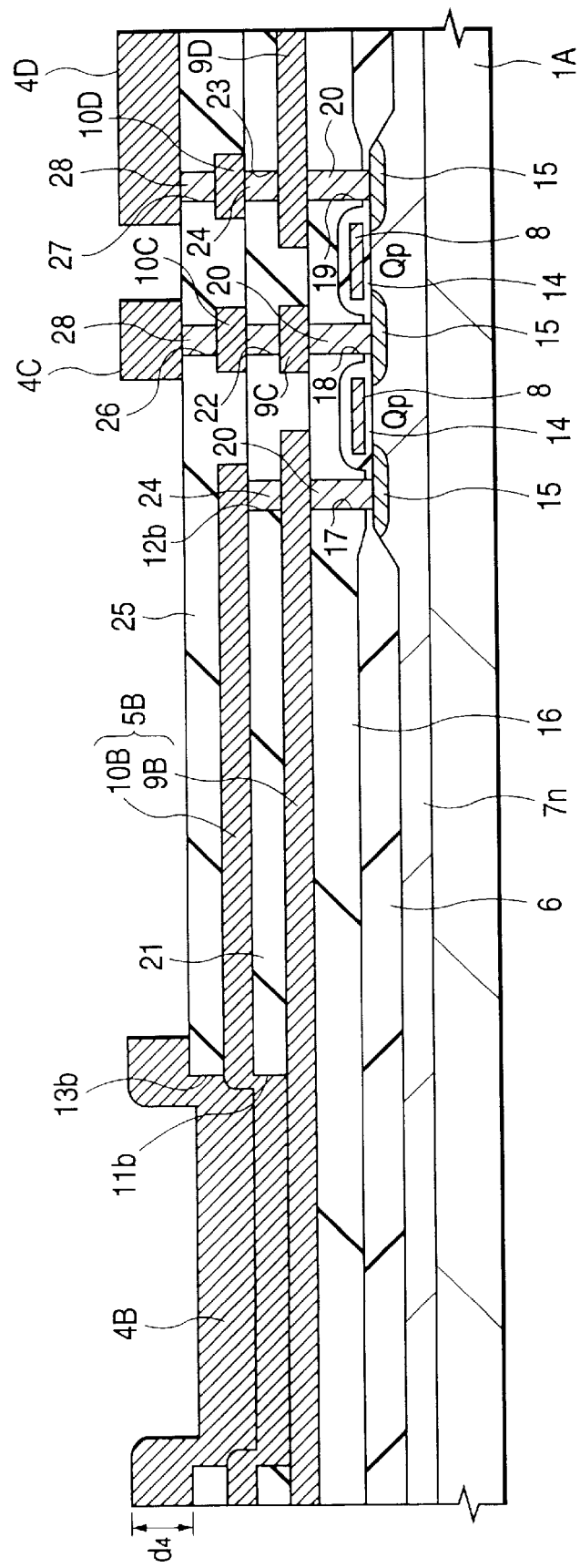
FIG. 19 is a sectional view of an essential portion of the CMOS gate array chip of FIG. 1 of assistance in explaining the method of fabricating the CMOS gate array chip of FIG. 1.

After removing the photoresist mask 54, a W film is deposited over the second layer insulating film 25 by a CVD process in a thickness $d_3 > l_3/2$, and then the W film is etched back to fill up the through holes 26 and 27 with plugs 28 as shown in FIG. 17 by the methods explained with reference to FIGS. 9 and 10. Subsequently, as shown in FIG. 18, a portion of the second layer insulating film 25 corresponding to a region for the outer bonding pad 4B is etched by using a photoresist mask 55 to form the through hole 13b on the through hole 11b. The diameter $l_{13}$ of about 90 μm of the through hole 13b is approximately equal to the diameter $l_{11}$ of the through hole 11b. The diameter $l_{13}(=l_{11})$ of the through hole 13b is greater than the diameter $l_3$ of the through holes 26 and 27, and is greater than twice the thickness $d_3$ of the W film, i.e., $l_{13}/2 > d_3$.

Thus, the through holes 26 and 27 of a relatively small diameter and the through hole 13b of a relatively great diameter are formed in the second layer insulating film 25 by the separate processes, respectively. Therefore optimum etching conditions can be determined on the basis of the diameter of the through hole and, consequently, the through holes 26 and 27 of a relatively small diameter and the through hole 13b of a relatively great diameter can be properly formed and any etch residue of the second layer insulating film 25 will not remain in the through hole 13b of a relatively great diameter.

Since the through hole 13b of a relatively great diameter is formed after filling up the through holes 26 and 27 of a relatively small diameter with the W plugs 28, any etch back residue will not remain on the side wall of the through hole 13b of a relatively great diameter even if etch back depth for etching the W film is determined on the basis of the through holes 26 and 27 of a relatively small diameter.

The photoresist mask 55 is removed, and then an Al alloy film deposited on the second layer insulating film 25 by a sputtering process is patterned to form the outer bonding pad 4B, and the wiring lines 4C and 4C of the third wiring layer. The thickness $d_4$ of the Al alloy film for forming the outer bonding pad 4B and the wiring lines 4C and 4D is about 1 μm. The outer bonding pad 4B is connected electrically through the through hole 13b of a relatively great diameter formed in the second layer insulating film 25 to the connecting lead 5B. The wiring lines 4C and 4D of the third wiring layer are connected electrically through the through holes 26 and 27 of a relatively small diameter formed in the second layer insulating film 25 to the wiring lines 10C and the 10D, respectively, of the second wiring layer. The thickness $d_4$ of the wiring lines 4C and 4D of the third wiring layer is smaller than half the diameter $l_{13}(=l_{11})$ of the through hole 13b of a relatively great diameter, i.e., $l_{13}/2 > d_4$.

Figure 20:
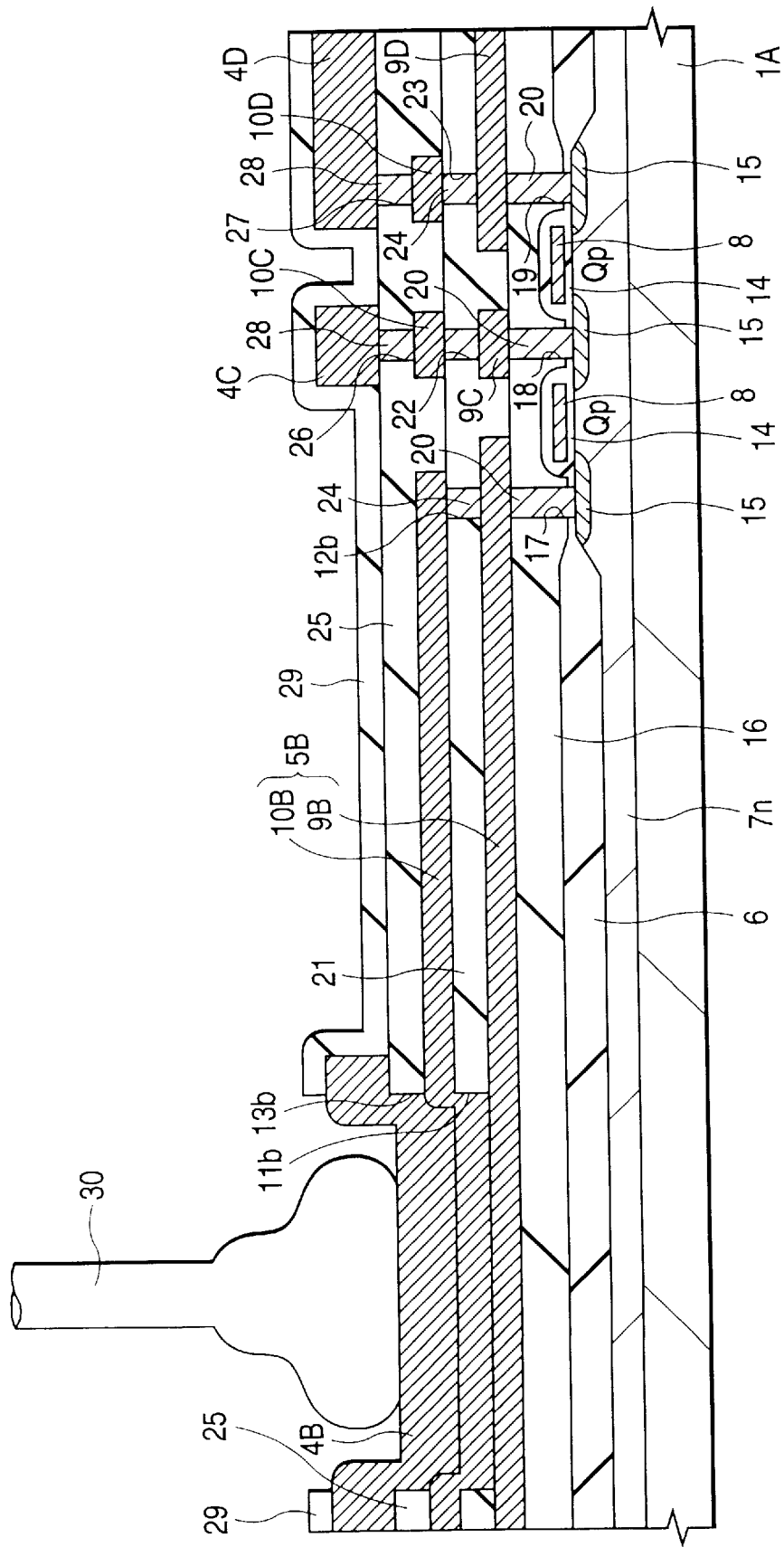
FIG. 20 is a sectional view of an essential portion of the CMOS gate array chip of FIG. 1 of assistance in explaining the method of fabricating the CMOS gate array chip of FIG. 1.

Then, as shown in FIG. 20, a passivation film 29 consisting of a silicon dioxide film and a silicon nitride film is deposited over the outer bonding pad 4B and the wiring lines 4C and 4D of the third wiring layer by, for example, a CVD process, and a portion of the passivation film 29 covering the outer bonding pad 4B is removed by etching to complete the CMOS gate array chip of the present invention. A gold (Au) wire 30 is bonded to the outer bonding pad 4B by a wire bonding process. As shown in FIG. 20, a portion of a large area of the wiring line 10B of the second wiring layer serving as part of the connecting lead 513 is in contact with the outer bonding pad 4B, and a portion of a large area of the wiring line 9B of the first wiring layer serving as another part of the connecting lead 5B is in contact with the lower surface of the wiring line 10B of the second wiring layer. Virtually, the outer bonding pad 4B is a three-layer laminated structure formed by closely laminating the outer bonding pad 4B, the wiring line 10B of the second wiring layer and the wiring line 9B of the first wiring layer, and having a very high strength.

The method of fabricating the semiconductor IC chip 1, i.e., the CMOS gate array chip, in accordance with the present invention forms the through holes of a relatively great diameter and those of a relatively small diameter in the layer insulating film by the separate etching processes, and hence appropriate etching conditions for forming the through holes can be determined taking into consideration the diameter of the through holes and, consequently, both the through holes of a relatively great diameter and those of a relatively small diameter can be properly formed and any etch residue will not remain in a portion of the through holes of a relatively great diameter.

Since the through holes of a relatively great diameter is formed after filling up the through holes of a relatively small diameter with the W plugs, any etch back residue of the W film will not remain on the side wall of the through holes of a relatively great diameter even if etch back depth for etching the W film is determined on the basis of the through holes of a relatively small diameter. Thus, the reliability of the electrical connection of the wiring lines in different wiring layers is improved, and the yield of the CMOS gate array chip fabricating line is improved.

Since the through holes of a relatively great diameter and the through holes of a relatively small diameter are formed by the separate processes, the number of processes and the number of photoresist masks required by the method of the present invention are greater than those required by a method which forms the through holes of a relatively great diameter and the through holes of a relatively small diameter simultaneously. However, increase in the number of photoresist masks can be reduced by using the photoresist mask for both forming the through holes 11b and 13b of a relatively great diameter under the outer bonding pads 4B and removing portions of the passivation film 29 covering the outer bonding pads 4B by etching.

In the logic circuit and the I/O buffer 3, the through holes formed in the same layer insulating film have the same diameter and the same sectional area; that is, the through holes 17, 18 and 19 having the same diameter $l_1$ and the same sectional area are formed in the silicon dioxide film 16, the through holes 22, 23 and 24 having the same diameter $l_2$ and the same sectional area are formed in the first layer insulating film 21, and the through holes 26 and 27 having the same diameter l3 and the same sectional area are formed in the second layer insulating film 25 as shown in FIGS. 6(a) and 6(b). Accordingly, optimum etch back conditions for etching back the W film to fill up the through holes formed in the same layer insulating film with the W plugs can be easily determined.

If the W film is etched back for fill up the through holes respectively having different small diameters (different sectional areas) simultaneously with the W plugs, some of the through holes may not be satisfactorily filled up with the W plug, from which it is inferred that optimum etch back conditions are dependent on the diameter (sectional area) of the through holes.

An essential portion of the semiconductor IC chip 1 in which the inner bonding pads 4A and the connecting leads 5A, i.e., the wiring lines of the third wiring layer, will be described later with reference to FIG. 48. In this portion shown in FIG. 48, the through holes of a relatively great diameter need not be formed, and only the through holes 13a, 26 and 27 of a relatively small diameter $l_3$ and the through holes 12a, 22 and 23 of the relatively small diameter $l_2$ are formed.

Second Embodiment

The foregoing CMOS gate array chip in the first embodiment may be fabricated by the following method.

Figure 21:
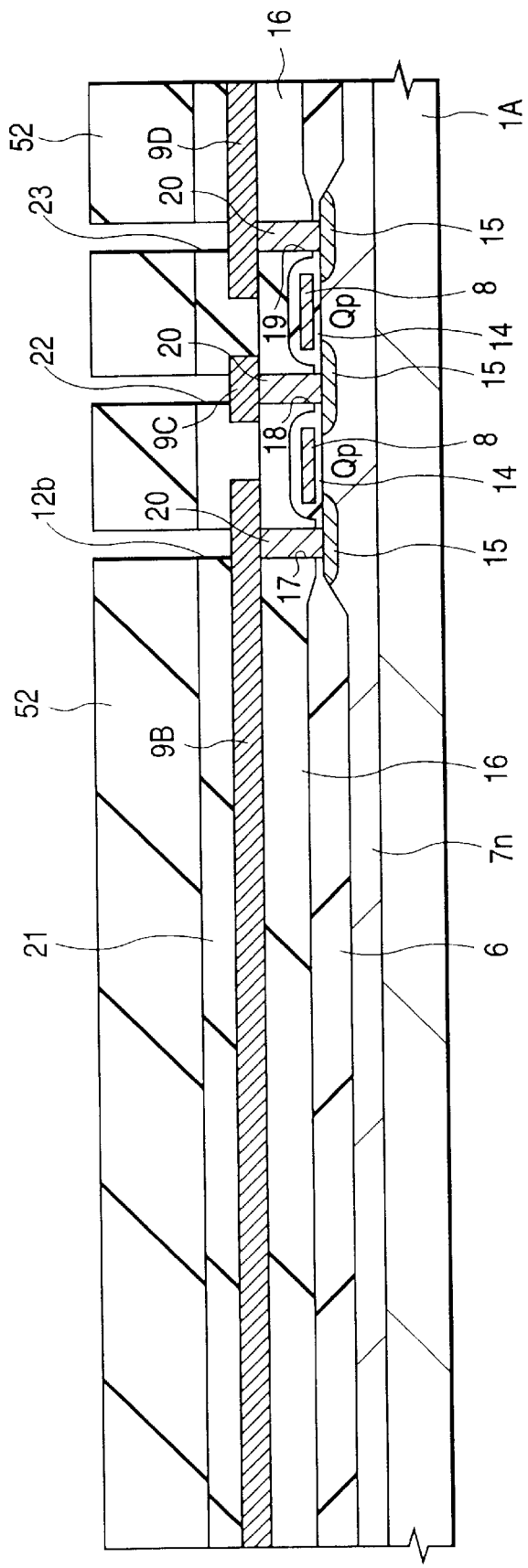
FIG. 21 is a sectional view of an essential portion of a CMOS gate array chip in a second embodiment according to the present invention of assistance in explaining a method of fabricating the CMOS gate array chip in the second embodiment.

Referring to FIG. 21, a silicon dioxide film is deposited on the first wiring layer having the wiring lines 9, 9B, 9C and 9D to form the first layer insulating film 21, the surface of the first layer insulating film 21 is flattened, and portions of the first layer insulating film 21 on the p-channel MISFET Qp are etched by using the photoresist mask 52 to form the through holes 12b, 22 and 23 of a relatively small diameter ($l_2 \approx 0.4\,\mu m$) by the processes described above with reference to FIGS. 7 to 12.

Figure 22:
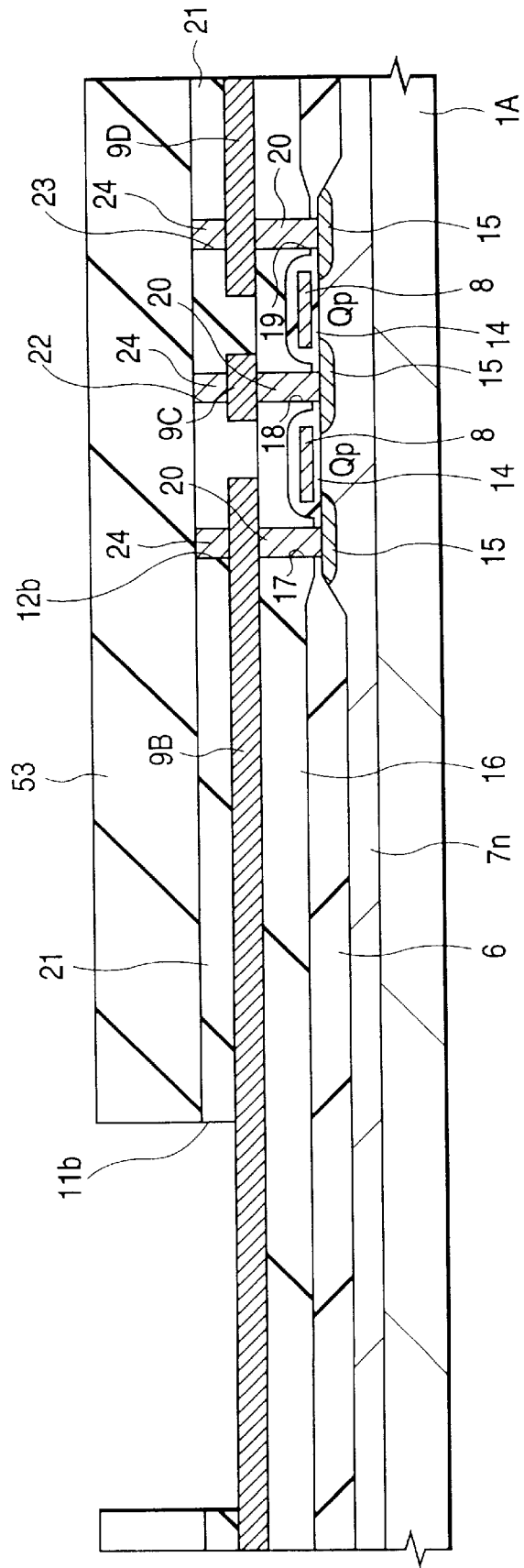
FIG. 22 is a sectional view of an essential portion of the CMOS gate array chip in the second embodiment of assistance in explaining the method of fabricating the CMOS gate array chip in the second embodiment.

Subsequently, the photoresist mask 52 is removed, and then a portion of the first layer insulating film 21 corresponding to a region in which the outer bonding pad 4B is to be formed later is etched by using a photoresist mask 53 to form the through hole 11b of a relatively great diameter ($l_{11} \approx 90\,\mu m$) as shown in FIG. 22. The through holes 12b, 22 and 23 of a relatively small diameter are covered with the photoresist mask 53 during the etching process of forming the through hole 11b.

Then, the photoresist mask 53 is removed and a W film 24A of diameter $d_2(d_2 > l_2/2)$ is deposited over the first layer insulating film 21 by a CVD process as shown in FIG. 23. Then, as shown in FIG. 24, the W film 24A is etched back to fill up the through holes 12b, 22 and 23 of a relatively small diameter with plugs 24. If an etch back depth is optimized for the through holes 12b, 22 and 23 of a relatively small diameter, an etch back residue 24B of the W film 24A remains on the side wall of the through hole 11b of a relatively great diameter. The thickness $d_2$ of the W film 24A and the diameter $l_{11}$ of the through hole 11b meet an inequality: $l_{11}/2 > d_2$.

Figure 25:
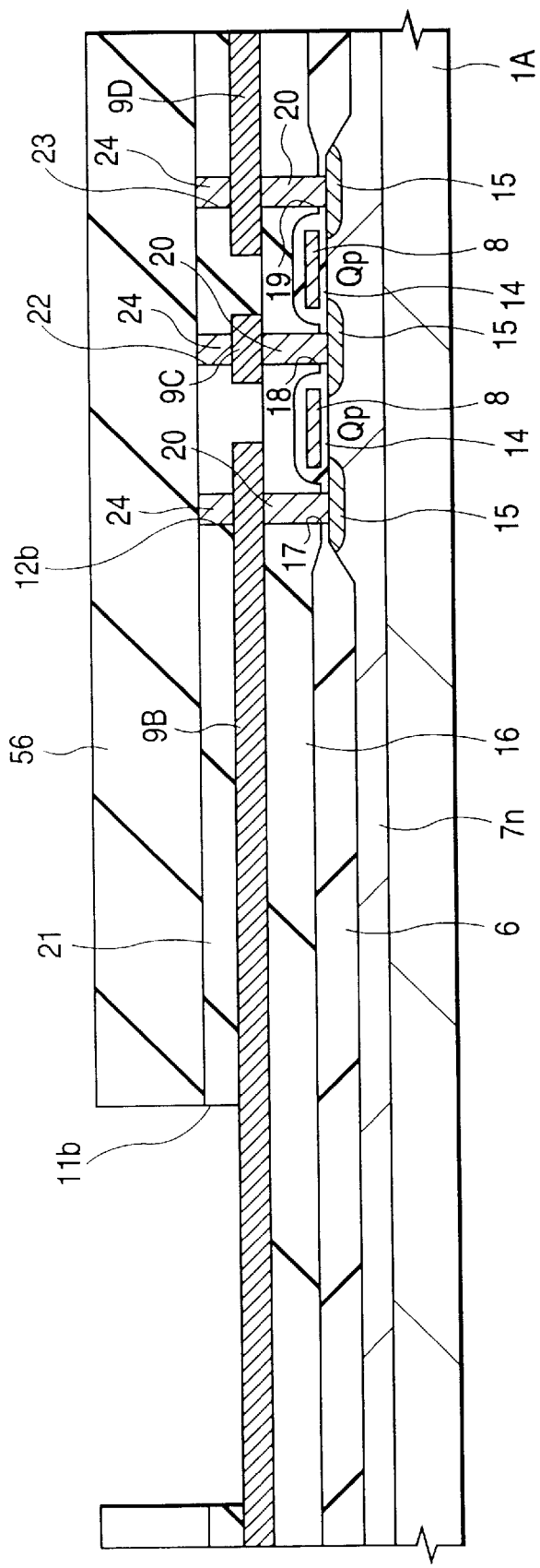
FIG. 25 is a sectional view of an essential portion of the CMOS gate array chip in the second embodiment of assistance in explaining the method of fabricating the CMOS gate array chip in the second embodiment.
Figure 26:
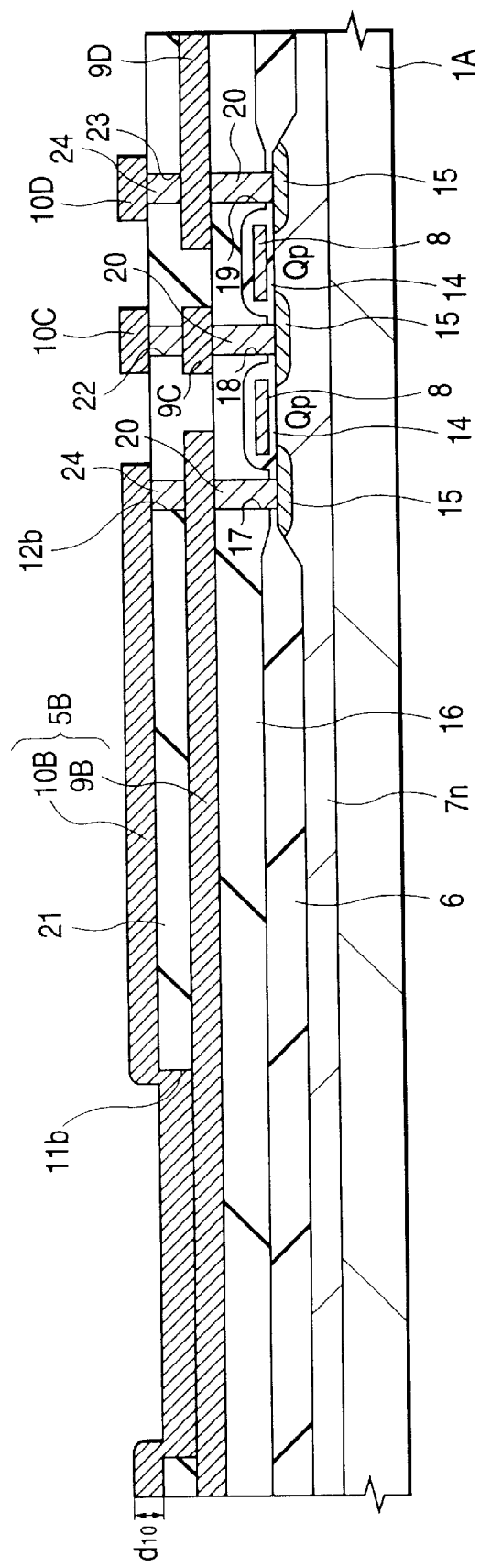
FIG. 26 is a sectional view of an essential portion of the CMOS gate array chip in the second embodiment of assistance in explaining the method of fabricating the CMOS gate array chip in the second embodiment.

Then, as shown in FIG. 25, the etch back residue 24B remaining on the side wall of the through hole 11b is removed by dry or wet etching, during which the through holes 12b, 22 and 23 of a relatively small diameter are covered with a photoresist mask 56. Subsequently, the photoresist mask 56 is removed and, as shown in FIG. 26, an Al alloy film of a thickness $d_{10}(d_{10} < 2l_{11})$ is deposited over the first layer insulating film 21 by a sputtering process, and the Al alloy film is patterned to form the second wiring layer having the wiring lines 10, 10B, 10C and 10D.

Figure 27:
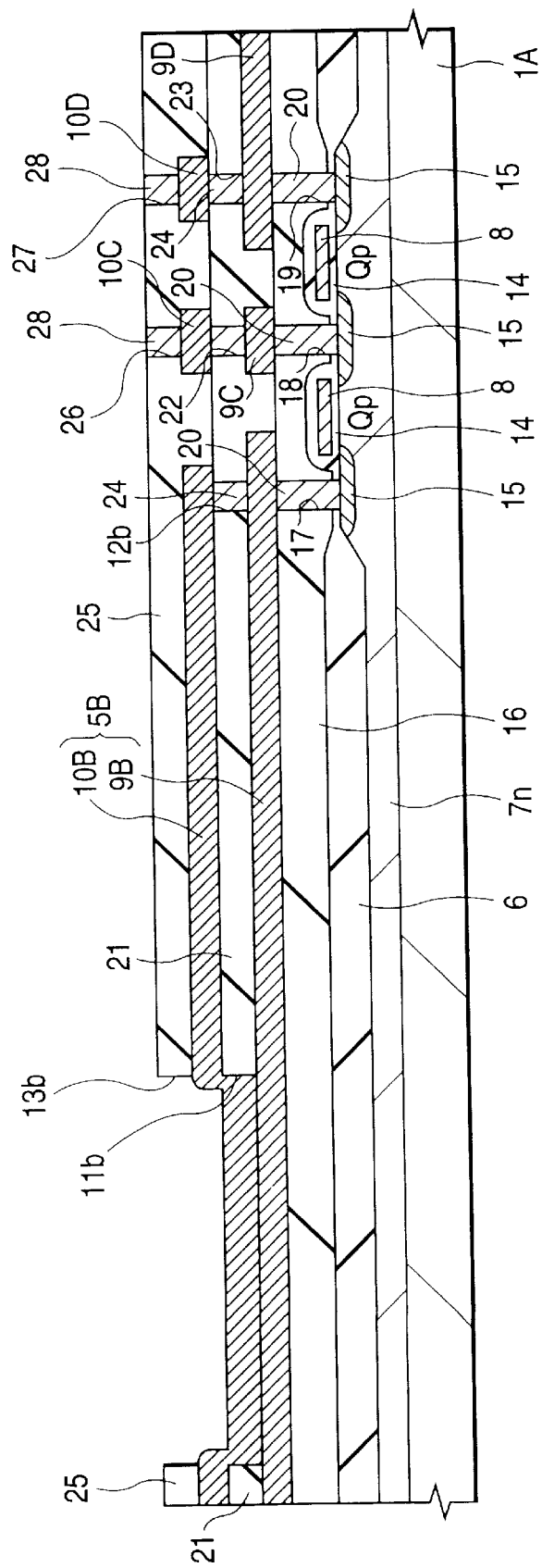
FIG. 27 is a sectional view of an essential portion of the CMOS gate array chip in the second embodiment of assistance in explaining the method of fabricating the CMOS gate array chip in the second embodiment.

Then, as shown in FIG. 27, the processes described above with reference to FIGS. 21 to 25 are carried out to form the through holes 26 and 27 of a relatively small diameter $l_3$ and the through hole 13b of a relatively great diameter $l_{13}(=l_{11})$ sequentially in the second layer insulating film 25 deposited over the second wiring layer, to fill up the through holes 26 and 27 with the W plugs 28, and then the etch back residue remaining on the side wall of the through hole 13b is removed. The rest of the processes are the same as those of the method previously described mainly with reference to FIGS. 7 to 20.

This method of fabricating the semiconductor IC chip 1, i.e., the CMOS gate array chip, forms the through holes of a relatively great diameter and those of a relatively small diameter by the separate etching processes, and hence both the through holes of a relatively great diameter and those of a relatively small diameter can be properly formed.

Figure 28:
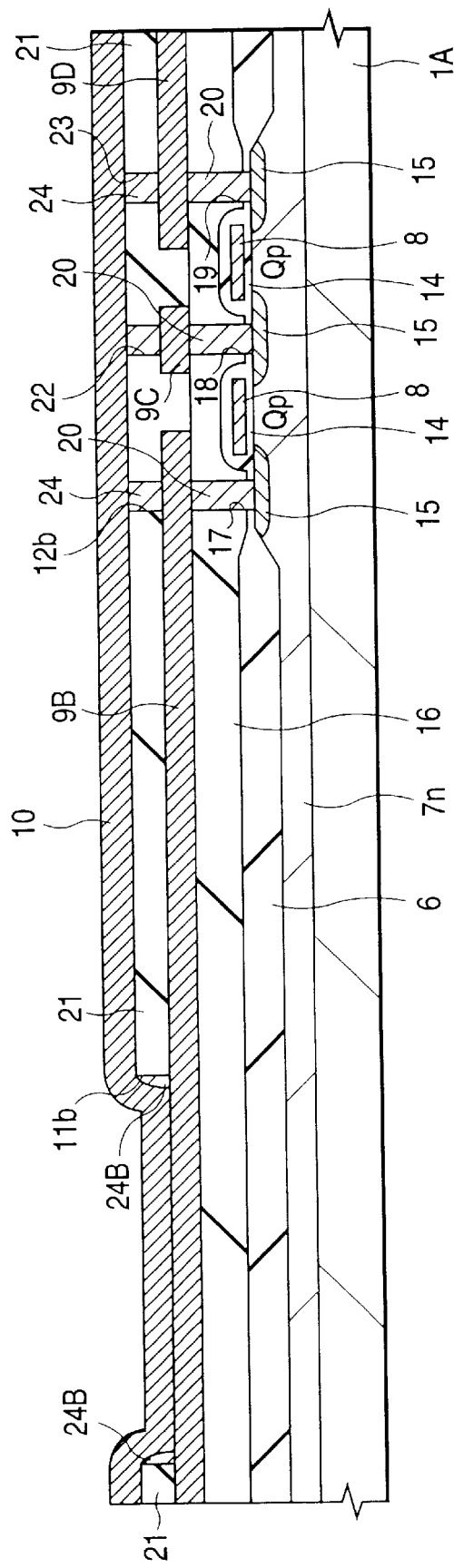
FIG. 28 is a sectional view of an essential portion of the CMOS gate array chip in the second embodiment of assistance in explaining the method of fabricating the CMOS gate array chip in the second embodiment.
Figure 29:
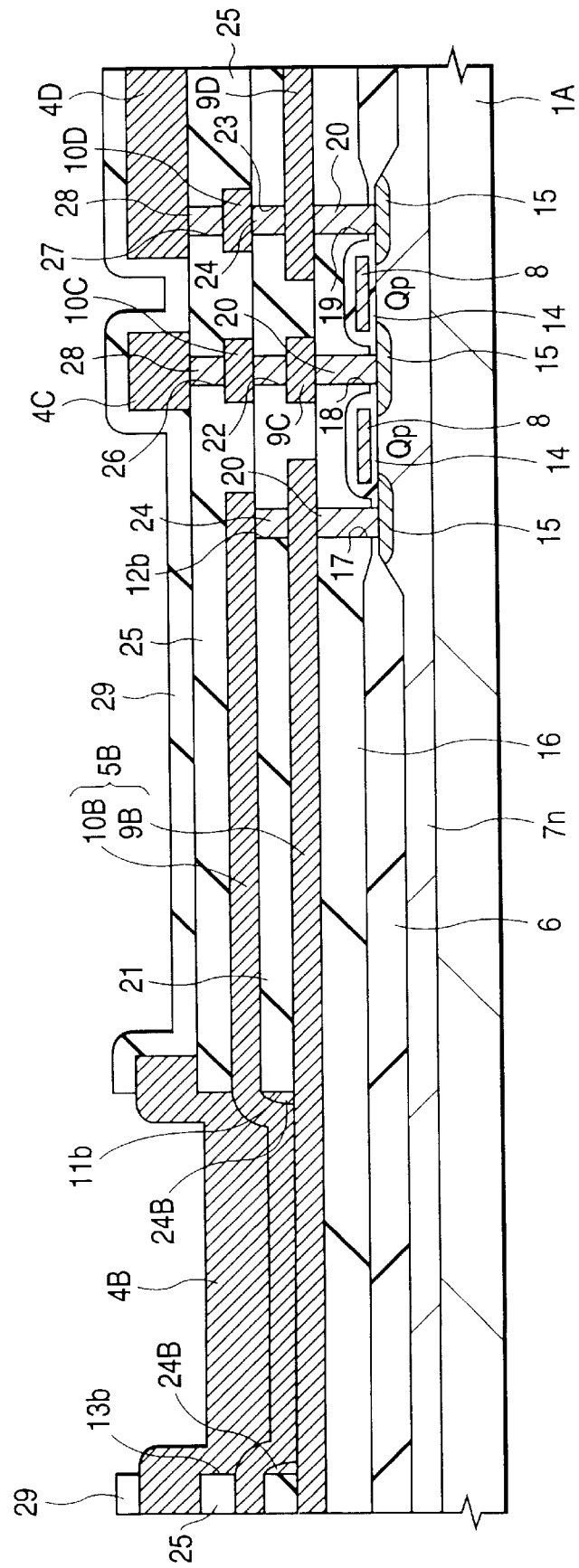
FIG. 29 is a sectional view of an essential portion of the CMOS gate array chip in the second embodiment of assistance in explaining the method of fabricating the CMOS gate array chip in the second embodiment.

If there is no possibility that the etch back residue 24B comes off the side wall of the through hole 11b, the etch back residue 24B is left on the side wall of the through hole 11b unremoved, and the Al alloy film 10 for the second wiring layer is deposited over the first layer insulating film 21 as shown in FIG. 28. If the etch back residue 24B is left on the side wall of the through hole 11b unremoved, the through hole 11b is tapered toward the first wiring layer, whereby the step coverage of a portion of the Al alloy film 10 covering the through hole 11b is improved. Processes similar to those described with reference to FIGS. 21 to 25 are carried out to complete the CMOS gate array chip. An etch back residue may be left on the side wall of the through hole 13b unremoved in a process illustrated in FIG. 29.

Third Embodiment

Figure 30:
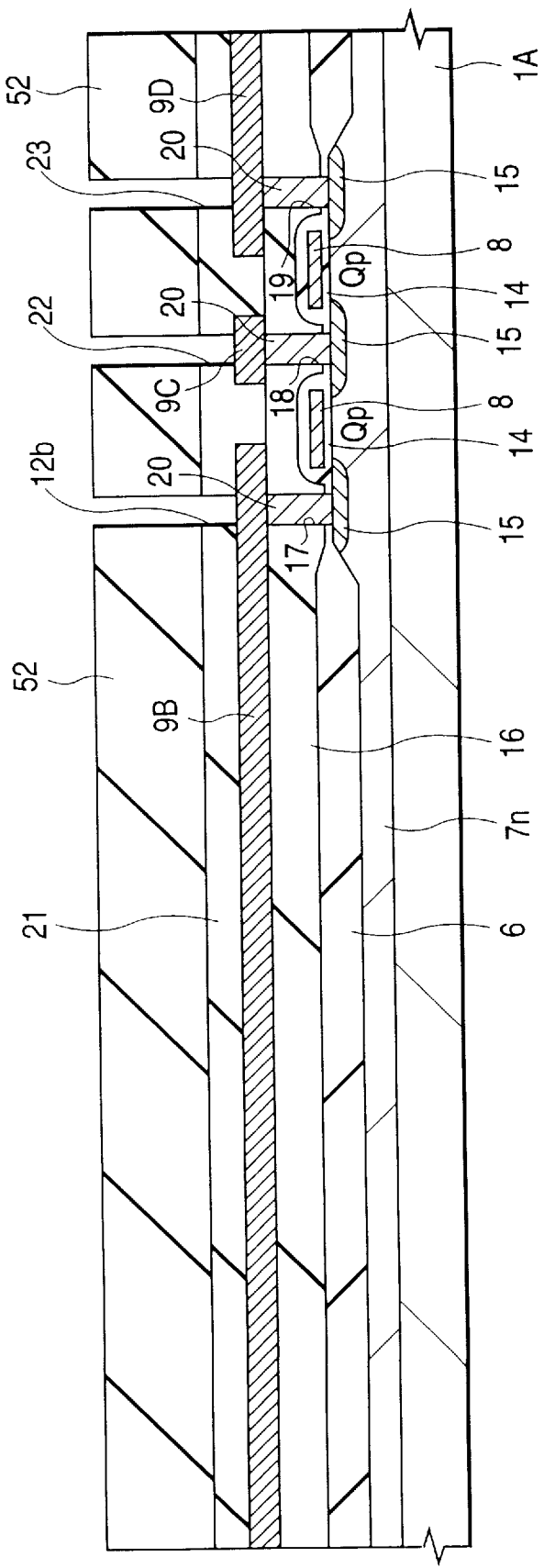
FIG. 30 is a sectional view of an essential portion of a CMOS gate array chip in a third embodiment according to the present invention of assistance in explaining a method of fabricating the CMOS gate array chip in the third embodiment.

A semiconductor IC chip fabricating method in a third embodiment according to the present invention carries out the processes of the foregoing method of fabricating the semiconductor IC chip 1 in the first embodiment to form the first wiring layer having the wiring lines 9, 9B, 9C and 9D, deposits the first layer insulating film 21 of silicon dioxide over the first wiring layer, flattens the surface of the first layer insulating film 21, and etches portions of the first layer insulating film over the p-channel MISFET Qp by using a photoresist mask 52 to form the through holes 12b, 22 and 23 of a relatively small diameter $l_2$ as shown in FIG. 30.

Figure 31:
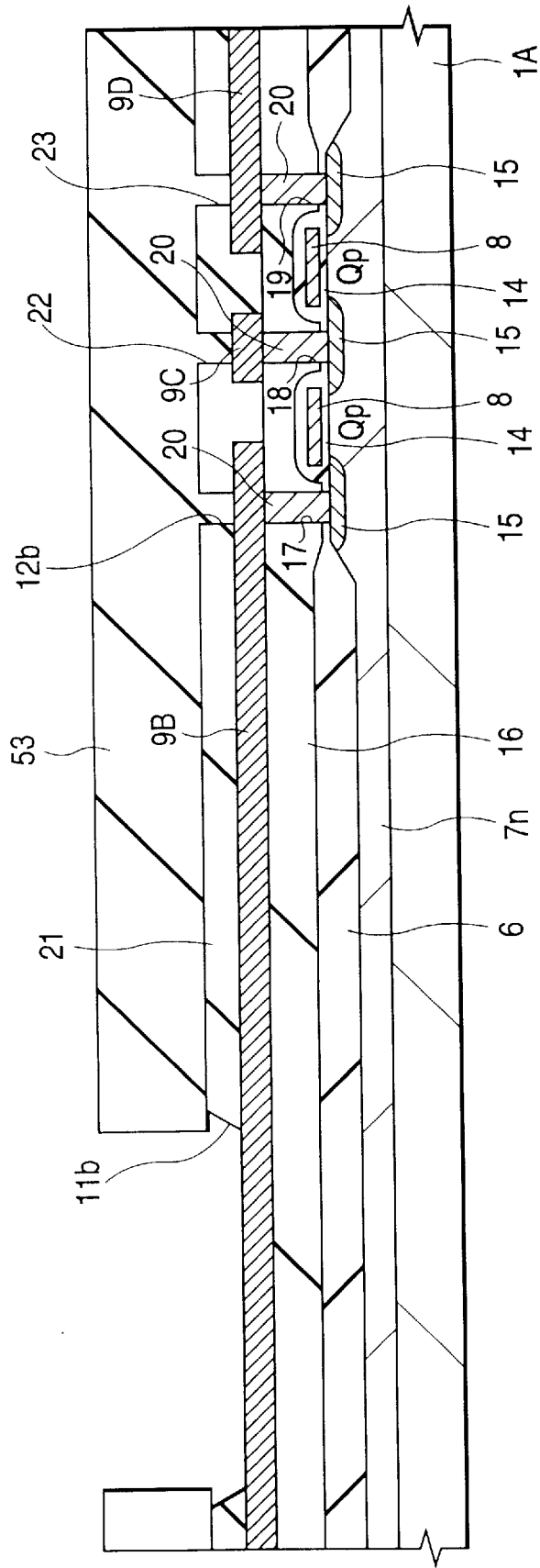
FIG. 31 is a sectional view of an essential portion of the CMOS gate array chip in the third embodiment of assistance in explaining the method of fabricating the CMOS gate array chip in the third embodiment.

The photoresist mask 52 is removed and, as shown in FIG. 31, a portion of the first layer insulating film 21 corresponding to a region for the outer bonding pad 4B is etched by using a photoresist mask 53 to form the through hole 11b of a relatively great diameter $l_{11}$. The first layer insulating film 21 is etched by isotropic wet etching, or isotropic etching and overetching to form the through hole 11b in a tapered shape tapering toward the first wiring layer. During the etching process for forming the through hole 11b, the through holes 12b, 22 and 23 are covered with the photoresist mask 53.

Figure 34:
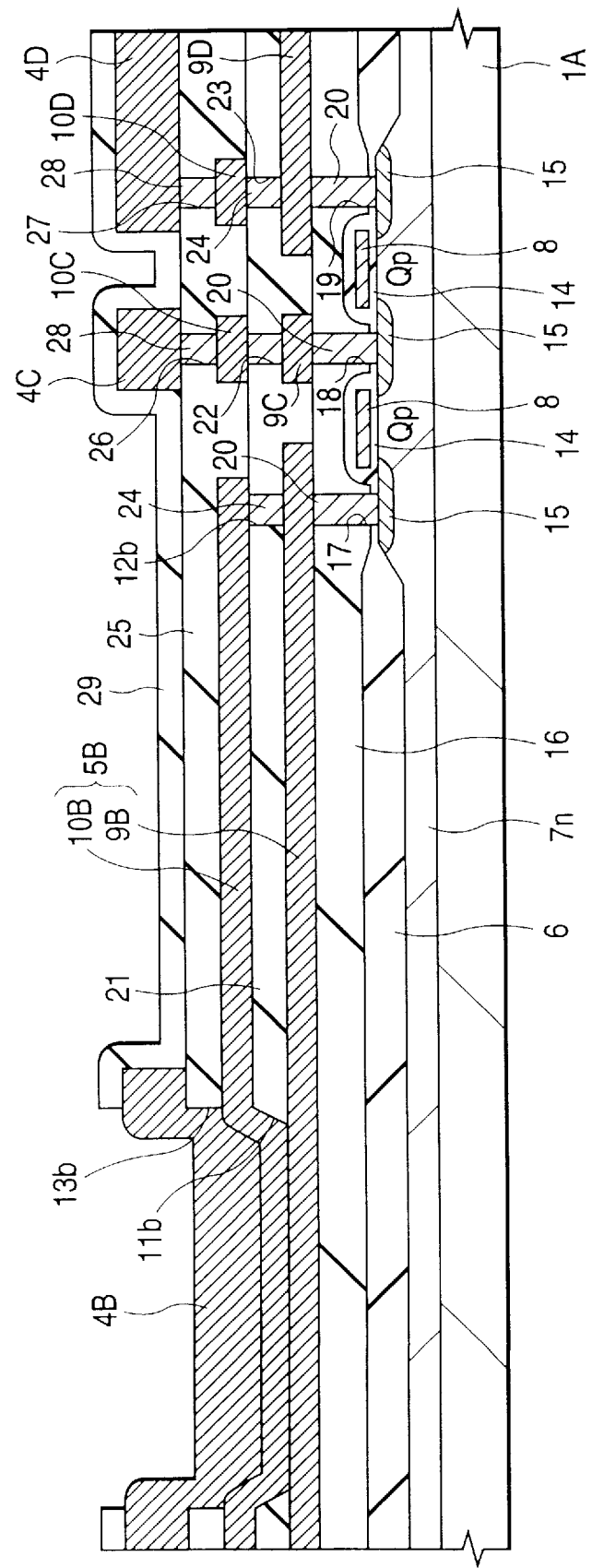
FIG. 34 is a sectional view of an essential portion of the CMOS gate array chip in the third embodiment of assistance in explaining the method of fabricating the CMOS gate array chip in the third embodiment.

The photoresist mask 53 is removed and, as shown in FIG. 32, a W film 24A is deposited in a thickness $d_2(> l_2/2)$ over the first layer insulating film 21 by a CVD process. Subsequently, the W film 24A is etched back to fill up the minute through holes 12b, 22 and 23 with plugs 24 as shown in FIG. 33. Since any etch back residue of the W film 24A does not remain on the side wall of the tapered through hole 11b, any special etch back residue removing process is not necessary. Processes similar to those for fabricating the semiconductor IC chip 1 in the first embodiment are carried out to complete a CMOS gate array chip shown in FIG. 34.

This method of fabricating the semiconductor IC chip 1, i.e., the CMOS gate array chip, forms the through holes of a relatively great diameter and those of a relatively small diameter by the separate etching processes, and hence both the through holes of a relatively great diameter and those of a relatively small diameter can be properly formed. Neither any etch residue of the layer insulating film nor any etch back residue of the W film remains on a portion of the through holes of a relatively great diameter.

Fourth Embodiment

Figure 35:
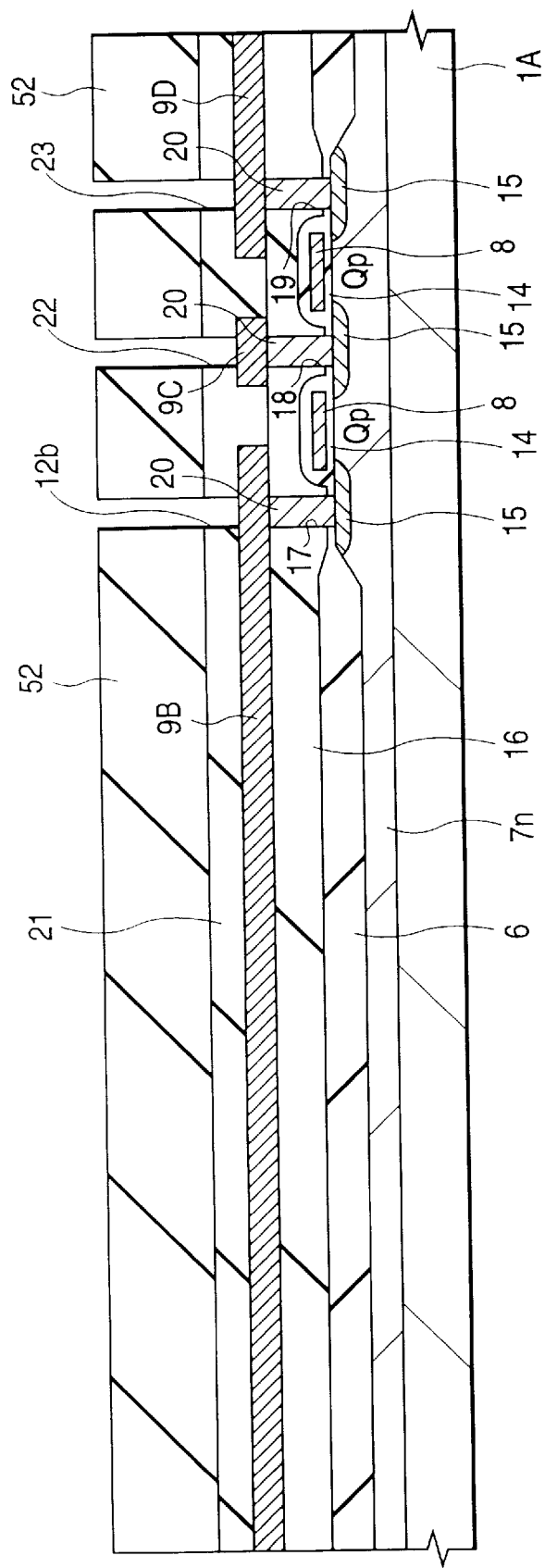
FIG. 35 is a sectional view of an essential portion of a CMOS gate array chip in a fourth embodiment according to the present invention of assistance in explaining a method of fabricating the CMOS gate array chip in the third embodiment.

A semiconductor IC fabricating method in a fourth embodiment according to the present invention carries out the processes of the foregoing method of fabricating the semiconductor IC chip 1 in the first embodiment to form the first wiring layer having the wiring lines 9, 9B, 9C and 9D, deposits the first layer insulating film 21 over the first wiring layer, flattens the surface of the first layer insulating film 21, and etches portions of the first layer insulating film over the p-channel MISFET Qp by using a photoresist mask 52 to form the through holes 12b, 22 and 23 of a relatively small diameter $l_2$ as shown in FIG. 35.

Figure 36:
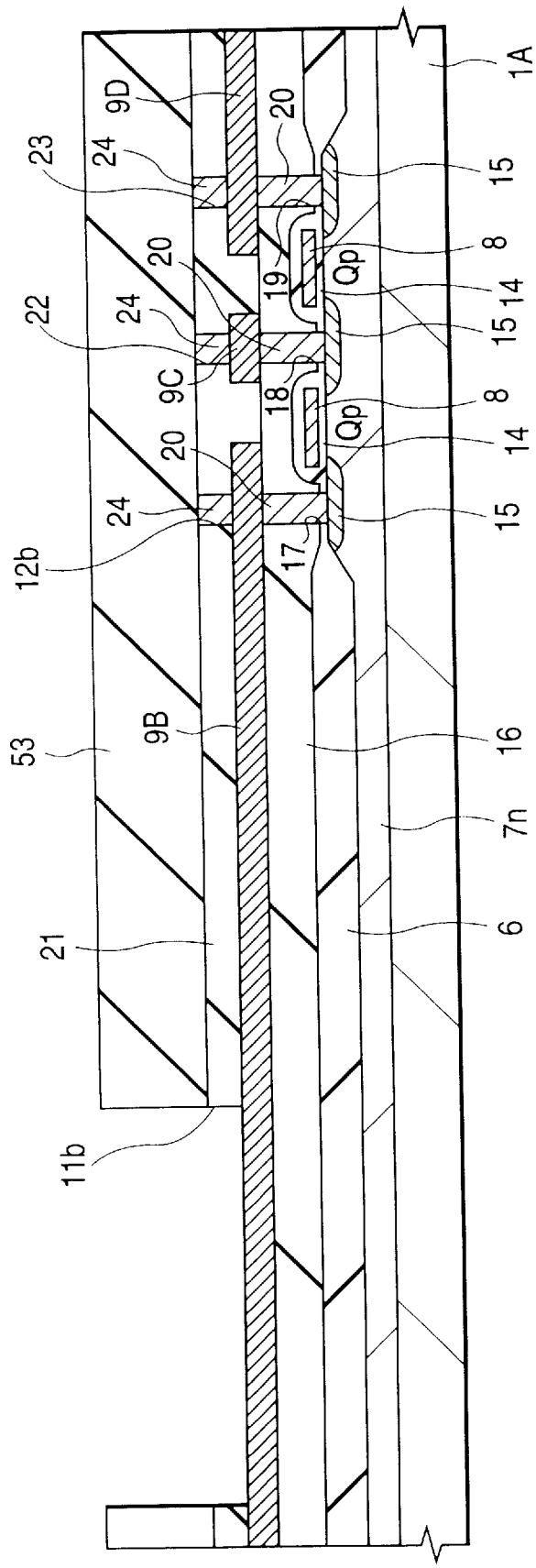
FIG. 36 is a sectional view of an essential portion of the CMOS gate array chip in the fourth embodiment of assistance in explaining the method of fabricating the CMOS gate array chip in the fourth embodiment.

The photoresist mask 52 is removed and, as shown in FIG. 36, a portion of the first layer insulating film 21 corresponding to a region for the outer bonding pad 4B is etched by using a photoresist mask 53 to form the through hole 11b of a relatively great diameter $l_{11}$. During the etching process for forming the through hole 11b, the through holes 12b, 22 and 23 are covered with the photoresist mask 53.

Figure 37:
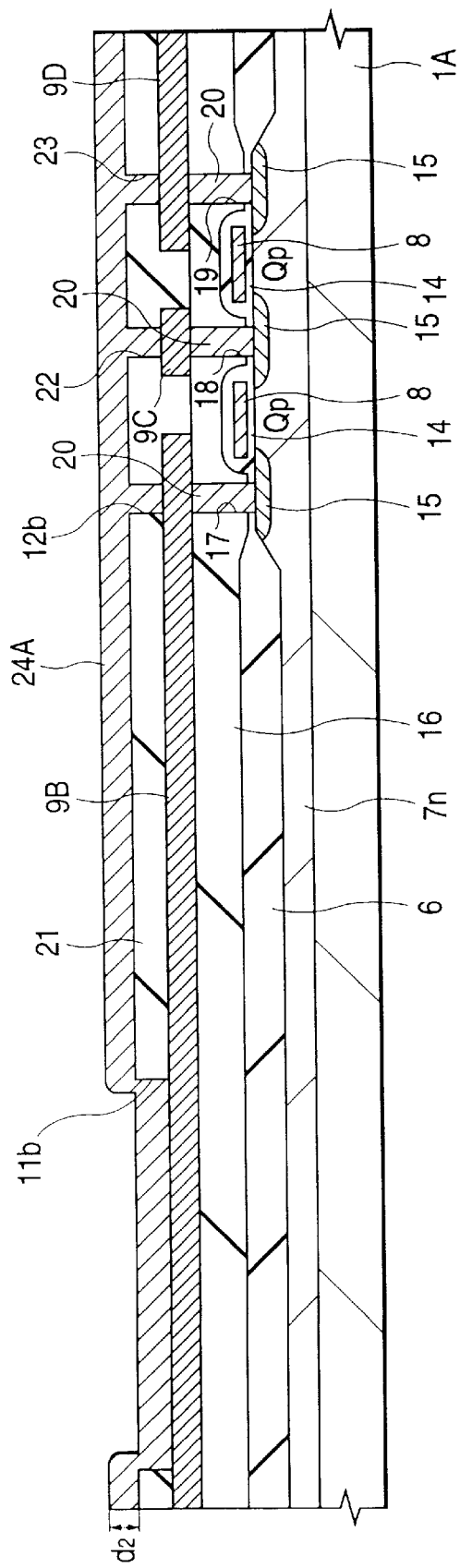
FIG. 37 is a sectional view of an essential portion of the CMOS gate array chip in the fourth embodiment of assistance in explaining the method of fabricating the CMOS gate array chip in the fourth embodiment.
Figure 38:
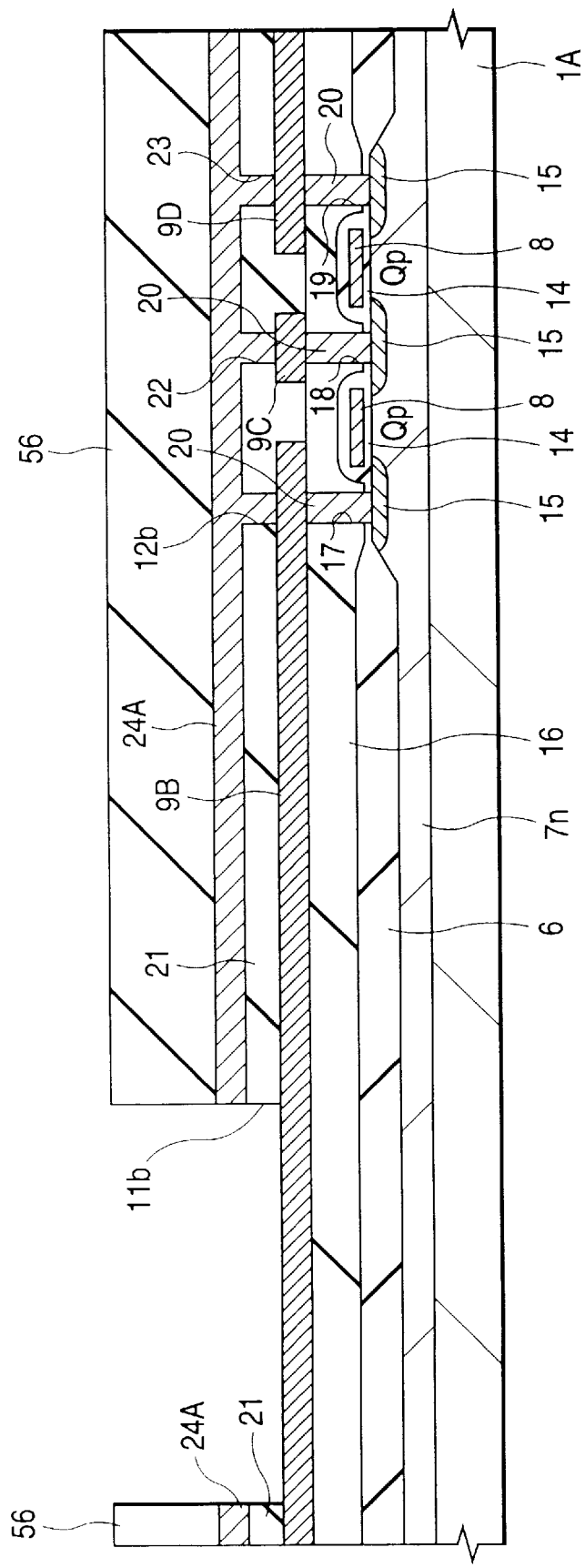
FIG. 38 is a sectional view of an essential portion of the CMOS gate array chip in the fourth embodiment of assistance in explaining the method of fabricating the CMOS gate array chip in the fourth embodiment.

Then, as shown in FIG. 37, a W film 24A is deposited in a thickness $d_2(>l_2/2)$ over the first layer insulating film 21 by a CVD process. Subsequently, a portion of the W film 24A corresponding to the through hole 11b of a relatively great diameter is removed by etching using a photoresist mask 56 having an opening corresponding to the through hole 11b to expose a portion of the wiring line 9B corresponding to the through hole 11b as shown in FIG. 38.

Figure 39:
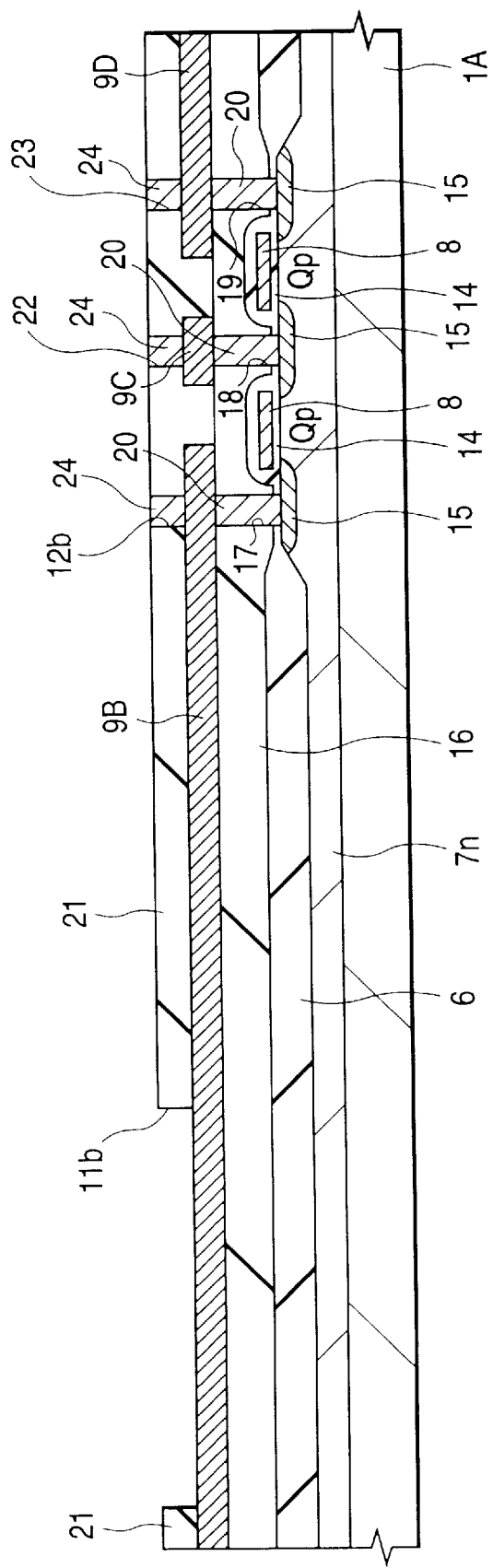
FIG. 39 is a sectional view of an essential portion of the CMOS gate array chip in the fourth embodiment of assistance in explaining the method of fabricating the CMOS gate array chip in the fourth embodiment.
Figure 40:
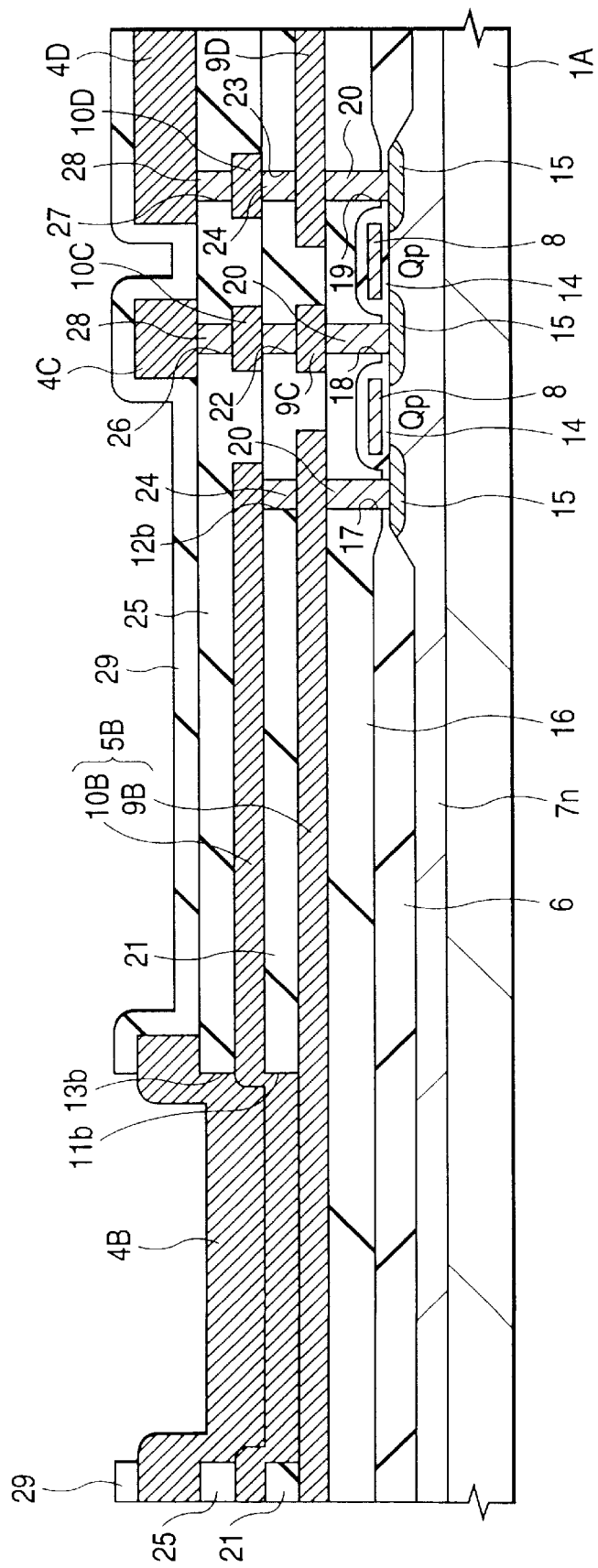
FIG. 40 is a sectional view of an essential portion of the CMOS gate array chip in the fourth embodiment of assistance in explaining the method of fabricating the CMOS gate array chip in the fourth embodiment.
Figure 41A:
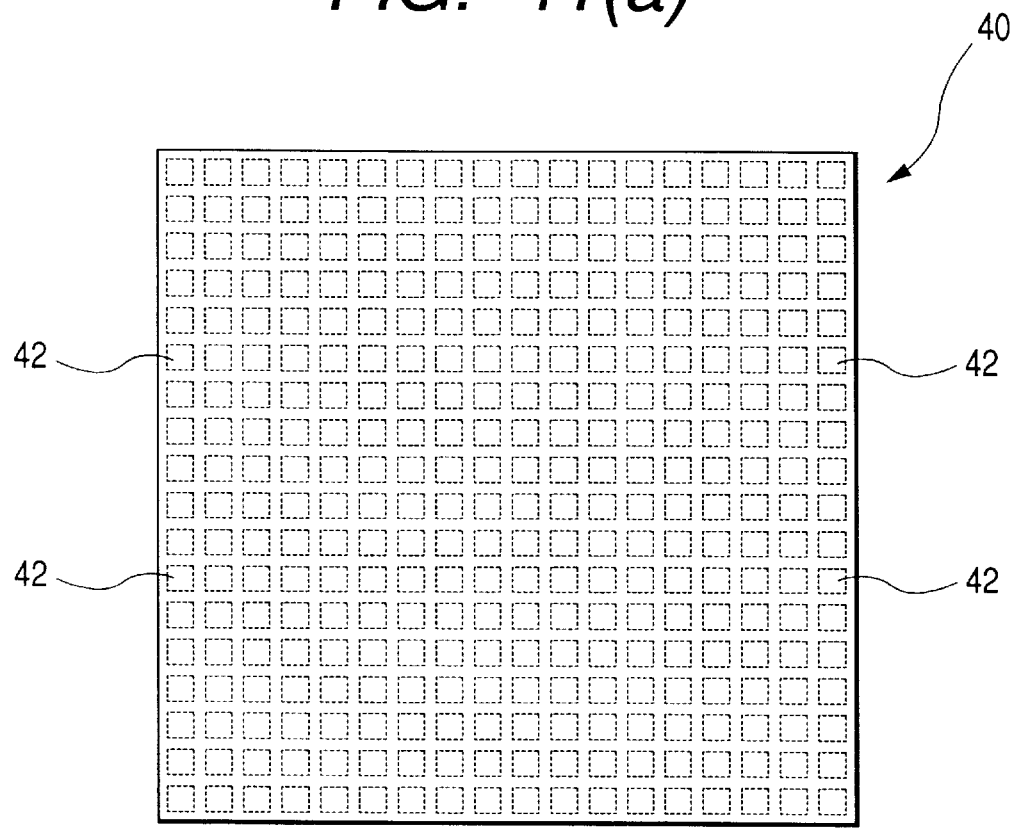
FIGS. 41(a) and 41(b) are a plan view and a sectional view, respectively, of a first through hole structure for connecting a bonding pad to a connecting lead, examined by the inventors of the present invention.
Figure 41B:
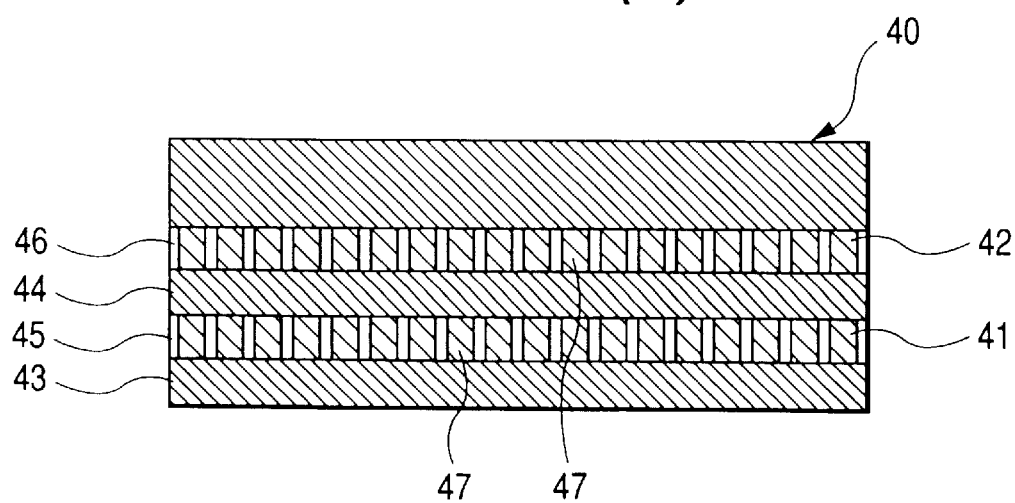
Figure 42A:
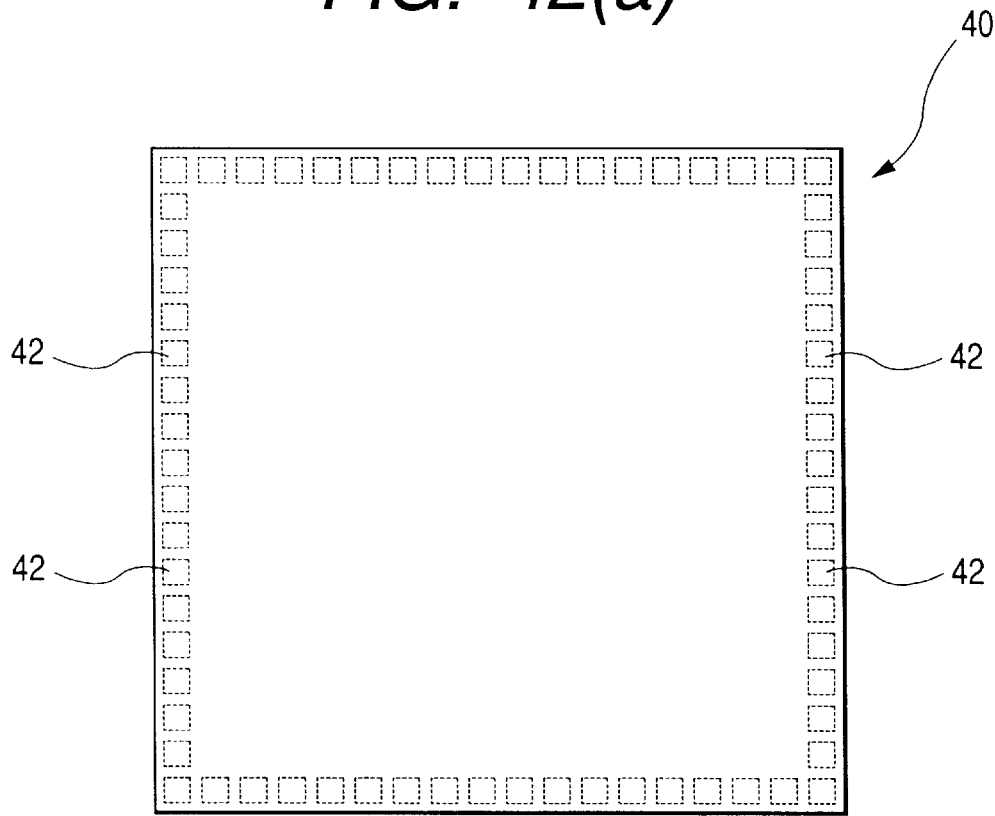
FIGS. 42(a) and 42(b) are a plan view and a sectional view, respectively, of a second through hole structure for connecting a bonding pad to a connecting lead, examined by the inventors of the present invention.
Figure 42B:
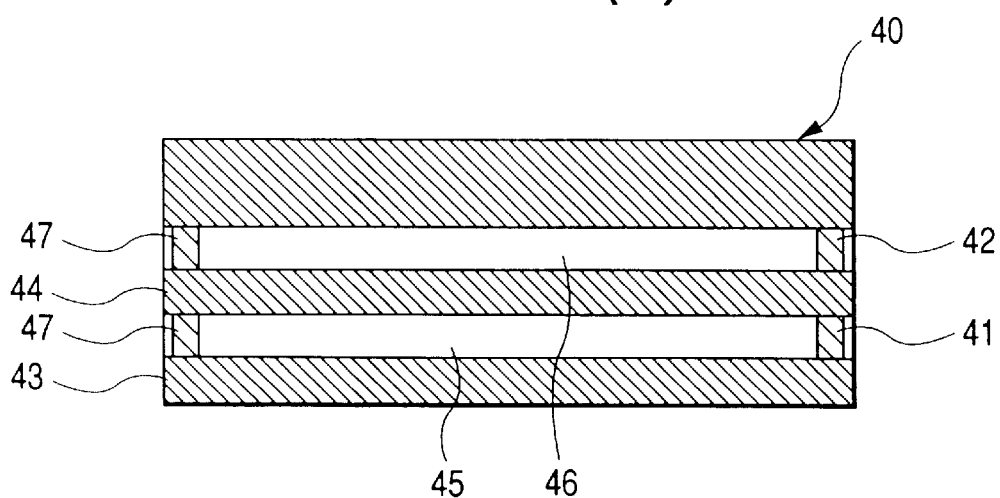
Figure 43:
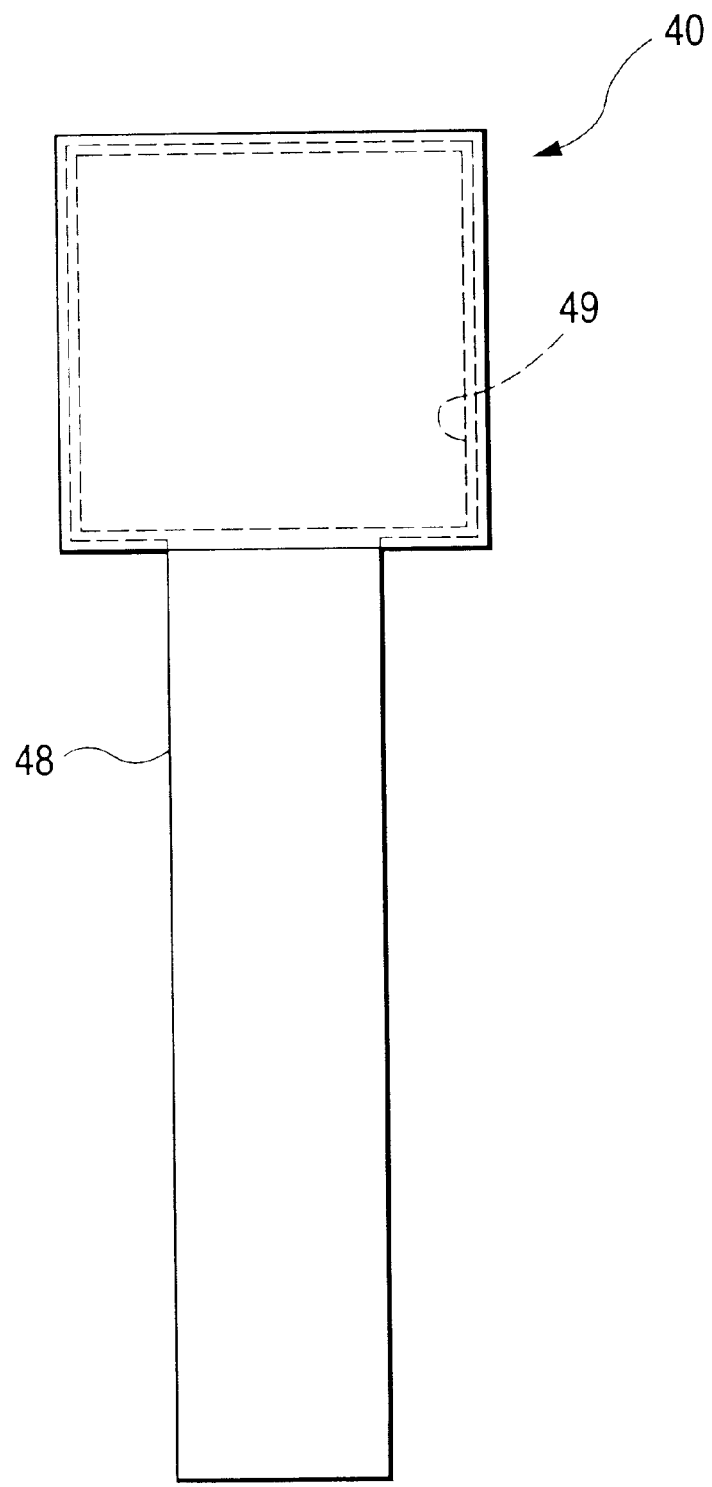
FIG. 43 is a plan view of a third through hole structure for connecting a bonding pad to a connecting lead, examined by the inventors of the present invention.
Figure 44:
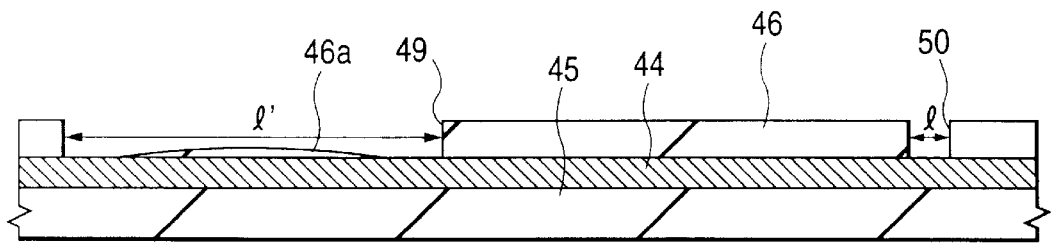
FIG. 44 is a sectional view of a through hole structure for connecting a bonding pad to a connecting lead, examined by the inventors of the present invention in one step of a semiconductor IC chip fabricating method.
Figure 45:
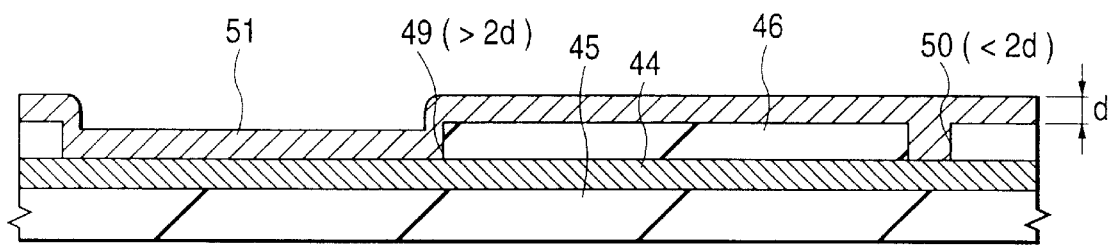
FIG. 45 is a sectional view of the through hole structure of FIG. 44 in another step of the semiconductor IC chip fabricating method.
Figure 46:
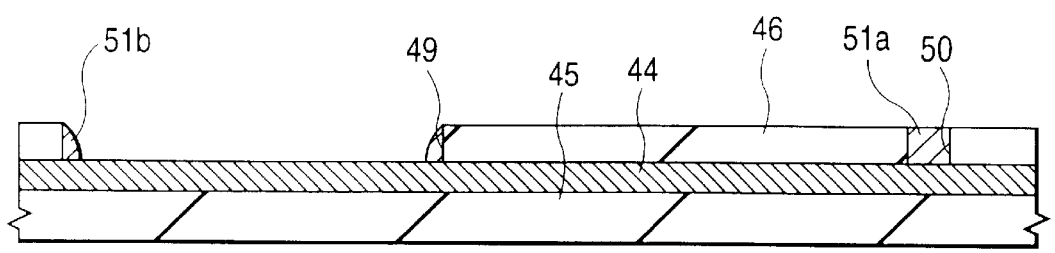
FIG. 46 is a sectional view of the through hole structure of FIG. 44 in a third step of the semiconductor IC chip fabricating method.
Figure 47:
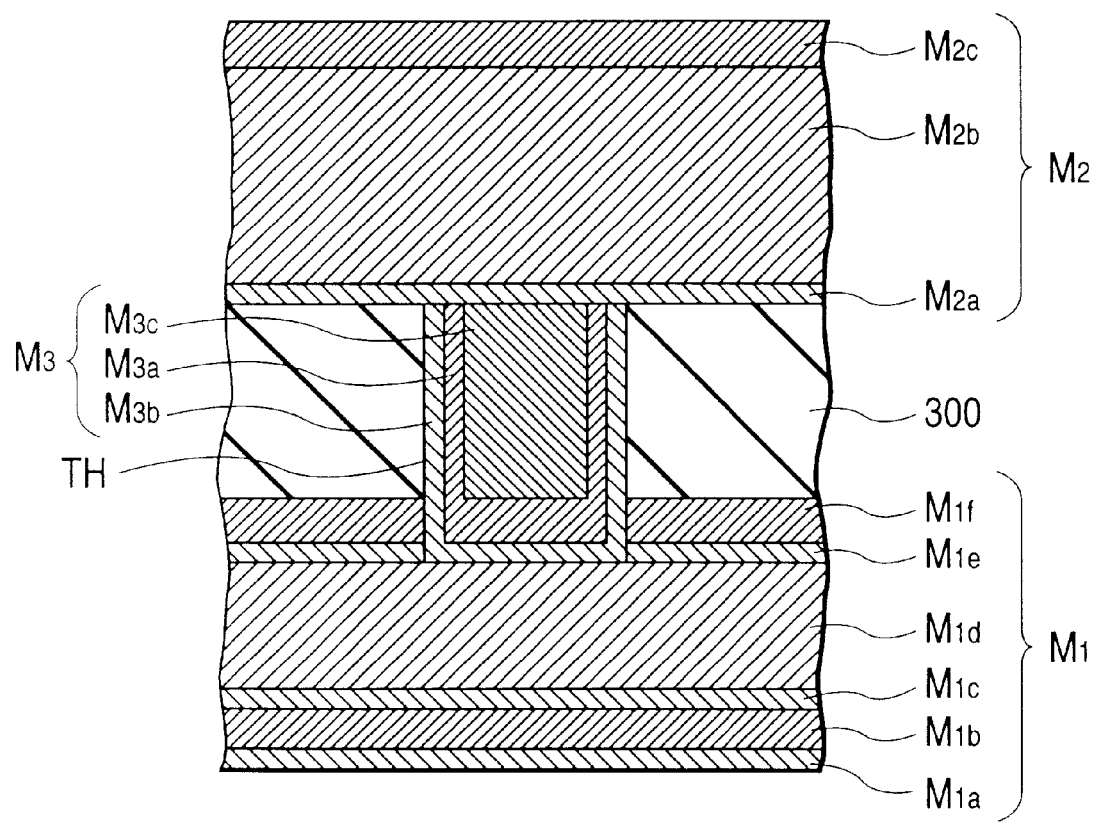
FIG. 47 is a sectional view of a structure around a through hole for connecting wiring lines, included in a semiconductor IC chip in a fifth embodiment according to the present invention.

The photoresist mask 56 is removed, and then, the W film 24A remaining over the first layer insulating film 21 is etched back to fill up the minute through holes 12b, 22 and 23 with plugs 24 as shown in FIG. 39. Since any etch back residue of the W film 24A does not remain on the side wall of the through hole 11b of a relatively great diameter, because the portion of the W film 24A corresponding to the through hole 11b has been previously removed. Processes similar to those for fabricating the semiconductor IC chip 1 in the first embodiment are carried out to complete a CMOS gate array chip shown in FIG. 40.

This method of fabricating the semiconductor IC chip 1, i.e., the CMOS gate array chip, forms the through holes of a relatively great diameter and those of a relatively small diameter by the separate etching processes, and hence both the through holes of a relatively great diameter and those of a relatively small diameter can be properly formed. Neither any etch residue of the layer insulating film nor any etch back residue of the W film remains on a portion of the through holes of a relatively great diameter.

Although the preferred embodiments of the present invention have been described, the present invention is not limited in its practical application to those embodiments specifically described herein and many changes and variations may be made therein without departing from the scope and spirit of the invention.

Although the invention has been described as applied to the three-layer CMOS gate array chip, naturally, the present invention is applicable to a gate array chip of a multilayer structure having four or more than four layers, and provided with outer and inner connecting leads connected to inner bonding pads and outer bonding pads and formed in separate layers, respectively. The present invention is applicable to IC chips for special purposes including embedded array chips and cell base IC chips other than gate array chips.

In the foregoing embodiments, the through holes of a relatively great diameter are formed in a portion of the layer insulating film underlying the bonding pads, and the through holes of a relatively small diameter are formed in a portion of the layer insulating film underlying the internal circuit. Both the through holes of a relatively great diameter and those of a relatively small diameter may be formed in a portion of the layer insulating film corresponding to the internal circuit.

If three or more kinds of through holes are to be formed in a portion of the layer insulating film corresponding to the internal circuit, those through holes can be properly formed by forming the small through holes, i.e., the through holes of a diameter smaller than twice the thickness of the plug forming conductive film, and the large through holes, i.e., the through holes of a relatively great diameter greater than twice the thickness of the plug forming conductive film, by separate processes, respectively.

The through holes may be filled up with the plugs by a selective W-CVD process instead of by etching back the W film deposited by a CVD process.

The first, the second and the third wiring layer may be a laminated film consisting of an Al alloy film and a barrier film. The plug electrode need not necessarily be the W plug, but may be a laminated structure. For example, a wiring line $M_1$ in a lower wiring layer is a laminated film formed by sequentially laminating a Ti film $M_{1a}$ as a bottom film, a TiN film $M_{1b}$, a Ti film $M_{1c}$, an Al—Si—Cu film $M_{1d}$, a Ti film $M_{1e}$ and a TiN film $M_{1f}$ as a top film in that order.

A wiring line $M_2$ in an upper wiring layer is a laminated film formed by sequentially laminating a Ti film $M_{2a}$ as a bottom film, an Al—Si—Cu film $M_{2b}$ and a TiN film $M_{2c}$ as a top film in that order. A through hole TH is formed in a layer insulating film 300, and the through hole TH is filled up with a plug electrode $M_3$. The plug electrode $M_3$ is a laminated structure formed by laminating a Ti film $M_{3a}$ as a bottom film, a TiN film $M_{3b}$ and a W film $M_{3c}$ as a top film in that order. The plug electrode $M_3$ filling up the through hole TH, similarly to those of the first to the fourth embodiment, is formed by etching back a laminated structure formed by depositing a Ti film, a TiN film and a W film. The wiring lines of such laminated structure have an improved electromigration resistance and improved reliability.

As shown in FIG. 48, in the first to the fourth embodiment, the inner bonding pads 4A are formed integrally with the connecting leads 5A in the third wiring layer. The connecting lead 5A is connected electrically to the wiring line 10A of the second wiring layer by the W plug 28 filling up the through hole 13a, and the wiring line 10A of the second wiring layer is connected electrically to the wiring line 9A of the first wiring layer by the W plug 24 filling up the through hole 12a. The wiring line 9A of the first wiring layer is connected electrically to the p-type region 15 of the p-channel MISFET Qp by the W plug 20 filling up the through hole 17. The diameter $l_3$ of the through hole 13a is equal to the diameter $l_3$ of the through holes 26 and 27, and the through holes 13a, 26 and 27 have equal sectional areas. The diameter $l_2$ of the through hole 12a is equal to the diameter $l_2$ of the through holes 12b, 22 and 23, and the through holes 12a, 12b, 22 and 23 have equal sectional areas.

The present invention is summarized as follows.

(1) As described previously in connection with the first to the fourth embodiment, a method of fabricating a semiconductor IC device according to the present invention comprises the steps of:

(a) forming a first wiring layer having wiring lines on a semiconductor substrate, (b) forming a layer insulating film over the first wiring layer, (c) forming first through holes of a relatively small diameter in a first region of the layer insulating film by etching, (d) forming second through holes of a relatively great diameter in a second region of the layer insulating film by etching, and (e) forming a second wiring layer having wiring lines by depositing a conductive film over the layer insulating film and patterning the conductive film.

As described previously in connection with the third embodiment, a semiconductor IC chip fabricating method according to the present invention forms the second through holes in a tapered shape tapering toward the underlying layer.

The semiconductor IC chip fabricating method according to the present invention forms the first through holes by anisotropic etching, and forms the second through hole by isotropic etching.

(2) As described previously in connection with the first embodiment, a method of fabricating a semiconductor IC device according to the present invention comprises the steps of:

(a) forming a first wiring layer having wiring lines on a semiconductor substrate, (b) forming a layer insulating film over the first wiring layer, (c) forming first through holes of a relatively small diameter in a first region of the layer insulating film by etching, (d) filling up the first through holes with plugs by depositing a first conducting film over the layer insulating film and etching back the first conductive film, (e) forming second through holes of a relatively great diameter in a second region of the layer insulating film after the step (d), and (f) forming a second wiring layer having wiring lines by depositing a second conductive film over the layer insulating film and patterning the second conductive film.

The diameter of the first through holes is not greater than twice the thickness of the first conductive film, and the diameter of the second through holes is not smaller than twice the thickness of the first conductive film in the semiconductor IC chip fabricated by the semiconductor IC chip fabricating method according to the present invention.

(3) As described previously in connection with the second embodiment, a method of fabricating a semiconductor IC device according to the present invention comprises the steps of:

(a) forming a first wiring layer having wiring lines on a semiconductor substrate, (b) forming a layer insulating film over the first wiring layer, (c) forming first through holes of a relatively small diameter in a first region of the layer insulating film by etching, (d) forming second through holes of a relatively great diameter in a second region of the layer insulating film by etching, (e) filling up the first through holes with plugs by depositing a first conductive film over the layer insulating film and etching back the first conductive film, (f) removing etch back residues of the first conductive film remaining on the side walls of the second through holes, and (g) forming a second wiring layer having wiring lines by depositing a second conductive film over the layer insulating film and patterning the second conductive film.

(4) As described previously in connection with the second embodiment, a method of fabricating a semiconductor IC device according to the present invention comprises the steps of:

(a) forming a first wiring layer having wiring lines on a semiconductor substrate, (b) forming a layer insulating film over the first wiring layer, (c) forming first through holes of a relatively small diameter in a first region of the layer insulating film by etching, (d) forming second through holes of a relatively great diameter in a second region of the layer insulating film by etching, (e) filling up the first through holes with plugs by depositing a first conductive film over the layer insulating film and etching back the first conductive film, (f) depositing a second conductive film over the layer insulating film without removing etch back residues remaining on the side walls of the second through holes, and (g) forming a second wiring layer having wiring lines by patterning the second conductive film.

(5) As described previously in connection with the fourth embodiment, a method of fabricating a semiconductor IC device according to the present invention comprises the steps of:

(a) forming a first wiring layer having wiring lines on a semiconductor substrate, (b) forming a layer insulating film over the first wiring layer, (c) forming first through holes of a relatively small diameter in a first region of the layer insulating film by etching, (d) forming second through holes of a relatively great diameter in a second region of the layer insulating film by etching, (e) depositing a first conductive film over the layer insulating film and etching portions of the first conductive film corresponding to the second through holes, (f) filling up the first through holes with plugs by etching back the first conductive film, and (g) depositing a second conductive film over the layer insulating film and forming a second wiring layer having wiring lines by patterning the second conductive film.

(6) A semiconductor IC chip fabricating method according to the present invention comprises the steps of:

(a) forming a first wiring layer having first wiring lines for an internal circuit, and connecting leads for connecting the internal circuit to bonding pads on a semiconductor substrate, (b) forming a layer insulating film over the first wiring layer having the first wiring lines and the connecting leads, (c) forming first through holes of a relatively small diameter at positions corresponding to the first wiring lines in a first region of the layer insulating film by etching, (d) forming second through holes of a relatively great diameter at positions corresponding to the connecting leads in a second region of the layer insulating film by etching, and (e) forming a second wiring layer having wiring lines for the internal circuit to be connected electrically throughthe first through holes to the wiring lines of the first wiring layer, and bonding pads to be connected electrically through the second through holes to the connecting leads by depositing a conductive film over the layer insulating film and patterning the conductive film.

The second through holes formed by the semiconductor IC chip fabricating method according to the present invention has a tapered shape tapering toward the underlying layer.

The semiconductor IC chip fabricating method according to the present invention forms the first through holes by anisotropic etching and forms the second through holes by isotropic etching.

(7) A method of fabricating a semiconductor IC device according to the present invention comprises steps of:
 (a) forming a first wiring layer having wiring lines for an internal circuit, and connecting leads for connecting the internal circuit to bonding pads on a semiconductor substrate,
 (b) forming a layer insulating film over the first wiring layer and the contact leads,
 (c) forming first through holes of a relatively small diameter at positions corresponding to the first wiring lines in a first region of the layer insulating film by etching,
 (d) filling up the first through holes with plugs by depositing a first conductive film over the layer insulating film and etching back the first conductive film,
 (e) forming second through holes of a relatively great diameter at positions corresponding to the connecting leads in a second region of the layer insulating film by etching, and
 (f) forming a second wiring layer having wiring lines for an internal circuit to be connected electrically through the first through holes to the wiring lines of the first wiring layer, and bonding pads to be connected electrically through the second through holes to the connecting leads by depositing a second conductive film over the layer insulating film and patterning the second conductive film.

(8) A method of fabricating a semiconductor IC device according to the present invention comprises steps of:
 (a) forming a first wiring layer having wiring lines for an internal circuit, and connecting leads for connecting the internal circuit to bonding pads on a semiconductor substrate,
 (b) forming a layer insulating film over the first wiring layer and the contact leads,
 (c) forming first through holes of a relatively small diameter at positions corresponding to the first wiring lines in a first region of the layer insulating film by etching,
 (d) forming second through holes of a relatively great diameter at positions corresponding to the connecting leads in a second region of the layer insulating film by etching,
 (e) filling up the first through holes with plugs by depositing a first conductive film over the layer insulating film and etching back the first conductive film,
 (f) removing etch back residues remaining on the side walls of the second through holes, and
 (g) forming a second wiring layer having wiring lines for an internal circuit to be connected electrically through the first through holes to the wiring lines of the first wiring layer, and bonding pads to be connected electrically through the second through holes to the connecting leads by depositing a second conductive film over the layer insulating film and patterning the second conductive film.

(9) A method of fabricating a semiconductor IC device according to the present invention comprises steps of:
 (a) forming a first wiring layer having wiring lines for an internal circuit, and connecting leads for connecting the internal circuit to bonding pads on a semiconductor substrate,
 (b) forming a layer insulating film over the first wiring layer and the contact leads,
 (c) forming first through holes of a relatively small diameter at positions corresponding to the first wiring lines in a first region of the layer insulating film by etching,
 (d) forming second through holes of a relatively great diameter at positions corresponding to the connecting leads in a second region of the layer insulating film by etching,
 (e) filling up the first through holes with plugs by depositing a first conductive film over the layer insulating film and etching back the first conductive film,
 (f) depositing a second conductive film over the layer insulating film without removing etch back residues remaining on the side walls of the second through holes, and
 (g) forming a second wiring layer having wiring lines for an internal circuit to be connected electrically through the first through holes to the wiring lines of the first wiring layer, and bonding pads to be connected electrically through the second through holes to the connecting leads by patterning the second conductive film.

(10) A method of fabricating a semiconductor IC device according to the present invention comprises steps of:
 (a) forming a first wiring layer having wiring lines for an internal circuit, and connecting leads for connecting the internal circuit to bonding pads on a semiconductor substrate,
 (b) forming a layer insulating film over the first wiring layer and the contact leads,
 (c) forming first through holes of a relatively small diameter at positions corresponding to the first wiring lines in a first region of the layer insulating film by etching,
 (d) forming second through holes of a relatively great diameter at positions corresponding to the connecting leads in a second region of the layer insulating film by etching,
 (e) depositing a first conductive film over the layer insulating film and etching portions of the first conductive film corresponding to the second through holes,
 (f) filling up the first through holes with plugs by etching back the first conductive film, and
 (g) depositing a second conductive film over the layer insulating film, and forming a second wiring layer having wiring lines for an internal circuit to be connected electrically through the first through holes to the wiring lines of the first wiring layer, and bonding pads to be connected electrically through the second through holes to the connecting leads by patterning the second conductive film.

In the semiconductor IC chip fabricated by the semiconductor IC chip fabricating method according to the present invention, the foregoing bonding pads are those on an outer row among a plurality of bonding pads formed on two rows in a zigzag arrangement along the edges of the semiconductor substrate.

The present invention exercises the following effects.

(1) the large and the small through holes of different diameters can be accurately formed in the layer insulating film, the reliability of connection between the wiring lines of the upper wiring layer and those of the lower wiring layer is improved.

(2) The bonding pads can be arranged at reduced pitches, because the connecting leads for connecting the bonding pads to the internal circuit can be formed in a minute size. Consequently, the semiconductor IC chip can be provided with a greater number of bonding pads than the conventional semiconductor IC chip of the same size. Thus, the present invention is capable of realizing a large-scale integrated logic circuit chip having a great number of external terminals, i.e., pins.

(3) The connecting leads can be formed so that current densities in all the connecting leads connected to the bonding pads arranged in the periphery of the semiconductor IC chip are substantially the same, and all the connecting leads have a large current capacity. Therefore, the power lines (Vcc, GND) and the signal lines may be connected to any desired bonding pads, which increases the degree of freedom of logic design using an autoplacing and autorouting system.

What is claimed is:

1. A method of fabricating a semiconductor integrated circuit device comprising first wiring lines, a first layer insulating film formed over the first wiring lines, and second wiring lines formed on the first layer insulating film and electrically connected through through holes formed in the first layer insulating film to the first wiring lines, said method comprising the steps of:

forming first through holes of a relatively small diameter in portions of a first region in the first layer insulating film by etching;

forming second through holes of a relatively great diameter in portions of a second region in the first layer insulating film by etching; and wherein the step of forming the first through holes and the step of forming the second through holes are carried out separately; and wherein bonding pads are formed in an area corresponding to the second region, and connecting leads connected to an internal circuit are formed in an area corresponding to the first region.

2. A method of fabricating a semiconductor integrated circuit device according to claim 1, wherein the second through holes are tapered toward a layer underlying the first layer insulating film.

3. A method of fabricating a semiconductor integrated circuit device according to claim 1, wherein the first through holes are formed by anisotropic etching, and the second through holes are formed by isotropic etching.

4. A method of fabricating a semiconductor integrated circuit device according to claim 1, further comprising the steps of:

forming a second layer insulating film over the second wiring lines;

forming third through holes of a relatively small diameter in the second layer insulating film by etching; and forming fourth through holes of a relatively great diameter in the second layer insulating film by etching;

wherein the step of forming the third through holes and the step of forming the fourth through holes are carried out separately, and a mask employed in the step of forming the fourth through holes is the same in pattern as a mask employed in the step of forming the second through holes.

5. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film by etching;

filling up the first through holes with plug electrodes;

forming second through holes of a relatively great diameter in portions of a second region in the layer insulating film by etching after filling up the first through holes with the plug electrodes; and forming the second wiring lines on the layer insulating film;

wherein bonding pads are formed in an area corresponding to the second region, and connecting leads connected to an internal circuit are formed in an area corresponding to the first region.

6. A method of fabricating a semiconductor integrated circuit device according to claim 5, wherein the second wiring lines are in contact with the first wiring lines in the second through holes, respectively, and the second wiring lines are connected to the first wiring lines by the plug electrodes filling up the first through holes, respectively.

7. A method of fabricating a semiconductor integrated circuit device according to claim 5, wherein the plug electrodes are formed by selectively removing a first conductive film deposited on the layer insulating film, the diameter of the first through hole is twice the thickness of the first conductive film or below, and the diameter of the second through holes is twice the thickness of the first conductive film or above.

8. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and filling up the first through holes with plug electrodes by etching back the first conductive film;

removing etch back residues remaining on the side walls of the second through holes; and forming the second wiring lines on the layer insulating film;

wherein bonding pads are formed in an area corresponding to the second region, and connecting leads connected to an internal circuit are formed in an area corresponding to the first region.

9. A method of fabricating a semiconductor integrated circuit device according to claim 8, wherein the diameter of the first through holes is twice the thickness of the first conductive film or below, and the diameter of the second through holes is twice the thickness of the first conductive film or above.

10. A method of fabricating a semiconductor integrated circuit device according to claim 8, wherein the second wiring lines are in contact with the first wiring lines in the second through holes, respectively, and the second wiring lines are connected to the first wiring lines by the plug electrodes filling up the first through holes, respectively.

11. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and filling up the first through holes with plug electrodes by etching back the first conductive film; and forming the second wiring lines on the layer insulating film without removing etch back residue remaining on the side walls of the second through holes;

wherein bonding pads are formed in an area corresponding to the second region, and connecting leads connected to an internal circuit are formed in an area corresponding to the first region.

12. A method of fabricating a semiconductor integrated circuit device according to claim 11, wherein the diameter of the first through holes is twice the thickness of the first conductive film or below, and the diameter of the second through holes is twice the thickness of the first conductive film or above.

13. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and subsequently removing portions of the first conductive film corresponding to the second through holes;

filling up the first through holes with plug electrodes by etching back the first conductive film; and forming the second wiring lines on the layer insulating film;

wherein bonding pads are formed in an area corresponding to the second region, and connecting leads connected to an internal circuit are formed in an area corresponding to the first region.

14. A method of fabricating a semiconductor integrated circuit device according to claim 13, wherein the diameter of the first through holes is twice the thickness of the first conductive film or below, and the diameter of the second through holes is twice the thickness of the first conductive film or above.

15. A method of fabricating a semiconductor integrated circuit device comprising first wiring lines, a first layer insulating film formed over the first wiring lines, and second wiring lines formed on the first layer insulating film and electrically connected through through holes formed in the first layer insulating film to the first wiring lines, said method comprising the steps of:

forming first through holes of a relatively small diameter in portions of a first region in the first layer insulating film by etching;

forming second through holes of a relatively great diameter in portions of a second region in the first layer insulating film by etching;

wherein the step of forming the first through holes and the step of forming the second through holes are carried out separately;

forming a second layer insulating film over the second wiring lines;

forming third through holes of a relatively small diameter in the second layer insulating film by etching; and forming fourth through holes of a relatively great diameter in the second layer insulating film by etching;

wherein the step of forming the third through holes and the step of forming the fourth through holes are carried out separately, and a mask employed in the step of forming the fourth through holes is the same in pattern as a mask employed in the step of forming the second through holes.

16. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film by etching;

filling up the first through holes with plug electrodes;

forming second through holes of a relatively great diameter in portions of a second region in the layer insulating film by etching after filling up the first through holes with the plug electrodes; and forming the second wiring lines on the layer insulating film;

wherein the plug electrodes are formed by selectively removing a first conductive film deposited on the layer insulating film, the diameter of the first through hole is twice the thickness of the first conductive film or below, and the diameter of the second through holes is twice the thickness of the first conductive film or above.

17. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and filling up the first through holes with plug electrodes by etching back the first conductive film;

removing etch back residues remaining on the side walls of the second through holes; and forming the second wiring lines on the layer insulating film;

wherein the diameter of the first through hole is twice the thickness of the first conductive film or below, and the diameter of the second through holes is twice the thickness of the first conductive film or above.

18. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and filling up the first through holes with plug electrodes by etching back the first conductive film; and forming the second wiring lines on the layer insulating film without removing etch back residues remaining on the side walls of the second through holes;

wherein the diameter of the first through holes is twice the thickness of the first conductive film or below, and the diameter of the second through holes is twice the thickness of the first conductive film or above.

19. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and subsequently removing portions of the first conductive film corresponding to the second through holes;

filling up the first through holes with plug electrodes by etching back the first conductive film; and forming the second wiring lines on the layer insulating film;

wherein the diameter of the first through holes is twice the thickness of the first conductive film or below, and the diameter of the second through holes is twice the thickness of the first conductive film or above.

20. A method of fabricating a semiconductor integrated circuit device according to claim 15, wherein the second through holes are tapered toward a layer underlying the first layer insulating film.

21. A method of fabricating a semiconductor integrated circuit device according to claim 15, wherein the first through holes are formed by anisotropic etching, and the second through holes are formed by isotropic etching.

22. A method of fabricating a semiconductor integrated circuit device according to claim 15, wherein the second wiring lines are in contact with the first wiring lines in the second through holes, respectively, and the second wiring lines are connected to the first wiring lines by the plug electrodes filling up the first through holes, respectively.

23. A method of fabricating a semiconductor integrated circuit device according to claim 16, wherein the second through holes are tapered toward a layer underlying the first layer insulating film.

24. A method of fabricating a semiconductor integrated circuit device according to claim 16, wherein the first through holes are formed by anisotropic etching, and the second through holes are formed by isotropic etching.

25. A method of fabricating a semiconductor integrated circuit device according to claim 16, wherein the second wiring lines are in contact with the first wiring lines in the second through holes, respectively, and the second wiring lines are connected to the first wiring lines by the plug electrodes filling up the first through holes, respectively.

26. A method of fabricating a semiconductor integrated circuit device according to claim 15, wherein the plug electrodes are formed by selectively removing a first conductive film deposited on the layer insulating film, the diameter of the first through hole is twice the thickness of the first conductive film or below, and the diameter of the second through holes is twice the thickness of the first conductive film or above.

27. A method of fabricating a semiconductor integrated circuit device according to claim 16, wherein the plug electrode is formed by etching back the first conductive film.

28. A method of fabricating a semiconductor integrated circuit device according to claim 8, wherein the second wiring lines are in contact with the first wiring lines in the second through holes, respectively, and the second wiring lines are connected to the first wiring lines by the plug electrodes filling up the first through holes, respectively.

29. A method of fabricating a semiconductor integrated circuit device according to claim 11, wherein the second wiring lines are in contact with the first wiring lines in the second through holes, respectively, and the second wiring lines are connected to the first wiring lines by the plug electrodes filling up the first through holes, respectively.

30. A method of fabricating circuit device according t circuit device according to claim 13, wherein the second wiring lines are in contact with the first wiring lines in the second through holes, respectively, and the second wiring lines are connected to the first wiring lines by the plug electrodes filling up the first through holes, respectively.

31. A method of fabricating a semiconductor integrated circuit device according to claim 17, wherein the second wiring lines are in contact with the first wiring lines in the second through holes, respectively, and the second wiring lines are connected to the first wiring lines by the plug electrodes filling up the first through holes, respectively.

32. A method of fabricating a semiconductor integrated circuit device according to claim 18, wherein the second wiring lines are in contact with the first wiring lines in the second through holes, respectively, and the second wiring lines are connected to the first wiring lines by the plug electrodes filling up the first through holes, respectively.

33. A method of fabricating a semiconductor integrated circuit device according to claim 19, wherein the second wiring lines are in contact with the first wiring lines in the second through holes, respectively, and the second wiring lines are connected to the first wiring lines by the plug electrodes filling up the first through holes, respectively.

34. A method of fabricating a semiconductor integrated circuit device according to claim 5, wherein the plug electrode is formed by etching back the first conductive film.

35. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film by etching;

filling up the first through holes with plug electrodes;

forming second through holes of a relatively great diameter in portions of a second region in the layer insulating film by etching after filling up the first through holes with the plug electrodes; and forming the second wiring lines on the layer insulating film.

36. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and filling up the first through holes with plug electrodes by etching back the first conductive film;

removing etch back residues remaining on the side walls of the second through holes; and forming the second wiring lines on the layer insulating film.

37. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and filling up the first through holes with plug electrodes by etching back the first conductive film; and forming the second wiring lines on the layer insulating film without removing etch back residues remaining on the side walls of the second through holes.

38. A method of fabricating a semiconductor integrated circuit device comprising first wiring lines, a layer insulating film formed over the first wiring lines, and second wiring lines formed on the layer insulating film and electrically connected through through holes formed in the layer insulating film to the first wiring lines, said method comprising the steps of:

forming first through holes of a relatively small diameter in portions of a first region in the layer insulating film and forming second through holes of a relatively great diameter in portions of a second region in the layer insulating film;

depositing a first conductive film over the layer insulating film, and subsequently removing portions of the first conductive film corresponding to the second through holes;

filling up the first through holes with plug electrodes by etching back the first conductive film; and forming the second wiring lines on the layer insulating film.

39. A method of fabricating a semiconductor integrated circuit device according to claim 35, wherein the second wiring lines are in contact with the first wiring lines in the second through holes, respectively, and the second wiring lines are connected to the first wiring lines by the plug electrodes filling up the first through holes, respectively.

40. A method of fabricating a semiconductor integrated circuit device according to claim 36, wherein the second wiring lines are in contact with the first wiring lines in the second through holes, respectively, and the second wiring lines are connected to the first wiring lines by the plug electrodes filling up the first through holes, respectively.

41. A method of fabricating a semiconductor integrated circuit device according to claim 37, wherein the second wiring lines are in contact with the first wiring lines in the second through holes, respectively, and the second wiring lines are connected to the first wiring lines by the plug electrodes filling up the first through holes, respectively.

42. A method of fabricating a semiconductor integrated circuit device according to claim 38, wherein the second wiring lines are in contact with the first wiring lines in the second through holes, respectively, and the second wiring lines are connected to the first wiring lines by the plug electrodes filling up the first through holes, respectively.

43. A method of manufacturing a semiconductor integrated circuit device according to claim 1, further comprising the steps of:

filling the first through holes with plug electrodes; and forming the second wiring line on the first insulating film, wherein the second wiring line contacts the first wiring line through the second through hole in the portion of the second region and is electrically connected to the bonding pad, wherein the second wiring line is electrically connected to the first wiring line through the plug electrode in the portion of the first region, wherein the connecting lead is integrally formed with the second wiring.

44. A method of manufacturing a semiconductor integrated circuit device according to claim 5, wherein the second wiring line contacts the first wiring line through the second through hole in the portion of the second region and is electrically connected to the bonding pad, wherein the second wiring line is electrically connected to the first wiring line through the plug electrode in the portion of the first region, wherein the connecting lead is integrally formed with the second wiring.

45. A method of manufacturing a semiconductor integrated circuit device according to claim 8, wherein the second wiring line contacts the first wiring line through the second through hole in the portion of the second region and is electrically connected to the bonding pad, wherein the second wiring line is electrically connected to the first wiring line through the plug electrode in the portion of the first region, wherein the connecting lead is integrally formed with the second wiring.

46. A method of manufacturing a semiconductor integrated circuit device according to claim 11, wherein the second wiring line contacts the first wiring line through the second through hole in the portion of the second region and is electrically connected to the bonding pad, wherein the second wiring line is electrically connected to the first wiring line through the plug electrode in the portion of the first region, wherein the connecting lead is integrally formed with the second wiring.

47. A method of manufacturing a semiconductor integrated circuit device according to claim 13, wherein the second wiring line contacts the first wiring line through the second through hole in the portion of the second region and is electrically connected to the bonding pad, wherein the second wiring line is electrically connected to the first wiring line through the plug electrode in the portion of the first region, wherein the connecting lead is integrally formed with the second wiring.

48. A method of manufacturing a semiconductor integrated circuit device according to claim 1, wherein the second wiring line contacts the first wiring line through the second through hole, wherein the second wiring line is electrically connected to the first wiring line through the plug electrode.

49. A method of manufacturing a semiconductor integrated circuit device according to claim 5, wherein the second wiring line contacts the first wiring line through the second through hole, wherein the second wiring line is electrically connected to the first wiring line through the plug electrode.

* * * * *